United States Patent
Kabeshita et al.

(10) Patent No.: US 7,036,213 B2
(45) Date of Patent: May 2, 2006

(54) DEVICE AND METHOD FOR MOUNTING PARTS

(75) Inventors: Akira Kabeshita, Hirakata (JP); Naoto Mimura, Yamanashi (JP); Noriaki Yoshida, Ikeda (JP); Yoshihiko Misawa, Katano (JP); Takeyuki Kawase, Kofu (JP); Tetsutarou Hachimura, Kofu (JP); Toshiro Nishiwaki, Yamanashi (JP); Taira Ishii, Kofu (JP); Mitsuo Kawate, Yamanashi (JP); Hideaki Watanabe, Kofu (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/362,159

(22) PCT Filed: Aug. 21, 2001

(86) PCT No.: PCT/JP01/07138

§ 371 (c)(1),
(2), (4) Date: Jun. 26, 2003

(87) PCT Pub. No.: WO02/17699

PCT Pub. Date: Feb. 28, 2002

(65) Prior Publication Data

US 2004/0033128 A1 Feb. 19, 2004

(30) Foreign Application Priority Data

| Aug. 22, 2000 | (JP) | ........................ 2000-251117 |
| Dec. 11, 2000 | (JP) | ........................ 2000-375872 |
| Dec. 11, 2000 | (JP) | ........................ 2000-376145 |

(51) Int. Cl.
*B23P 19/00* (2006.01)

(52) U.S. Cl. .................... 29/740; 29/740; 29/743
(58) Field of Classification Search ............ 29/740, 29/743
See application file for complete search history.

(56) References Cited

U.S. PATENT DOCUMENTS

| 5,724,722 A | * | 3/1998 | Hashimoto | 29/740 |
| 5,761,798 A | * | 6/1998 | Suzuki | 29/832 |
| 5,778,525 A | * | 7/1998 | Hata et al. | 29/836 |
| 5,855,059 A | * | 1/1999 | Togami et al. | 29/740 |
| 6,073,342 A | * | 6/2000 | Asai et al. | 29/740 |
| 6,154,954 A | * | 12/2000 | Seto et al. | 29/740 |
| 6,378,198 B1 | * | 4/2002 | Asai et al. | 29/825 |
| 6,550,133 B1 | * | 4/2003 | Seo et al. | 29/741 |
| 6,568,069 B1 | * | 5/2003 | Melf et al. | 29/740 |
| 6,588,096 B1 | * | 7/2003 | Hidese | 29/832 |
| 6,643,917 B1 | * | 11/2003 | Gieskes | 29/740 |
| 6,729,017 B1 | * | 5/2004 | Kashiwagi et al. | 29/740 |
| 6,860,002 B1 | * | 3/2005 | Oyama | 29/740 |
| 6,874,225 B1 | * | 4/2005 | Haji et al. | 29/740 |
| 6,892,446 B1 | * | 5/2005 | Hwang et al. | 29/740 |

FOREIGN PATENT DOCUMENTS

| EP | 0 092 274 | 10/1983 |
| EP | 0 845 933 | 6/1998 |
| JP | 3218696 | 9/1991 |
| JP | 4275495 | 10/1992 |
| JP | 05-267896 | 10/1993 |
| JP | 10093294 | 4/1998 |
| JP | 10-256785 | 9/1998 |

* cited by examiner

*Primary Examiner*—Joe Dillon, Jr.
(74) *Attorney, Agent, or Firm*—Wenderoth, Lind & Ponack, L.L.P.

(57) ABSTRACT

A first mounting unit and a second mounting unit capable of performing component holding, component recognition, and component placement for two boards independently of each other are provided. A first conveyance path for loading and unloading the first board, and a second conveyance path for loading and unloading the second board, are independently arranged.

30 Claims, 33 Drawing Sheets

DEVICE AND METHOD FOR MOUNTING PARTS

This application is a National Stage application of PCT/JP01/07138, filed Aug. 21, 2001.

TECHNICAL FIELD

The present invention relates to a component mounting apparatus and method for placing components fed from a component feeding device onto a board or other circuit formation article, and also relates to a component mounting system equipped with a plurality of such component mounting apparatuses.

BACKGROUND ART

Conventionally, as shown in FIG. 9, the present applicant has already proposed a component mounting apparatus in which its component mounting work area 2200 is divided into a front-side component mounting work area 2201 and a rear-side component mounting work area 2202 viewed from an operator. Each of the areas is provided with component feeding devices 2008A, 2008B, 2018A and 2018B and component recognition devices 2009 and 2019, and a front-side board conveying and holding device 2003 and a rear-side board conveying and holding device 2013 which can be laterally joined together are provided at a center of the component mounting work area 2200, in which arrangement when the front-side board conveying and holding device 2003 and the rear-side board conveying and holding device 2013 are joined together at the center, two boards 2002 and 2002 are loaded and held by the front-side board conveying and holding device 2003 and the rear-side board conveying and holding device 2013, respectively, and thereafter the front-side board conveying and holding device 2003 is moved to the front-side component mounting work area 2201 to perform component mounting, and the rear-side board conveying and holding device 2013 is moved to the rear-side component mounting work area 2202 to perform component mounting.

However, with the above structure, board 2002 can be loaded and unloaded only when the front-side board conveying and holding device 2003 and the rear-side board conveying and holding device 2013 are joined together at the center. Therefore, if component mounting is stopped due to some errors during the component mounting in, for example, the rear-side component mounting work area 2202, then the board 2002 cannot be unloaded when so tried unless the board is made to pass through the rear-side board conveying and holding device 2013 even though component mounting has ended in the front-side component mounting work area 2201. Therefore, if unloading of a component-mounted board, i.e. a completed product of which the component mounting has ended, is stopped for a long term, solder of the component-mounted board would be deteriorated, which may lead to a degraded mounting quality. Moreover, when mounting process time for performing component mounting of boards of different models differs between the front-side component mounting work area and the rear-side component mounting work area, or when the mounting process time differs due to a suction error or a recognition error during component mounting in, for example, the rear-side component mounting work area even in a case of mounting of identical boards and components. If a component-mounted board of which a component mounting has previously ended is made to stand by for a long period, then solder of the component-mounted board would be deteriorated, which may lead to a degraded mounting quality, as in the above case.

Accordingly, an object of the present invention is to solve the aforementioned problems and provide a component mounting apparatus and method by which, in concurrently performing component mounting operations in a plurality of component mounting work areas, respectively, if either component mounting has ended in advance, a board that has undergone the component mounting can be unloaded without awaiting termination of the other mounting operation or board unloading, thereby allowing areal productivity to be further improved, as well as a component mounting system equipped with a plurality of such component mounting apparatuses.

SUMMARY OF THE INVENTION

In order to achieve the above object, the present invention has the following constitution.

According to a first aspect of the present invention, there is provided a component mounting apparatus comprising:

a first mounting unit, which is arranged in a first component mounting work area out of the first component mounting work area and a second component mounting work area that are two parts obtained by dividing a component mounting work area and do not overlap each other, able to hold a first board on which a component is to be mounted in a first pre-placement standby position, a first placement position, and a first post-placement standby position that are located along a first conveyance path inside the first component mounting work area, and places onto the first board in the first placement position, via a first placement head, a component that is fed from a first component feeding device, held by the first placement head, and recognized by a first recognition device on basis of a recognition result of the first recognition device; and a second mounting unit, which is arranged in the second component mounting work area, able to hold a second board on which a component is to be mounted in a second pre-placement standby position, a second placement position, and a second post-placement standby position that are located along a second conveyance path different from and in parallel to the first conveyance path inside the second component mounting work area, and places onto the second board in the second placement position a component that is fed from a second component feeding device, held by the second placement head, and recognized by a second recognition device on a basis of a recognition result of the second recognition device.

According to a second aspect of the present invention, there is a component mounting apparatus as defined in the first aspect, wherein the first mounting unit is operatively controlled independently of the second mounting unit.

According to a third aspect of the present invention, there is provided a component mounting apparatus in which a component mounting work area is divided into two parts of a first component mounting work area and a second component mounting work area; a first mounting unit is arranged in the first component mounting work area; and a second mounting unit is arranged in the second component mounting work area, the first mounting unit comprising:

a first board conveying and holding device, which is able to convey a first board onto which a component is to be mounted along a first conveyance path, able to position and hold the first board in a first pre-placement standby position located along the first conveyance path, a first placement position located on a downstream side of the first pre-placement standby position, and a first post-placement standby position located on a downstream side of the first placement position, and in which the first pre-placement standby position, the first placement position, and the first post-placement standby position are linearly arranged;

a first component feeding device, which is arranged in a vicinity of the first placement position, for feeding the component;

a first placement head drive device for moving a first placement head between the first component feeding device and the first placement position, holding the component received from the first component feeding device by first placement head, and placing the component held by the first placement head onto the first board that is positioned and held in the first placement position, by the first placement head; and a first recognition device, which is arranged in a vicinity of the first placement position, for recognizing the component held by the first placement head, and the second mounting unit comprising:

a second board conveying and holding device, which is able to convey a second board onto which a component is to be mounted along a second conveyance path different from the first conveyance path, able to position and hold the second board in a second pre-placement standby position located along the second conveyance path, a second placement position located on a downstream side of the second pre-placement standby position, and a second post-placement standby position located on a downstream side of the second placement position, and in which the second pre-placement standby position, the second placement position, and the second post-placement standby position are linearly arranged;

a second component feeding device, which is arranged in a vicinity of the second placement position, for feeding the component;

a second placement head drive device for moving a second placement head between the second component feeding device and the second placement position, holding the component received from the second component feeding device by the second placement head, and placing the component held by the second placement head onto the second board that is positioned and held in the second placement position, by the second placement head; and a second recognition device, which is arranged in a vicinity of the second placement position, for recognizing the component held by the second placement head, whereby the first mounting unit operates to hold the component from the first component feeding device by the first placement head, recognize the component held by the first placement head by the first recognition device, and thereafter place the component held by the first placement head onto the first board that is positioned and held in the first placement position by the first board conveying and holding device on basis of a recognition result of the first recognition device, while the second mounting unit operates to hold the component received from the second component feeding device by the second placement head, recognize the component held by the second placement head by the second recognition device, and thereafter place the component held by the second placement head onto the second board that is positioned and held in the second placement position by the second board conveying and holding device on basis of a recognition result of the second recognition device.

According to a fourth aspect of the present invention, there is provided a component mounting apparatus as defined in the third aspect, wherein the board conveying and holding devices are provided with: pre-placement conveyance units for positioning the boards in the pre-placement standby positions located along respective conveyance paths; placement conveyance units that are located adjacently on downstream sides of the pre-placement conveyance units, for positioning the boards at the placement positions and; post-placement conveyance units that are located adjacently on downstream sides of the placement conveyance units, for positioning the boards in the post-placement standby positions, and at least one of the recognition devices is provided with a two-dimensional camera that is located adjacent to a corresponding placement position and arranged in a vicinity of a central portion of a corresponding component feeding device, for taking a two-dimensional image of a corresponding component.

According to a fifth aspect of the present invention, there is provided a component mounting apparatus as defined in the third or fourth aspect, wherein the placement heads are each provided with a component holding member for holding the component fed by a corresponding component feeding device, and the placement head drive devices are each provided with a pair of Y-axis ball screw shafts extended parallel in a Y-axis direction perpendicular to the conveyance path of a corresponding board, a Y-axis rotation drive device for forwardly and reversely rotating the pair of Y-axis ball screw shafts in synchronism, a Y-axis movable unit that can advance or retreat in the Y-axis direction while being meshed with the pair of Y-axis ball screw shafts, an X-axis ball screw shaft extended in an X-axis direction parallel to a corresponding board conveyance path perpendicular to the Y-axis direction in the Y-axis movable unit, an X-axis rotation drive device for forwardly and reversely rotating the X-axis ball screw shaft, and an X-axis movable unit that can advance or retreat in the X-axis direction while being meshed with the X-axis ball screw shaft.

According to a sixth aspect of the present invention, there is provided a component mounting apparatus as defined in any one of the first through fifth aspects, wherein the component mounting work area is divided into two parts of the first component mounting work area and the second component mounting work area which do not overlap each other.

According to a seventh aspect of the present invention, there is provided a component mounting apparatus as defined in any one of the first through sixth aspects, further comprising a bypass conveyance unit, which is arranged between the first conveyance path and the second conveyance path, for passing therethrough a board that is not subjected to a mounting operation in the first mounting unit and the second mounting unit.

According to an eighth aspect of the present invention, there is provided a component mounting apparatus as defined in the seventh aspect, wherein the bypass conveyance unit is comprised of an upper bypass conveyance unit and a lower bypass conveyance unit arranged below the upper bypass conveyance unit.

According to a ninth aspect of the present invention, there is provided a component mounting apparatus as defined in the seventh aspect, wherein the bypass conveyance unit is comprised of two bypass conveyance units arranged parallel to each other.

According to a tenth aspect of the present invention, there is provided a component mounting apparatus as defined in any one of the first through ninth aspects, wherein the second board is loaded into the second mounting unit while being turned at a phase angle of 180 degrees with respect to the first board loaded into the first mounting unit, and the second board is unloaded from the second mounting unit while being further turned at a phase angle of 180 degrees when unloaded from the second mounting unit.

According to an eleventh aspect of the present invention, there is provided a component mounting apparatus as defined in any one of the first through ninth aspects, wherein an in-phase mode, in which the second board is loaded into the second mounting unit in phase with the first board, and a reverse mode, in which the second board is loaded into the second mounting unit while being turned at a phase angle of 180 degrees with respect to the first board, are selectively used.

According to a twelfth aspect of the present invention, there is provided a component mounting apparatus as defined in any one of the first through eleventh aspects, wherein the placement heads are each provided with a plurality of component holding members for holding the components fed by the component feeding devices that have a plurality of component feeding units, and a direction in which the plurality of component holding members are arranged along with a direction in which the plurality of component feeding units of the component feeding devices are arranged are extended in an identical direction.

According to a thirteenth aspect of the present invention, there is provided a component mounting apparatus as defined in any one of the first through twelfth aspects, wherein the placement heads are each provided with a plurality of component holding members for holding the components fed by the component feeding devices that each have a plurality of component feeding units, the plurality of component holding members and the plurality of component feeding units of the component feeding devices being arranged at equal intervals, and a plurality of components can be collectively held in the plurality of component feeding units by the plurality of component holding members.

According to a fourteenth aspect of the present invention, there is provided a component mounting method for executing a first mounting operation comprising:
holding a first board onto which a component is to be placed, with the board being positioned in a first placement position via a first pre-placement standby position located along a first conveyance path in a first component mounting work area out of a first component mounting work area and a second component mounting work area that are two parts obtained by dividing a component mounting work area;
holding a component fed from a first component feeding device by a first placement head;
recognizing the component held by the first placement head by a first recognition device;
placing the recognized component, on basis of a recognition result, onto the first board located in the first placement position by the first placement head;
unloading the first board located in the first placement position toward a first post-placement standby position, and holding the board after terminating component placement, and a second mounting operation comprising:
holding a second board onto which a component is to be placed, with the board being positioned in a second placement position via a second pre-placement standby position located along a second conveyance path different from and in parallel to the first conveyance path inside the second component mounting work area;
holding a component fed from a second component feeding device by a second placement head;
recognizing the component held by the second placement head by a second recognition device;
placing the recognized component, on basis of a recognition result, onto the second board located in the second placement position by the second placement head; and
unloading the second board located in the second placement position toward a second post-placement standby position and holding the board after terminating component placement, and
wherein the method is able to independently perform loading and unloading of the first board and loading and unloading of the second board.

According to a fifteenth aspect of the present invention, there is provided a component mounting method as defined in the fourteenth aspect, wherein the first mounting operation and the second mounting operation are independently performed.

According to a sixteenth aspect of the present invention, there is provided a component mounting method for executing a first mounting operation comprising:
holding a first board onto which a component is to be placed, with the board being positioned in a first placement position via a first pre-placement standby position located along a linear first conveyance path in a first component mounting work area out of the first component mounting work area and a second component mounting work area that are two parts obtained by dividing a component mounting work area;
holding a component fed from a first component feeding device arranged in a vicinity of the first placement position;
recognizing the held component by a first recognition device arranged in a vicinity of the first placement position;
placing the recognized component, on basis of a recognition result, onto the first board located in the first placement position;
unloading the first board located in the first placement position toward a first post-placement standby position, from the first placement position, in the linear first conveyance path and holding the board after terminating component placement, and
a second mounting operation comprising:
holding a second board onto which a component is to be placed, with the board being positioned in a second placement position via a second pre-placement standby position along a linear second conveyance path different from and in parallel to the first conveyance path inside the second component mounting work area;
holding a component fed from a second component feeding device arranged in a vicinity of the second placement position;

recognizing the held component by a second recognition device arranged in a vicinity of the second placement position;

placing the recognized component, on basis of a recognition result, onto the second board located in the second placement position; and unloading the second board located in the second placement position toward a second post-placement standby position, from the second placement position, along the linear second conveyance path and holding the board after terminating component placement.

According to a seventeenth aspect of the present invention, there is provided a component mounting method as defined in any one of the fourteenth through sixteenth aspects, wherein the component mounting work area is divided into two equal parts of the first component mounting work area and the second component mounting work area that do not overlap each other.

According to an eighteenth aspect of the present invention, there is provided a component mounting method as defined in any one of the fourteenth through seventeenth aspects, wherein a board that is not subjected to the first mounting operation and the second mounting operation is made to pass through a bypass conveyance unit arranged between the first conveyance path and the second conveyance path.

According to a nineteenth aspect of the present invention, there is provided a component mounting method as defined in any one of the fourteenth through eighteenth aspects, wherein the second mounting operation is performed by turning the second board at a phase angle of 180 degrees with respect to the first board subjected to the first mounting operation, and the second board is unloaded while being further rotated at a phase angle of 180 degrees when unloaded after performing the second mounting operation.

According to a twentieth aspect of the present invention, there is provided a component mounting method as defined in any one of the fourteenth through eighteenth aspects, wherein an in-phase mode, in which the second mounting operation of the second board is performed in phase with the first board subjected to the first mounting operation, and a reverse mode, in which the second mounting operation is performed by turning the second board at a phase angle of 180 degrees with respect to the first board subjected to the first mounting operation, are selectively used.

According to a twenty-first aspect of the present invention, there is provided a component mounting method as defined in any one of the fourteenth through twentieth aspects, wherein, when the components fed from a plurality of component feeding units of the component feeding devices are held by a plurality of component holding members of the placement heads, and the plurality of components can be concurrently collectively held by the plurality of component holding members in the plurality of component feeding units.

According to a twenty-second aspect of the present invention, there is provided a component mounting apparatus comprising:

a first mounting unit, which is provided with a first loader that is arranged in a first component mounting work area out of the first component mounting work area and a second component mounting work area that are two parts obtained by dividing a component mounting work area and do not overlap each other, for positioning and holding a first board, onto which a component is to be placed, in a first pre-placement standby position located along a first conveyance path inside the first component mounting work area, a first board conveying and holding unit for positioning and holding the board in a first placement position to where the board is conveyed beyond the first pre-placement standby position in a conveyance direction, and a first unloader for positioning and holding the board in a first post-placement standby position to where the board is conveyed beyond the first placement position in the conveyance direction, wherein a component that is fed from a first component feeding device and held by a first placement head is placed onto the first board located in the first placement position, by the first placement head;

a second mounting unit, which is provided with a second loader that is arranged in the second component mounting work area, for positioning and holding a second board onto which a component is to be placed in a second pre-placement standby position located along a second conveyance path different from and in parallel to the first conveyance path inside the second component mounting work area, a second board conveying and holding unit for positioning and holding the board in a second placement position to where the board is conveyed beyond the second pre-placement standby position in the conveyance direction, and a second unloader for positioning and holding the board in a second post-placement standby position to where the board is conveyed beyond the second placement position in the conveyance direction, wherein a component that is fed from a second component feeding device and held by a second placement head is placed on the second board located in the second placement position, by the second placement head;

a connective conveyance unit for loading a board into either the first loader or the second loader;

detection devices for detecting presence or absence of a board in the first loader, the first board conveying and holding unit, the second loader, and the second board conveying and holding unit; and a control section for executing control so that, with a highest order of priority given to a state in which no board exists in both a corresponding loader and a corresponding board conveying and holding unit succeeding the loader on basis of a detection signal from a corresponding detection device, a board is fed to the loader relevant to the highest order of priority by the connective conveyance unit, and a board is loaded by the connective conveyance unit into the loader with no board in a state in which no board exists in the first loader or the second loader according to a next order of priority.

According to a twenty-third aspect of the present invention, there is provided a component mounting apparatus as defined in the twenty-second aspect, further comprising a bypass conveyance unit, which is roughly parallel to a first mounting conveyance path comprised of the first loader, the first board conveying and holding unit, and the first unloader, and a second mounting conveyance path comprised of the second loader, the second board conveying and holding unit, and the second unloader, and arranged independently of the first mounting conveyance path and the second mounting conveyance path, wherein the corresponding detection device further detects presence or absence of a board in the bypass conveyance unit, and wherein it is controlled to load a board by the connective conveyance unit into the loader with no board or the bypass conveyance unit with no board in a state in which no board exists in the first loader or the second loader or the bypass conveyance unit following the highest order of priority under control of the control section.

According to a twenty-fourth aspect of the present invention, there is provided a component mounting system comprising:

the component mounting apparatus defined in the twenty-third aspect; and a component mounting apparatus which has a third mounting unit for placing a component, that is fed from a third component feeding device and held by a third placement head, onto a third board that is fed from the bypass conveyance unit and positioned and held in a third placement position, by the third placement head, wherein the detection devices also further detect presence or absence of a board in the third placement position in addition to the bypass conveyance unit, and the control section executes control so that: with a highest order of priority given to either a state in which no board exists in both the corresponding loader and board conveying and holding unit succeeding the loader, or a state in which no board exists in both the bypass conveyance unit and the third placement position, and with a second-highest order of priority given to the other on basis of a detection signal from the corresponding detection device, a board is fed to the loader relevant to the highest order of priority by the connective conveyance unit, a board is fed to the bypass conveyance unit relevant to the second-highest order of priority according to a next order of priority; and, in a state in which no board exists in the first loader or the second loader or the bypass conveyance unit, a board is loaded into the loader with no board or the bypass conveyance unit with no board by the connective conveyance unit according to a next order of priority.

According to a twenty-fifth aspect of the present invention, there is provided a component mounting system comprising:

a first mounting unit, which is provided with a first loader that is arranged in a first component mounting work area out of the first component mounting work area and a second component mounting work area that are two parts obtained by dividing an upstream-side component mounting work area and do not overlap each other, for positioning and holding a first board, onto which a component is to be placed, in a first pre-placement standby position located along a first conveyance path inside the first component mounting work area, a first board conveying and holding unit for positioning and holding the board in a first placement position to where the board is conveyed beyond the first pre-placement standby position in a conveyance direction, and a first unloader for positioning and holding the board in a first post-placement standby position to where the board is conveyed beyond the first placement position in the conveyance direction, wherein a component that is fed from a first component feeding device and held by a first placement head is placed on the first board located in the first placement position, by the first placement head;

a second mounting unit, which is provided with a second loader that is arranged in the second component mounting work area, for positioning and holding a second board onto which a component is to be placed in a second pre-placement standby position located along a second conveyance path different from the first conveyance path inside the second component mounting work area, a second board conveying and holding unit for positioning and holding the board in a second placement position to where the board is conveyed beyond the second pre-placement standby position in the conveyance direction, and a second unloader for positioning and holding the board in a second post-placement standby position to where the board is conveyed beyond the second placement position in the conveyance direction, wherein a component that is fed from a second component feeding device and held by a second placement head is placed on the second board located in the second placement position, by the second placement head;

a bypass conveyance unit, which is roughly parallel to a first mounting conveyance path comprised of the first loader, the first board conveying and holding unit, and the first unloader, and a second mounting conveyance path comprised of the second loader, the second board conveying and holding unit, and the second unloader, and arranged independently of the first mounting conveyance path and the second mounting conveyance path;

an upstream-side connective conveyance unit for loading a board into any one of the first loader, the second loader and the bypass conveyance unit;

an upstream-side detection device for detecting presence or absence of a board in the first loader, the first board conveying and holding unit, the second loader, the second board conveying and holding unit, and the bypass conveyance unit;

a third mounting unit, which is provided with a third loader that is arranged in a third component mounting work area out of the third component mounting work area and a fourth component mounting work area that are two parts obtained by dividing a downstream-side component mounting work area and do not overlap each other, for positioning and holding a third board, onto which a component is to be placed, in a third pre-placement standby position located along a third conveyance path inside the third component mounting work area, a third board conveying and holding unit for positioning and holding the board in a third placement position to where the board is conveyed beyond the third pre-placement standby position in a conveyance direction, and a third unloader for positioning and holding the board in a third post-placement standby position to where the board is conveyed beyond the third placement position in the conveyance direction, wherein a component that is fed from a third component feeding device and held by a third placement head is placed on the third board located in the third placement position, by the third placement head;

a fourth mounting unit, which is provided with a fourth loader that is arranged in the fourth component mounting work area, for positioning and holding a fourth board onto which a component is to be placed in a fourth pre-placement standby position located along a fourth conveyance path different from the third conveyance path inside the fourth component mounting work area, a fourth board conveying and holding unit for positioning and holding the board in a fourth placement position to where the board is conveyed beyond the fourth pre-placement standby position in the conveyance direction, and a fourth unloader for positioning and holding the board in a fourth post-placement standby position to where the board is conveyed beyond the fourth placement position in the conveyance direction, wherein a component that is fed from a fourth component feeding device and held by a fourth placement head is placed on the fourth board located in the fourth placement position, by the fourth placement head;

a downstream-side connective conveyance unit for unloading the board from any one of the first unloader, the second unloader, and the bypass conveyance unit and loading a board into either one of the third loader and the fourth loader;

a downstream-side detection device for detecting presence or absence of a board in the first loader, the second unloader, the third unloader, the third board conveying and holding unit, the fourth loader, the fourth board conveying and holding unit, and the bypass conveyance unit;

an upstream-side control section for executing control so that, with a highest order of priority given to either a state in which no board exists in either one of the first and second loaders and the board conveying and holding unit succeeding the loader, or a state in which no board exists in both the bypass conveyance unit, the third or fourth loader, and the board conveying and holding unit succeeding the loader or the bypass conveyance unit, and with a next order of priority given to the other, on basis of detection signals from the upstream-side detection device and the downstream-side detection device, a board is fed to the loaders according to the order of priority by the upstream-side connective conveyance unit, and, in a state in which no board exists in the first loader or the second loader or the bypass conveyance unit according to the next order of priority, a board is loaded by the upstream-side connective conveyance unit into the loader with no board or the bypass conveyance unit; and a downstream-side control section for executing control so that, with a highest order of priority given to a state in which no board exists in either one of the third and fourth loaders and the board conveying and holding unit succeeding the loader on a basis of a detection signal from the downstream-side detection device, a board is fed to the loader relevant to the highest order of priority by the downstream-side connective conveyance unit, and, in a state in which no board exists in the third loader or the fourth loader according to a next order of priority, a board is loaded by the downstream-side connective conveyance unit into the loader with no board, and executing control so that, with a highest order of priority given to a state in which a board exists in both loader and the board conveying and holding unit located on an upstream side of the unloader, a board is unloaded from the unloader relevant to the highest order of priority toward the downstream-side connective conveyance unit, and, in a state in which a board exists in the first unloader or the second unloader or the bypass conveyance unit according to a next order of priority, the board is unloaded from the unloader with the board or the bypass conveyance unit with the board toward the downstream-side connective conveyance unit.

According to a twenty-sixth aspect of the present invention, there is provided a component mounting system as defined in the twenty-fifth aspect, further comprising a second bypass conveyance unit, which is roughly parallel to a third mounting conveyance path comprised of the third loader, the third board conveying and holding unit, and the third unloader, and a fourth mounting conveyance path comprised of the fourth loader, the fourth board conveying and holding unit, and the fourth unloader, and arranged independently of the third mounting conveyance path and the fourth mounting conveyance path, and wherein the downstream-side control section unloads the board unloaded from the first unloader or the second unloader toward the second bypass conveyance unit and loads the board unloaded from the bypass conveyance unit into the third loader or the fourth loader.

According to a twenty-seventh aspect of the present invention, there is provided a component mounting system as defined in the twenty-sixth aspect, further comprising:

a downstream-side second connective conveyance unit for unloading the board from any one of the third loader, the fourth loader, and the second bypass conveyance unit;

a downstream-side second detection device for detecting presence or absence of a board in the third unloader, the third board conveying and holding unit, the fourth unloader, the fourth board conveying and holding unit, and the second bypass conveyance unit; and a downstream-side second control section for executing control so that, with the highest order of priority given to a state in which a board exists in either one of the third and fourth unloaders and the third or fourth board conveying and holding unit succeeding the unloader on basis of a detection signal from the downstream-side second detection device, the board is unloaded from the unloader relevant to the highest order of priority by the downstream-side second connective conveyance unit and, in a state in which a board exists in the third unloader or the fourth unloader or the second bypass conveyance unit according to the next order of priority, the board is unloaded from the unloader with the board or the second bypass conveyance unit with the board toward the downstream-side second connective conveyance unit.

According to a twenty-eighth aspect of the present invention, there is provided a component mounting system as defined in the twenty-seventh aspect, wherein, with the highest order of priority given to a state in which a board exists in both the second bypass conveyance unit and either one of the first and second unloaders and the first or second board conveying and holding unit succeeding the unloader on basis of a detection signal from the downstream-side second detection device, the downstream-side second control section further unloads the board from the second bypass conveyance unit relevant to the highest order of priority by the downstream-side second connective conveyance unit.

According to the twenty-ninth aspect of the present invention, there is provided a component mounting component apparatus as defined in the third aspect, wherein the first mounting unit is operatively controlled independently of the second mounting unit.

According to the thirtieth aspect of the present invention, there is provided a component mounting method as defined in the sixteenth aspect, wherein the first mounting operation and the second mounting operation are independently performed.

BRIEF DESCRIPTION OF DRAWINGS

These and other aspects and features of the present invention will become clear from the following description taken in conjunction with the preferred embodiments thereof with reference to the accompanying drawings, in which.

DETAILED DESCRIPTION OF THE PREFERRED EMBODIMENTS

Figure 1:
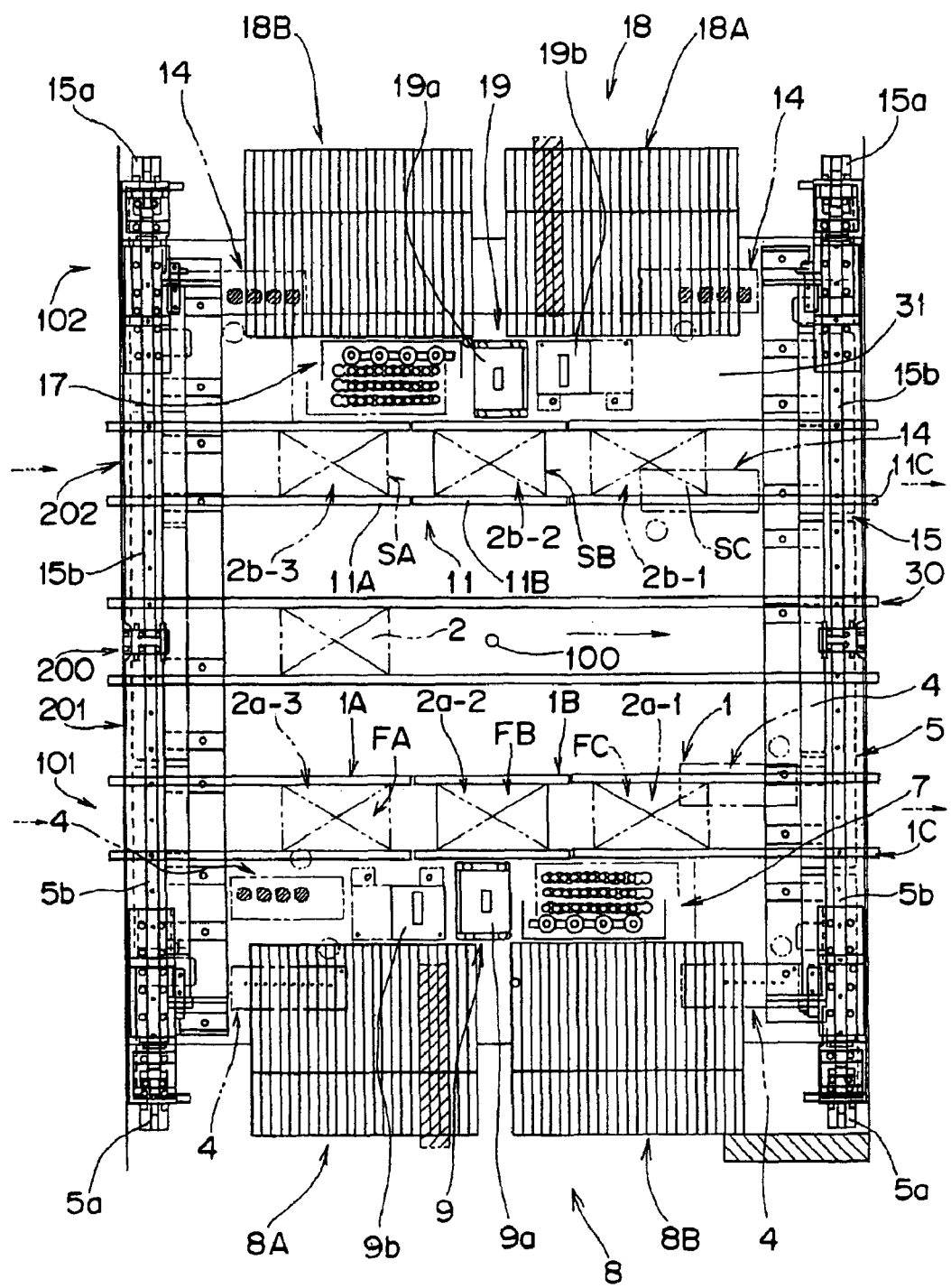
FIG. 1 is a detailed plan view of a component mounting apparatus according to a first embodiment of the present invention.

Before description of the present invention proceeds, it is to be noted that like parts are designated by like reference numerals throughout the accompanying drawings.

Embodiments of the present invention will be described in detail below with reference to the drawings.

(First Embodiment)

Figure 2:
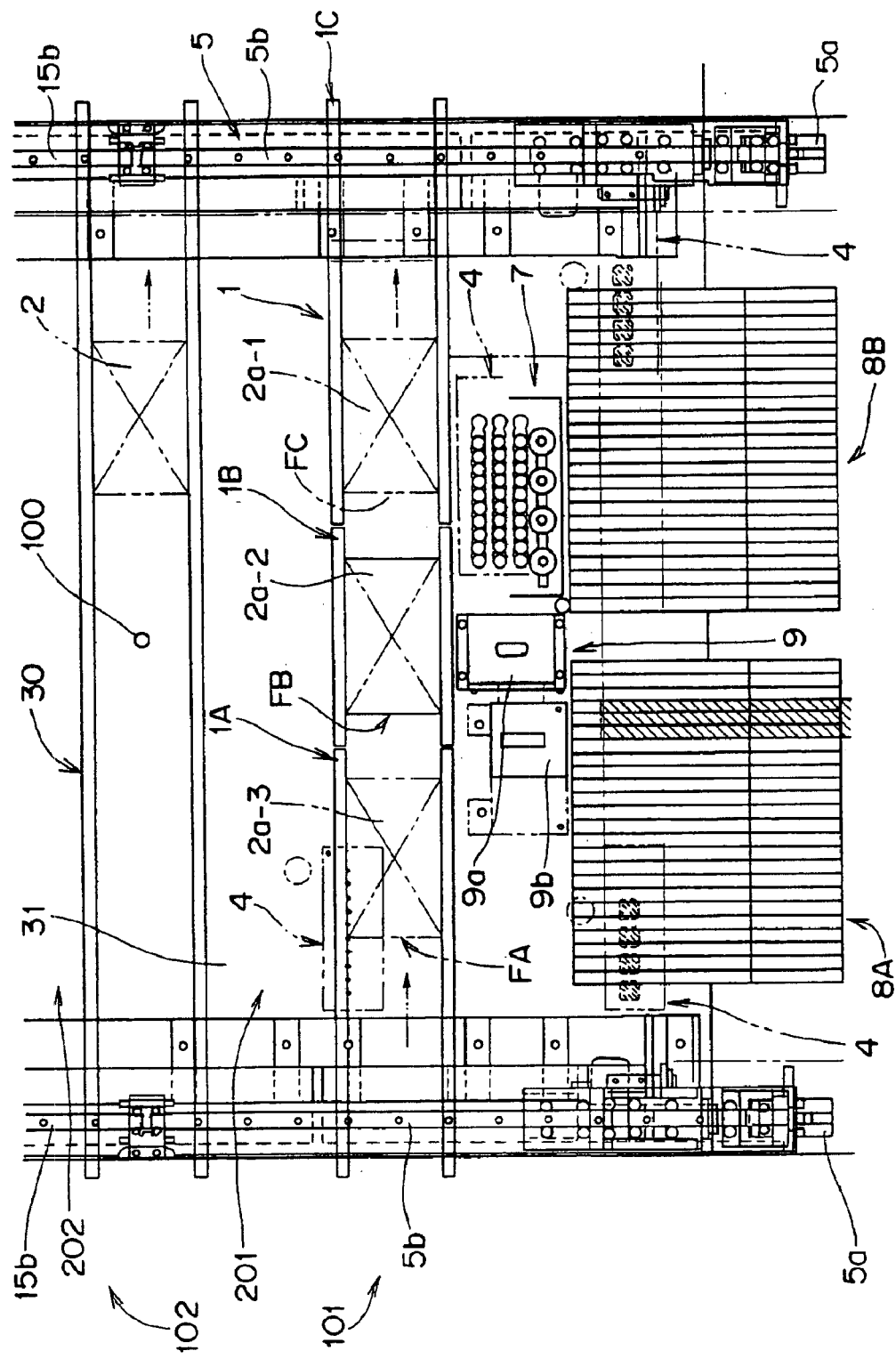
FIG. 2 is an enlarged plan view of a first mounting unit of the component mounting apparatus of FIG. 1.
Figure 3:
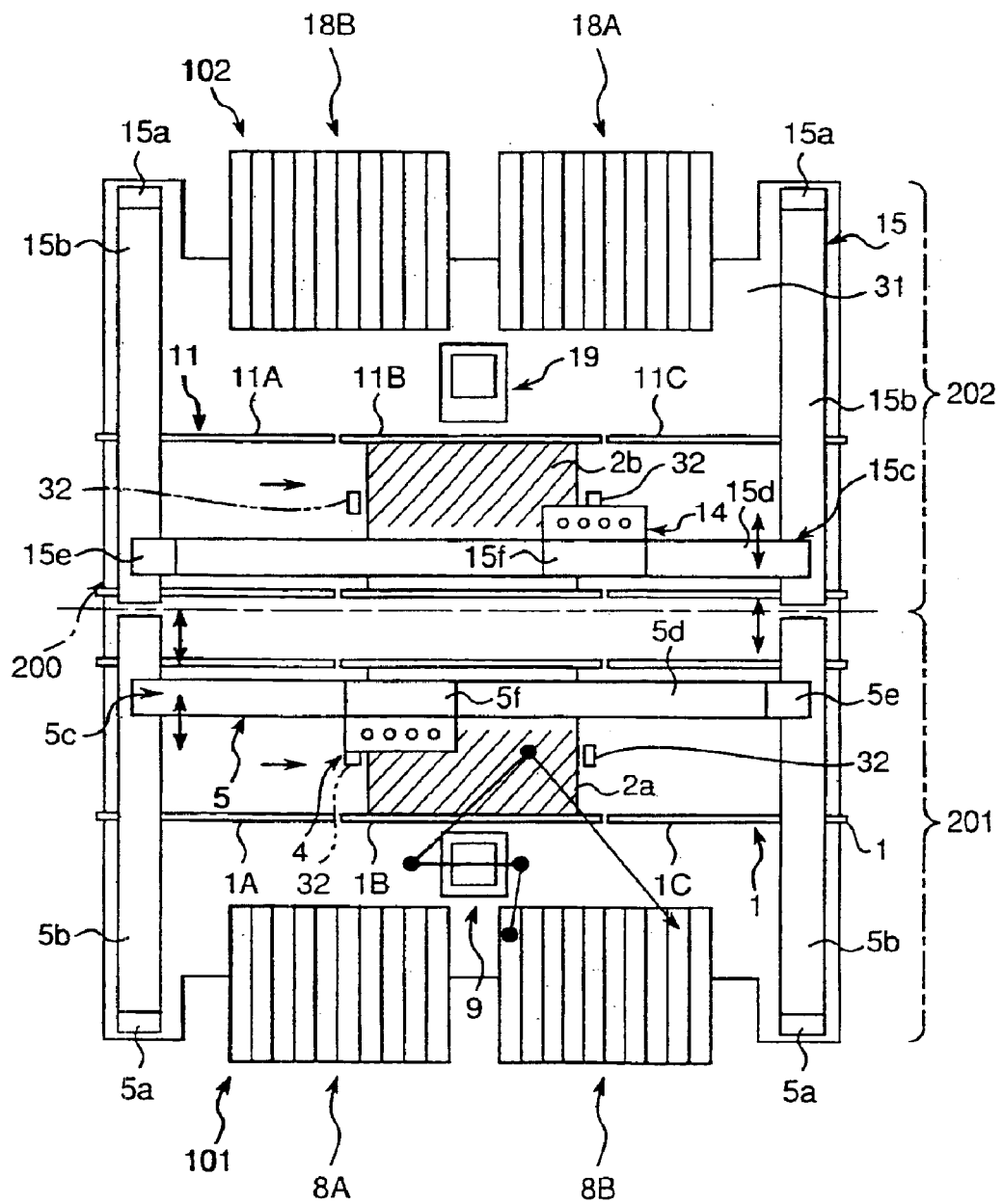
FIG. 3 is an overall schematic arrangement view of the component mounting apparatus of FIG. 1.
Figure 4:
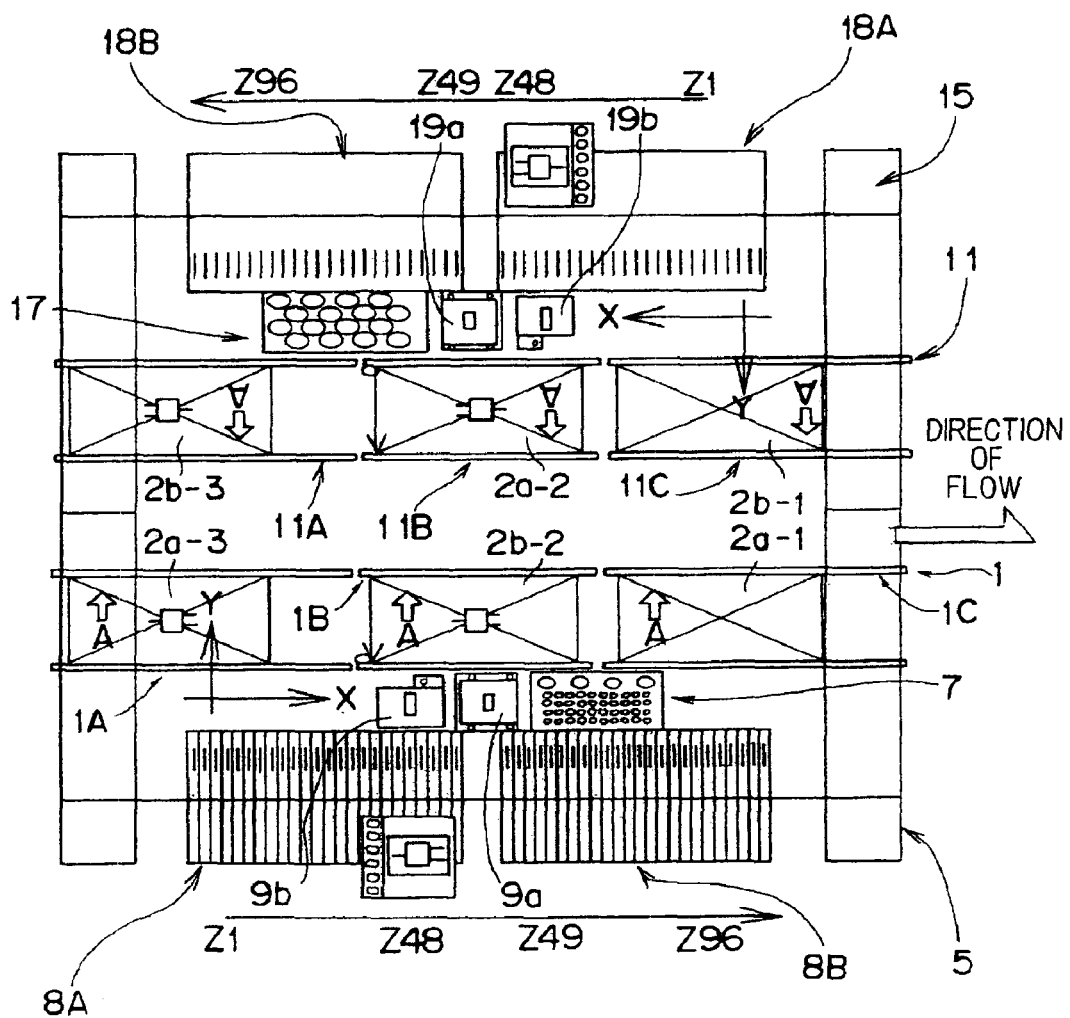
FIG. 4 is an explanatory view for explaining a mounting operation of the component mounting apparatus of FIG. 1, wherein the capitalized English letter "A" at a center of each board is a mark indicating a direction of each board.

As shown in FIGS. 1 through 3, a component mounting apparatus capable of performing a component mounting method according to a first embodiment of the present invention can mount components on a board 2, which is one example of a circuit formation article and on which components are to be mounted, with remarkably improved productivity per device installation area. It is noted here that the term "components" includes electronic components, mechanical components, optical components and the like. The term "circuit formation article" refers to objects on which a circuit is formed, exemplified by such circuit boards as resin boards, paper-phenol boards, ceramic boards, glass epoxy boards and film boards, such circuit boards as single-layer boards or multilayer boards, and components, casings, frames or the like.

In a component mounting work area of one component mounting apparatus described above, two electronic circuit boards 2 (first board 2a and second board 2b) are arranged opposite each other so as to allow components to be mounted thereon independently of each other. For these purposes, two sets of component feeding devices 8 and 18, placement heads 4 and 14, placement head drive devices 5 and 15 for the heads, board conveying and holding devices 1 and 11, recognition cameras 9 and 19 and so on are arranged. The above-mentioned various constituent elements are provided point-symmetrically with respect to a central point 100 (see FIG. 1) of a component mounting work area 200.

More specifically, with regard to the above-mentioned component mounting apparatus, a first mounting section 101 is disposed in a first component mounting work area 201 out of two parts of the first component mounting work area 201 and a second component mounting work area 202, which are obtained by dividing the component mounting work area 200 and which do not overlap each other, and a second mounting section 102 is disposed in the second component mounting work area 202. In order to make it easy to compare areal productivity between the component mounting work areas, it is preferable to divide the component mounting work area 200 into two equal parts so that the first component mounting work area 201 and the second component mounting work area 202 have identical areas.

The first mounting section 101 and the second mounting section 102 are independently controlled in operation by a control unit 1000. Therefore, various operations such as conveyance for board loading and unloading, board positioning, component feed, component suction, recognition, placement, placement-head movement and so on can be performed synchronously or asynchronously.

The first mounting section 101 can hold the first board 2a on which components are to be mounted (the board 2 targeted for the mounting in the first mounting section 101 is denoted by 2a for explanation; moreover, the board 2 is denoted by the reference numeral 2a when indicated regardless of the position, and the board 2a in a specific position is denoted by reference numerals 2a-1, 2a-2, 2a-3 or the like) in a first pre-placement standby position FA, a first placement position FB and a first post-placement standby position FC along a first conveyance path within the first component mounting work area 201, and places a component, which has been fed from first component feeding device 8, held and recognized by first recognition device 9, onto the first board 2a located in the first mounting position FB based on a recognition result of first recognition device 9.

The first mounting section 101 is provided with first board conveying and holding device 1, the first component feeding device 8, first placement head drive device 5 and the first recognition device 9.

Figure 33:
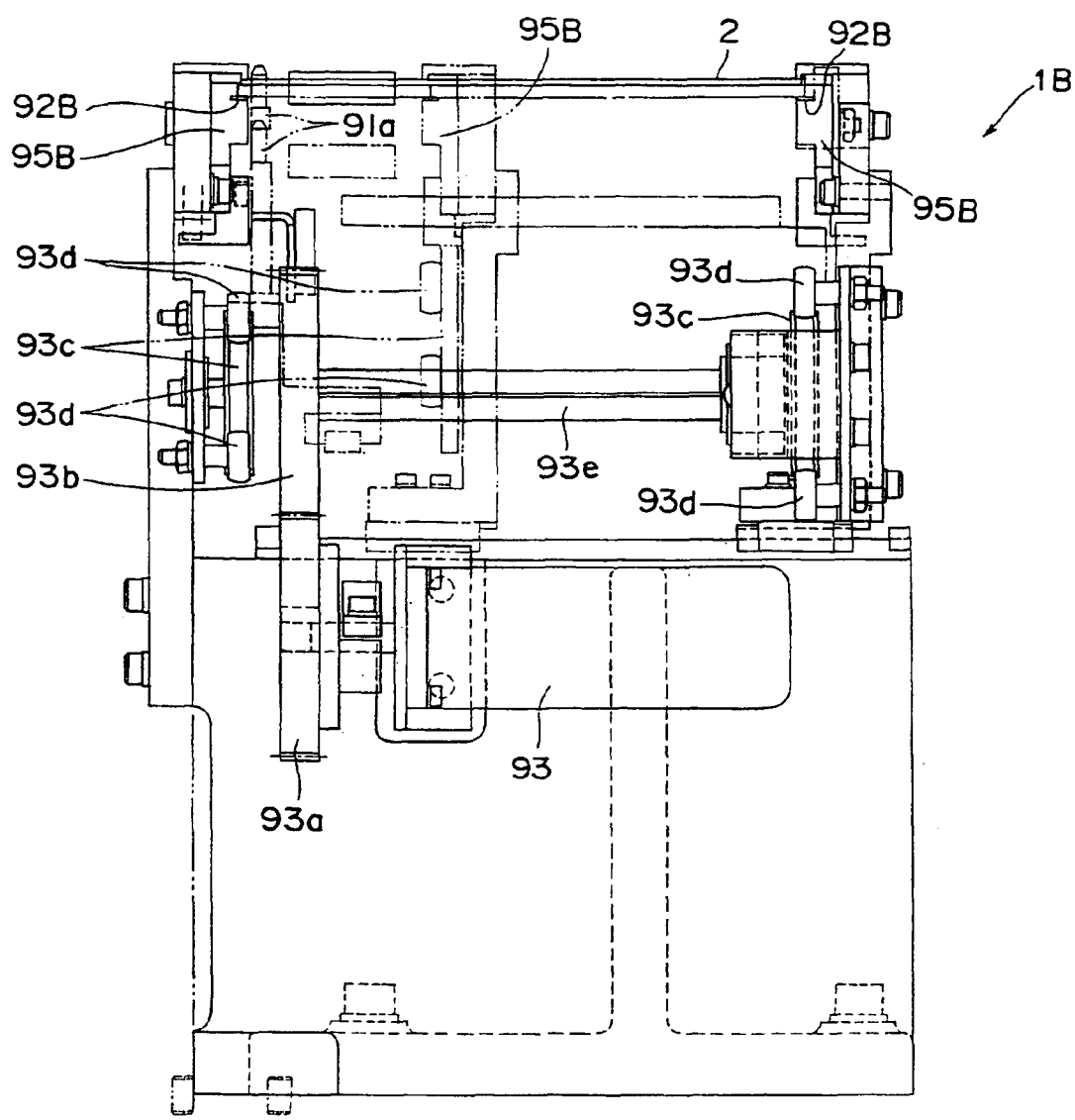
FIG. 33 is a right-hand side view of the first placement-position determining conveyance unit of FIG. 31.
Figure 34:
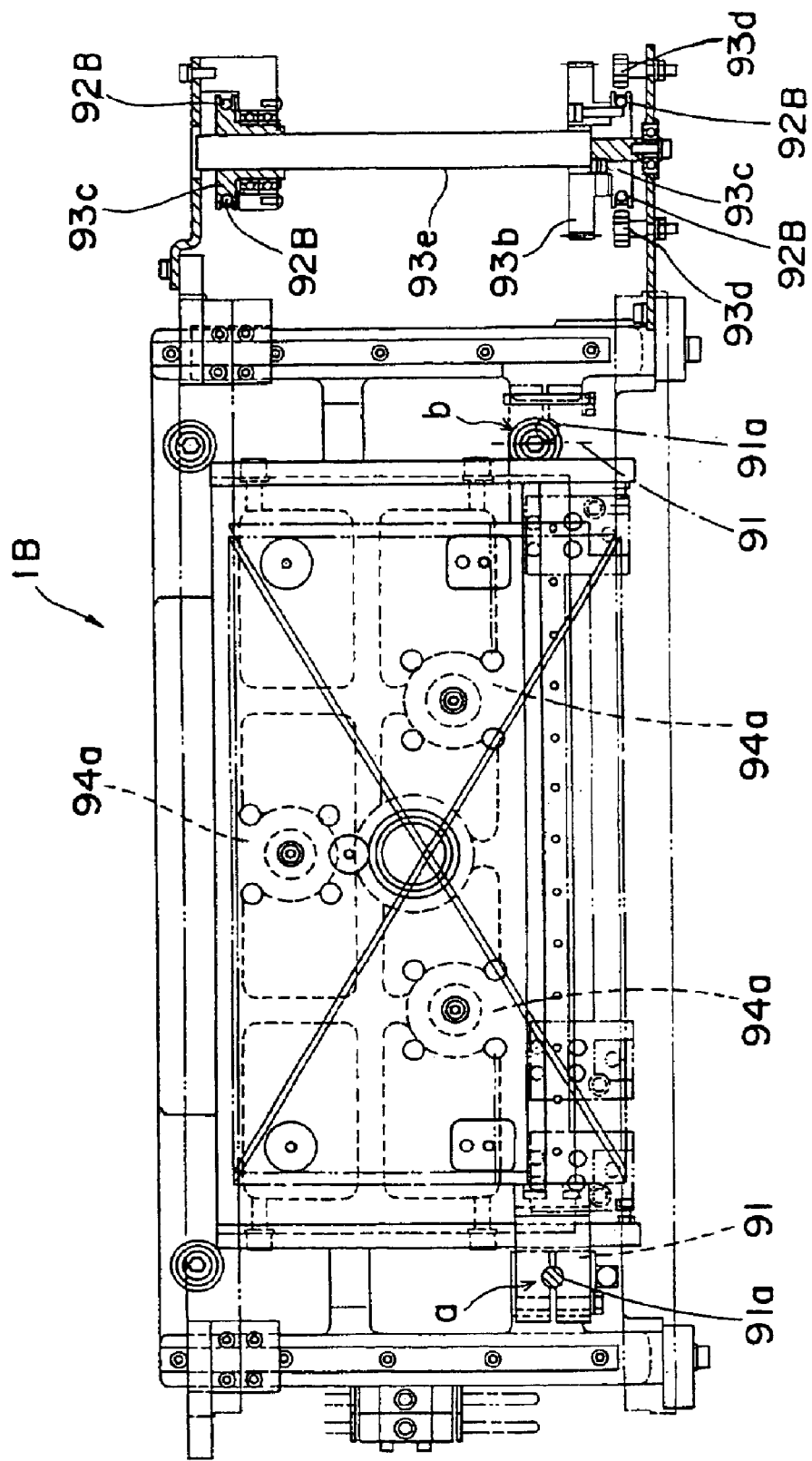
FIG. 34 is a plan view in a cross section taken along line C—C of FIG. 31.

The first board conveying and holding device 1 is able to convey the first board 2a, on which components are to be mounted, along a first conveyance path and to position and hold the first board 2a in the first pre-placement standby position FA extending along the first conveyance path, the first placement position FB located on a downstream side of the first pre-placement standby position FA, and the first post-placement standby position FC located on a downstream side of the first placement position FB. The first pre-placement standby position FA, the first placement position FB and the first post-placement standby position FC are linearly arranged. More specifically, the first board conveying and holding device 1 is constructed in a manner that a first loader 1A as an example of a pre-placement conveyance unit, a first placement-position determining conveyance unit 1B as an example of a placement conveyance unit, and a first unloader 1C as an example of a post-placement conveyance unit are arranged in this order from an upstream side to a downstream side along the first conveyance path. The first loader 1A loads the first board 2a into the first conveyance path of the first component mounting work area 201 and positions and holds the board in the first pre-placement standby position FC. The first placement-position determining conveyance unit 1B is disposed between the first loader 1A and the first unloader 1C, receives from the first loader 1A the first board 2a that has been positioned and held in the first pre-placement standby position FC, positions and holds the board in the first placement position FB, and unloads the board toward the first unloader 1C when a component placement operation of the first board 2a is completed. The first unloader 1C positions and holds the board in the first post-placement standby position FC and unloads the. first board 2a from the first conveyance path. The first loader 1A, the first placement-position determining conveyance unit 1B, the first unloader 1C and a bypass conveyance unit 30 described later, which are all roughly identical in structure, can synchronously drive a pair of belt conveyors back and forth in a direction of the first conveyance path by a drive device of one motor or two motors or the like. Moreover, according to a width of the first board 2a, a position of at least one belt conveyor can be moved in a widthwise direction with respect to a position of the other belt conveyor, thus allowing width adjustment to be performed according to the width of the first board 2a (see a solid-line position and a two-dot chain line position of the right-hand movable-side rail in FIG. 33 as described below).

The first placement-position determining conveyance unit 1B, which is similar in structure to a later-described second placement-position determining conveyance unit 11B, has a pair of movable-side rails 95B extending along the board conveyance direction and disposed parallel to each other to convey and support the boards 2 as shown in FIGS. 28 to 34, with conveyor belts 92B disposed on the pair of movable-side rails 95B on their confronting face side. A driving gear 93a is rotated by rotational drive of a conveyor-belt drive motor 93 fixed on one longitudinal end side of the first placement-position determining conveyance unit 1B, causing a gear 93b meshed with the driving gear 93a to rotate, so that both-side pulleys 93c fixed to a rotating shaft 93e, having a rectangular cross section with the gear 93b fixed thereto, are rotated. As a result of this, the conveyor belts 92B stretched around the both-side pulleys 93c and arranged along both-side movable-side rails 95B so as to be guided by a multiplicity of guide rollers are synchronously moved, by which the boards 2 placed on both-side conveyor belts 92B are conveyed in the board conveyance direction.

When a board 2 has been conveyed by the both-side conveyor belts 92B into a specified position, the board 2 is hit at its fore end and stopped by a positioning pin 91a upwardly projecting into the board conveyance path by drive of an up/down driving cylinder 91; thus, the board 2 is positioned in a specified position. It is noted that, assuming that the board 2 is conveyed from left to right or from right to left in FIG. 34, this up/down driving cylinder 91 is located at a position 'a' of a solid line in a case where a left-end edge of the board 2 is hit and stopped by the positioning pin 91a so as to be referenced for positioning, or at a position 'b' of a solid line in another case where a right-end edge of the board 2 is hit and stopped by the positioning pin 91a so as to be referenced for positioning.

Then, by drive of a drive device such as a piston 94, a multiplicity of support pins 99a supported by a support table 99 are moved up together with the support table 99 from a lower-face side of the board 2 so that both-end edge portions of the board 2 are pressed against an upper end portion of the movable-side rail 95B, by which the board 2 is gripped and positioned and held in the specified position. For releasing positioning and holding, by the drive of the drive device such as the piston 94, the support pins 99a are moved down together with the support table 99 so that pressing of the both-end edge portions of the board 2 against the upper end portion of the movable-side rail 95B is released, by which a gripping of the board 2 is released. In addition, in the figures, reference numeral 94a denotes up/down guide rods for moving the support table 99 up and down in parallel.

Figure 31:
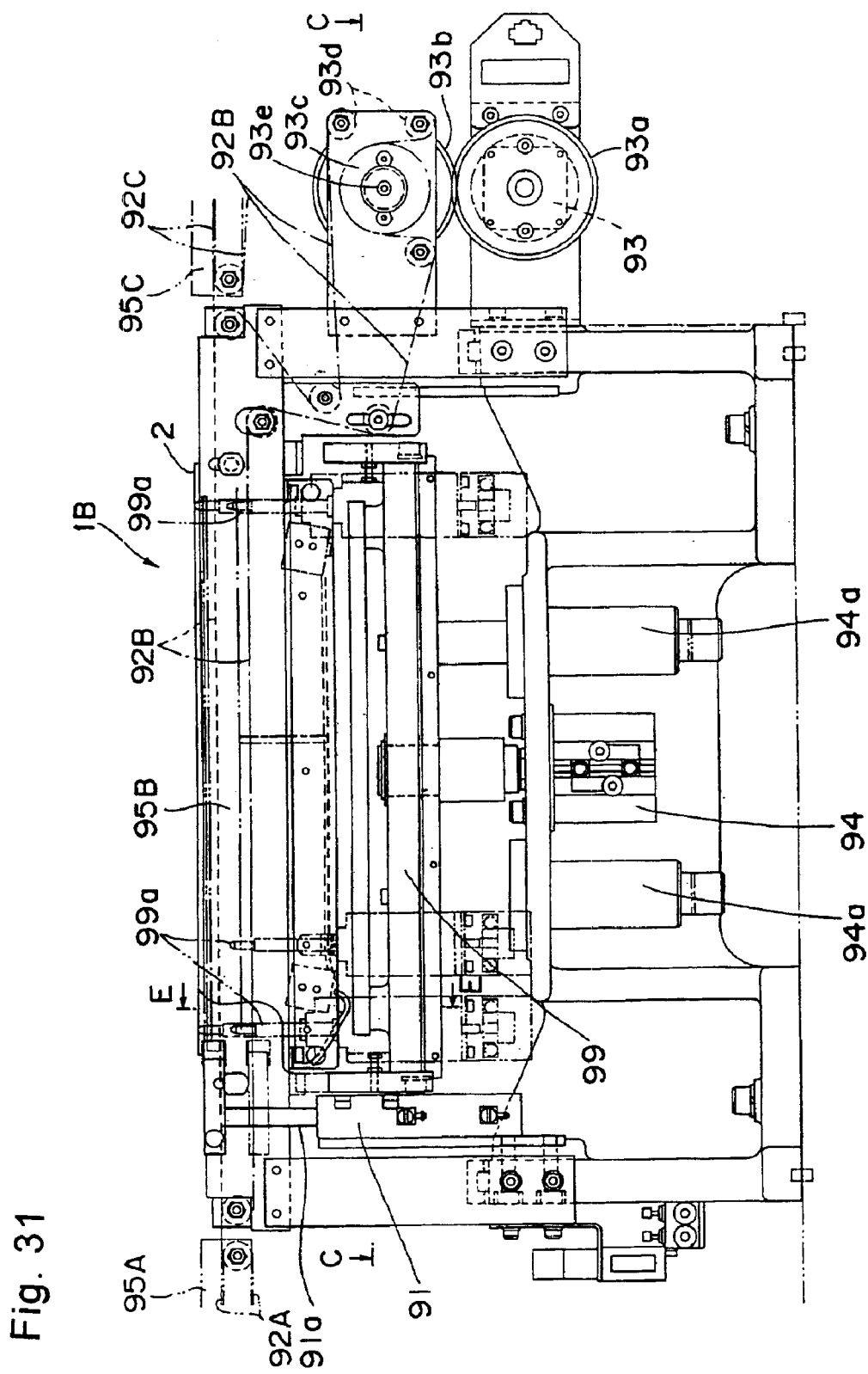
FIG. 31 is a front view of a first placement-position determining conveyance unit as an example of a placement-position determining conveyance unit of the component mounting apparatus according to the first embodiment.
Figure 32:
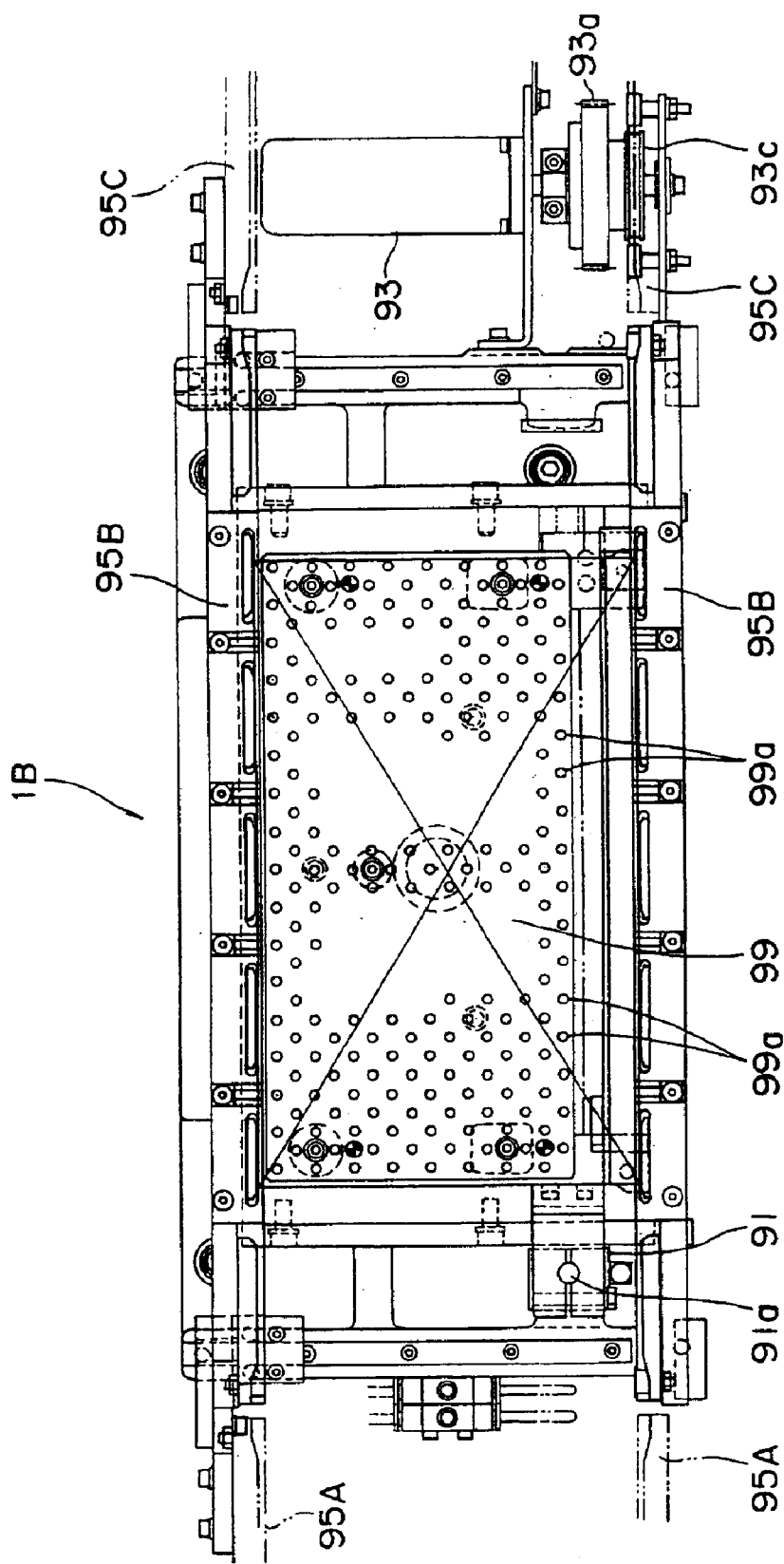
FIG. 32 is a plan view of the first placement-position determining conveyance unit of FIG. 31.

Also, numerals 95A and 95C of FIG. 31 denote a movable-side rail of an upstream-side loader and a movable-side rail of a downstream-side unloader, respectively. For these movable-side rails also, conveyor belts 92A and 92C are disposed on a pair of movable-side rails on their confronting face side, respectively, as with the movable-side rails 95B, so that the conveyor belts 92A and 92C can convey the boards 2 in the board conveyance direction by rotational drive of a drive motor. Drive devices for driving the conveyor belts 92A, 92B and 92C are drive-controlled independently of one another.

The first component feeding device 8 is arranged in the vicinity of the first placement position FB and feeds the components. More concretely, the first component feeding device 8 is composed of first component feeding units 8A and 8B, and each of the first component feeding units 8A and 8B is disposed on one side of the first component mounting work area 201 closer to an operator, i.e., at front-side end portions for the operator, and made up of a multiplicity of parts cassettes or the like accommodating taped components in which components to be mounted onto the first board 2a are accommodated and held in a tape form. It is also acceptable that a tray type component feeding unit accommodating tray components in which components to be mounted onto the first board 2a, such as semiconductor chips, are accommodated and held in a tray form is disposed in place of all or part of the first component feeding unit 8A or 8B.

The first placement head drive device 5 moves first placement head 4 between the first component feeding device 8 and the first placement position FB, holds a component, received from the first component feeding device 8, by the first placement head 4, and places, via the first placement head 4, the component held by the first placement head 4 onto the first board 2a positioned and held in the first placement position FB. In this first placement head 4, a plurality of, for example, ten component suction nozzles 10, for sucking and holding electronic components in the first component mounting work area 201 are arranged irreplaceably.

In detail, the first placement head drive device 5 is implemented by a first X-Y robot for positioning the first placement head 4 located inside the first component mounting work area 201 in a specified position in X- and Y-directions, which are two orthogonal directions in the first component mounting work area 201. This first X-Y robot 5 has the following constitution. Two Y-axis direction ball screw shafts 5b and 5b extending parallel in the Y-axis direction perpendicular to the first conveyance path of the first board 2a are arranged forward-and-reverse rotatable at front-and-rear end edges in the direction of the first conveyance path of the first component mounting work area 201 on a mounting apparatus base 31. The two Y-axis direction ball screw shafts 5b and 5b rotate forward and reverse in synchronism by synchronous driving of Y-axis direction motors 5a and 5a, as an example of a Y-axis rotation drive device, fixed to one end of the two Y-axis direction ball screw shafts 5b and 5b. There are provided a Y-axis movable unit 5c that can advance or retreat along the Y-axis direction in mesh with the two Y-axis direction ball screw shafts 5b and 5b, one X-axis ball screw shaft 5d that is arranged forward-and-reverse rotatable in the Y-axis movable unit 5c and that extends in the X-axis direction perpendicular to the Y-axis direction and parallel to the first conveyance path of the first board 2a, an X-axis direction motor 5e, as an example of an X-axis rotation drive device, for rotating forward and reverse the X-axis ball screw shaft 5d, and an X-axis movable unit 5f that can advance or retreat along the X-axis direction in mesh with the X-axis ball screw shaft 5d. Further, the first placement head 4 that moves in the first component mounting work area 201 is fixed to the X-axis movable unit 5f and arranged movably in the X-axis direction integrally with the X-axis movable unit 5f. Therefore, the first placement head 4 can be advanced and retreated in the X-axis direction and the Y-axis direction by the first X-Y robot 5.

In FIG. 1, reference numeral 7 denotes a first nozzle station, which is arranged in the vicinity of a later-described first component feeding unit 8B in the first component mounting work area 201 and houses a plurality of types of nozzles suitable for a plurality of types of electronic components so as to replace a nozzle set on the first placement head 4 as a need arises.

The first recognition device 9 is disposed at a proximity of the first placement position FB, for example, on a front side of the first placement position FB as viewed from the operator, and performs imaging and recognition of a sucking posture or the like of a component held by the first placement head 4. It is noted that reference numeral 9a in FIG. 1 denotes a two-dimensional camera, for two-dimensionally imaging the sucking posture of the component, of the recognition device 9, while 9b denotes a three-dimensional camera, for three-dimensionally imaging the sucking posture of the component, of the recognition device 9.

On the other hand, the second mounting section 102 can hold the second board 2a on which components are to be mounted (the board 2 targeted for the mounting in the second mounting section 102 is denoted by 2b for explanation; moreover, the board 2 is denoted by the reference numeral 2b when indicated regardless of the position, and the board 2b in a specific position is denoted by reference numerals 2b-1, 2b-2, 2b-3 or the like) in a second pre-placement standby position SA, a second placement position SB and a second post-placement standby position SC along a second conveyance path other than the first conveyance path within the second component mounting work area 202, and places a component, which has been fed from second component feeding device 18, held and recognized by a second recognition device 19, onto the second board 2b located in the second placement position SB based on a recognition result of the second recognition device 19.

The second mounting section 102 is provided with second board conveying and holding device 11, second component feeding device 18, second placement head drive device 15 and the second recognition device 19.

The second board conveying and holding device 11 is able to convey the second board 2b, on which a component is to be mounted, along the second conveyance path other than the first conveyance path and to position and hold the second board 2b in the second pre-placement standby position SA extending along the second conveyance path, the second placement position SB located on a downstream side of the second pre-placement standby position SA and the second post-placement standby position SC located on a downstream side of the second placement position SB. The second pre-placement standby position SA, the second placement position SB and the second post-placement standby position SC are linearly arranged. More specifically, the second board conveying and holding device 11 is constructed in a manner that a second loader 11A as an example of a pre-placement conveyance unit, a second placement-position determining conveyance unit 11B as an example of a placement conveyance unit and a second unloader 11C as an example of a post-placement conveyance unit are arranged in this order from an upstream side to a downstream side along the second conveyance path. The second loader 11A loads the second board 2b into the second conveyance path of the second component mounting work area 202, and positions and holds the board in the second pre-placement standby position SA. The second placement-position determining conveyance unit 11B is disposed between the second loader 11A and the second unloader 11C, receives from the second loader 11A the second board 2b that has been positioned and held in the second pre-placement standby position SA, positions and holds the board in the second placement position SB, and unloads the board toward the second unloader 11C when a component placement operation of the second board 2b is completed. The second unloader 11C positions and holds the board in the second post-placement standby position SC and unloads the second board 2b from the second conveyance path. The second loader 11A, the second placement-position determining conveyance unit 11B and the second unloader 11C, which are all roughly identical in structure, can synchronously drive a pair of belt conveyors back and forth in a direction of the second conveyance path by a drive device of one motor or two motors or the like. Moreover, according to a width of the second board 2b, a position of at least one belt conveyor can be moved in a widthwise direction with respect to a position of the other belt conveyor, thus allowing width adjustment to be performed according to the width of the second board 2b.

The second component feeding device 18 is arranged in the vicinity of the second placement position SB and feeds components. More concretely, the second component feeding device 18 is composed of second component feeding units 18A and 18B, and each of the second component feeding units 18A and 18B is disposed at a deeper-side end portion of the second component mounting work area 202 as viewed from the operator, and made up of a multiplicity of parts cassettes or the like accommodating taped components in which components to be mounted onto the second board 2b are accommodated and held in a tape form. It is also acceptable that a component feeding unit accommodating tray components in which components to be mounted onto the second board 2b such as semiconductor chips, are accommodated and held in a tray form is disposed in place of all or part of the second component feeding unit 18A or 18B.

The second placement head drive device 15 moves a second placement head 14 between the second component feeding device 18 and the second placement position SB, holds a component, received from the second component feeding device 18 by the second placement head 14, and places, via the second placement head 14, the component held by the second placement head 14 onto the second board 2b positioned and held in the second placement position SB. In this second placement head 14, a plurality of, for example, ten component suction nozzles for sucking and holding electronic components in the second component mounting work area 202 are arranged replaceably.

In detail, the second placement head drive device 15 is implemented by a second X-Y robot for positioning the second placement head 14 located inside the second component mounting work area 202 in a specified position in X- and Y-directions, which are two orthogonal directions in the second component mounting work area 202. This second X-Y robot 15 has the following constitution. Two Y-axis direction ball screw shaft 15b and 15b extending parallel in the Y-axis direction perpendicular to the second conveyance path of the second board 2b are arranged forward-and-reverse rotatable at front-and-rear end edges in the direction of the second conveyance path of the second component mounting work area 202 on the mounting apparatus base 31. The two Y-axis direction ball screw shafts 15b and 15b rotate forward and reverse in synchronism by synchronous driving of Y-axis direction motors 15a and 15a, as an example of a Y-axis rotation drive device, fixed to one end of the two Y-axis direction ball screw shafts 15b and 15b. There are provided a Y-axis movable unit 15c that can advance or retreat along the Y-axis direction in mesh with the two Y-axis direction ball screw shafts 15b and 15b, one X-axis ball screw shaft 15d that is arranged forward-and-reverse rotatable in the Y-axis movable unit 15c and that extends in the X-axis direction perpendicular to the Y-axis direction and parallel to the second conveyance path of the second board 2b, an X-axis direction motor 15e, as an example of an X-axis rotation drive device, for rotating forward and reverse the X-axis ball screw shaft 15d, and an X-axis movable unit 15f that can advance or retreat along the X-axis direction in mesh with the X-axis ball screw shaft 15d. Further, the second placement head 14 that moves in the second component mounting work area 202 is fixed to the X-axis movable unit 15f and arranged movably in the X-axis direction integrally with the X-axis movable unit 15f. Therefore, the second placement head 14 can be advanced and retreated in the X-axis direction and the Y-axis direction by the second X-Y robot 15.

In FIG. 1, reference numeral 17 denotes a second nozzle station, which is arranged in the vicinity of a later-described second component feeding unit 18B in the second component mounting work area 202 and houses a plurality of types of nozzles suitable for a plurality of types of electronic components so as to replace a nozzle set on the second placement head 14 as need arises.

The second recognition device 19 is disposed at a proximity of the second placement position SB, for example, on a deeper side of the second placement position SB as viewed from the operator, and performs imaging and recognition of a sucking posture or the like of a component held by the second placement head 14. It is noted that reference numeral 19a in FIG. 1 denotes a two-dimensional camera for two-dimensionally imaging the sucking posture of the component, of the recognition device 19, while 19b denotes a three-dimensional camera for three-dimensionally imaging the sucking posture of the component, of the recognition device 19.

In the first mounting section, the component is held, after being received from the first component feeding device 8, by the first placement head 4, and recognition of the component held by the first placement head 4 is performed by, for example, the two-dimensional camera 9a of the first recognition device 9. Thereafter, on the basis of a recognition result of the first recognition device 9, the component held by the first placement head 4 is placed on the first board 2a positioned and held in the first placement position FB by the first board conveying and holding device 1.

On the other hand, in the second mounting section 102, the component is held, after being received from the second component feeding device 18, by the second placement head 14, and recognition of the component held by the second placement head 14 is performed by, for example, the two-dimensional camera 19a of the second recognition device 19. Thereafter, on the basis of a recognition result of the second recognition device 19, the component held by the second placement head 14 is placed on the second board 2b positioned and held in the second placement position SB by the second board conveying and holding device 11.

Board passage detection sensors (not shown) for detecting passage of the circuit boards 2a and 2b, respectively, are arranged at one-side end portions of the first and second placement-position determining conveyance units 1B and 11B, the one side being closer to the loaders 1A and 11A, respectively, and board stoppers 32 for stopping the circuit boards 2a and 2b in respective specified positions are arranged at end portions on a side closer to the unloaders 1C and 11C, respectively. Board arrival detection sensors (not shown), for detecting approach and arrival of the circuit boards 2a and 2b in the board conveyance directions of the conveyance paths from the loaders 1A and 11A side toward the unloaders 1C and 11C to the specified positions, are provided in the vicinity of the board stoppers 32. More specifically, a cylinder for driving each board stopper is provided with an upper-end position detection sensor for detecting an upper end position of its piston rod although not shown in the figures. The board stoppers are positioned in elevated positions during a mounting operation while abutting against respective boards 2a and 2b.

Moreover, in order to place electronic components on the circuit boards 2a and 2b with high quality, the boards 2a and 2b need to be supported from below. Accordingly, the first and second placement-position determining conveyance units 1B and 11B of the board conveying and holding device are provided with a support plate (not shown) that has a size equal to or larger than a largest board and that can be moved up and down. A required number of support pins (not shown) are planted on these support plates, and the support plates are moved up by respective support plate driving cylinders (not shown) so as to support lower surfaces of the circuit boards 2a and 2b by the support pins. Both side portions of the boards 2a and 2b are held between support rail portions so as to be held in specified positions, respectively.

Figure 5:
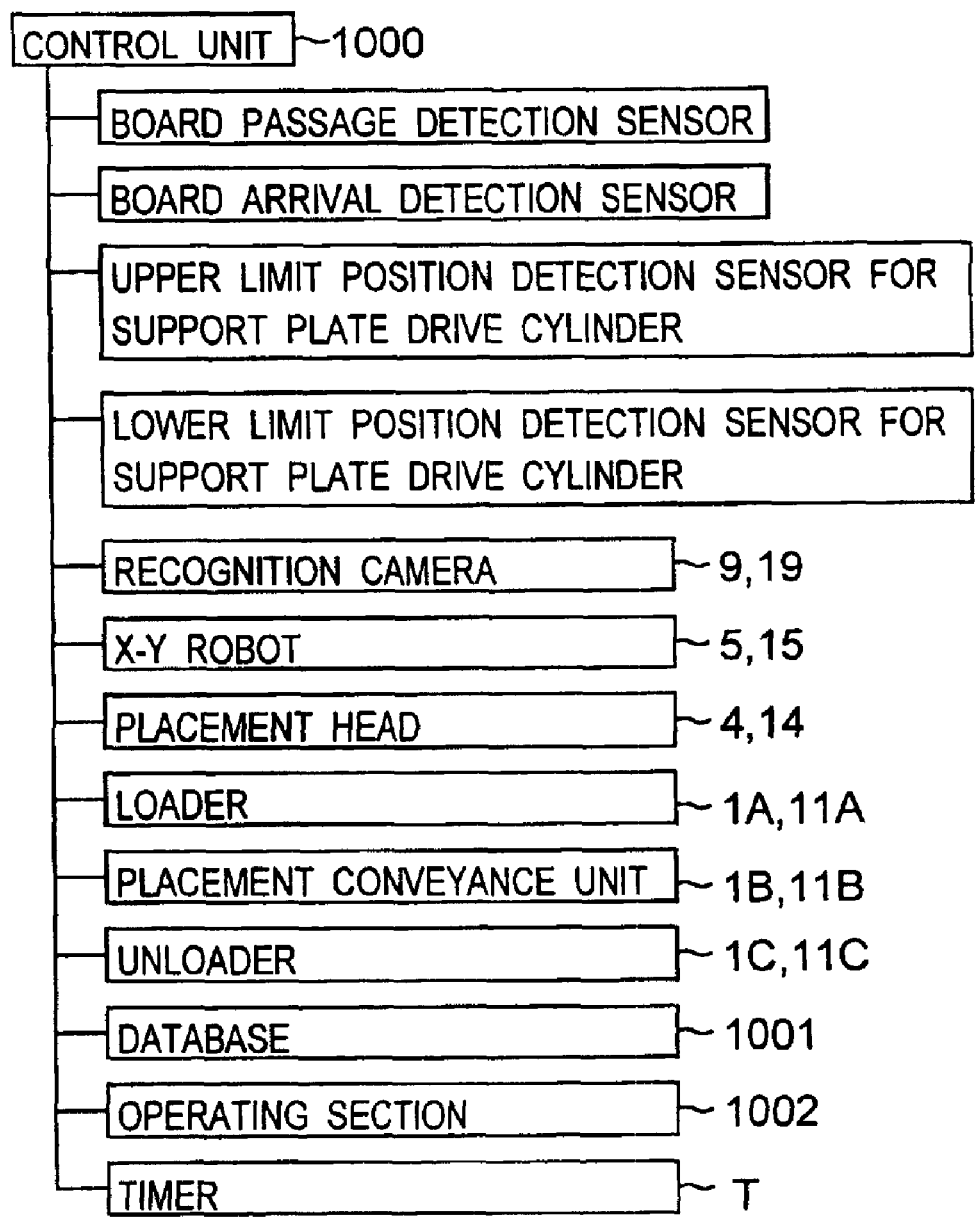
FIG. 5 is a block diagram showing a relationship of connection between a control unit, drive devices and sensors of the component mounting apparatus of FIG. 1.

As shown in FIG. 5, the aforementioned sensors and drive devices are connected to a control unit 1000, and the drive devices are driven and controlled based on a specified mounting program. That is, the control unit 1000 is connected at least to the board passage detection sensors, the board arrival detection sensors, the first and second recognition cameras 9 and 19, the first and second X-Y robots 5 and 15, the first and second placement heads 4 and 14, the first and second loaders 1A and 11A, the first and second placement-position determining conveyance units 1B and 11B, the first and second unloaders 1C and 11C, the belt drive motor, the board stopper driving cylinder, a database 1001 having stored therein information pertaining to a mounting operation or other information, such as information as to a size and the like of the board 2 on which components are to be mounted, information as to shapes, heights and the like of components, information as to placement positions on the board in which the components are to be mounted, a mounting sequence therefor, a shape and the like of the component suction nozzles, information as to pre-placement standby positions of the loaders, placement positions of the placement-position determining conveyance units, or post-placement standby positions of the unloaders, an operating section 1002 for executing desired operations, a timer T for establishing timing between individual operations, and so on.

Operation of the electronic component mounting apparatus of the first embodiment constructed as described above is executed under control of the control unit 1000.

First of all, in the first mounting section 101, the first loader 1A, the first placement-position determining conveyance unit 1B and the first unloader 1C are adjusted in width according to a width of the first board 2a to be loaded into the first conveyance path. Thereafter, this first board 2a-1 is positioned in the first placement position FB of the first placement-position determining conveyance unit 1B through the first loader 1A, and a first board 2a-2 to be mounted next is positioned and held in the first pre-placement standby position FA of the first loader 1A.

Next, the first placement head 4 is moved from a position of its origin to the first component feeding device 8, and components are sucked and held by the nozzles of the first placement head 4 after being received from the component feeding unit 8A or 8B of the first component feeding device 8.

Next, the first placement head 4 is moved from the first component feeding device 8 to the first recognition device 9, and postures of the components held by the nozzles of the first placement head 4 are each recognized.

Next, the first placement head 4 is moved from the first recognition device 9 to the first placement-position determining conveyance unit 1B, and the components held by the first placement head 4 are placed by the first placement head 4 onto the first board 2a positioned and held in the first placement position FB of the first placement-position determining conveyance unit 1B. Subsequently, the first placement head 4 returns to the component feeding unit 8A or 8B of the first component feeding device 8 and performs suction of components to be mounted next.

As described above, by repeating component suction, recognition and placement, all the components to be placed are mounted.

After termination of the mounting, the component-mounted board 2a-1 is unloaded from the first placement-position determining conveyance unit 1B toward the first unloader 1C, positioned and held in the first post-placement standby position FC of the first unloader 1C and thereafter further unloaded out of the component mounting work area 201 by the first unloader 1C. At this time, the next first board 2a-2 that has been positioned and held in the first pre-placement standby position FA of the first loader 1A is concurrently positioned and held in the first placement position FB of the first placement-position determining conveyance unit 1B through the first loader 1A, and a next first board 2a-3 is positioned and held in the first pre-placement standby position FA of the first loader 1A. The board positions shown in FIG. 1 and FIG. 2 are in this state.

The mounting operation in the second mounting section 102 is performed concurrently with and independently of the aforementioned mounting operation in the first mounting section 101.

That is, in the second mounting section 102, the second loader 11A, the second placement-position determining conveyance unit 11B and the second unloader 11C are adjusted in width according to a width of the second board 2b to be loaded into the second conveyance path. Thereafter, this second board 2b-1 is positioned in the second placement position SB of the second placement-position determining conveyance unit 11B through the second loader 11A, and a second board 2b-2 to be mounted next is positioned and held in the second pre-placement standby position SA of the second loader 11A.

Next, the second placement head 14 is moved from a position of its origin to the second component feeding device 18, and components are sucked and held by the nozzles of the second placement head 14 after being received from the component feeding unit 18A or 18B of the second component feeding device 18.

Next, the second placement head 14 is moved from the second component feeding device 18 to the second recognition device 19, and postures of the components held by the nozzles of the second placement head 14 are each recognized.

Next, the second placement head 14 is moved from the second recognition device 19 to the second placement-position determining conveyance unit 11B, and the components held by the second placement head 14 are placed on the second board 2b positioned and held in the second placement position SB of the second placement-position determining conveyance unit 11B by the second placement head 14. Subsequently, the second placement head 14 returns to the component feeding unit 18A or 18B of the second component feeding device 18 and performs suction of components to be mounted next.

As described above, by repeating component suction, recognition and placement, all the components to be placed are mounted.

After termination of the mounting, the component-mounted board 2b-1 is unloaded from the second placement-position determining conveyance unit 11B toward the second unloader 11C, positioned and held in the second post-placement standby position SC of the second unloader 11C and thereafter further unloaded out of the component mounting work area 202 by the second unloader 11C. At this time, the next second board 2b-2 that has been positioned and held in the second pre-placement standby position SA of the second loader 11A is concurrently positioned and held in the second placement position SB of the second placement-position determining conveyance unit 11B through the second loader 11A, and a next second board 2b-3 is positioned and held in the second pre-placement standby position SA of the second loader 11A. The board positions shown in FIG. 1 and FIG. 2 are in this state.

According to the first embodiment, in one component mounting apparatus, the component mounting work area 200 of the board 2 is divided into two parts, namely the first component mounting work area 201 and the second component mounting work area 202. In each of the first component mounting work area 201 and the second component mounting work area 202, there are independently performed operations of loading of the boards 2a and 2b by the first loader 1A and the second loader 11A, positioning and holding of the boards 2a and 2b by the first placement-position determining conveyance unit 1B and the second placement-position determining conveyance unit 11B, component feed by the first and second component feeding devices 8 and 18, suction, holding and movement of components by the first and second placement heads 4 and 14, recognition of components by the first and second recognition devices 9 and 19 and unloading of the boards 2a and 2b by the first and second placement-position determining conveyance units 1B and 11B, the first unloader 1C and the second unloader 11C. More concretely, the board 2a-1 is loaded into the first component mounting work area 201 by the first loader 1A in the first component mounting work area 201. The board 2a-1 is positioned and held by the first placement-position determining conveyance unit 1B for a mounting operation in the first placement position FB, that is a portion located closest to the component feeding units 8A and 8B arranged along the board conveyance direction in the first component mounting work area 201 and closest to a camera to be usually most frequently used as one is example of the first component recognition device, e.g., two-dimensional camera 9a. Next, the first placement head 4 is driven to suck and hold a component received from the component feeding unit 8A or 8B, the component is recognized by the two-dimensional camera 9a, and then mounting onto the board 2a is performed. After repeating this and after terminating mounting work in the first mounting section 101, the board 2a-I is unloaded from the first placement-position determining conveyance unit 1B toward the first unloading 1C and further unloaded out of the first component mounting work area 201 by the first unloading 1C. On the other hand, concurrently with the mounting operation in the first mounting section 101, the board 2b-1 is loaded into the second component mounting work area 202 by the second loader 11A in the second component mounting work area 202. The board 2b-1 is positioned and held by the second placement-position determining conveyance unit 11B for a mounting operation in the second placement position SB, that is a portion located closest to the component feeding units 18A and 18B arranged along the board conveyance direction in the second component mounting work area 202 and closest to a camera to be usually most frequently used as one example of the second component recognition device, e.g., two-dimensional camera 19a. Next, the second placement head 14 is driven to suck and hold a component received from the component feeding unit 18A or 18B, the component is recognized by the two-dimensional camera 19a, and then mounting onto the board 2b is performed. After repeating this and after terminating mounting work in the second mounting section 102, the board 2b-1 is unloaded from the second placement-position determining conveyance unit 1B toward the second unloader 11C and further unloaded out of the second component mounting work area 202 by the second unloading 11C.

As a result, in the first and second mounting sections 101 and 102, board loading, component holding, component recognition, component placement and board unloading can be performed independently of each other in respective optimum states, and productivity can be further improved. That is, when either component mounting terminates in advance in concurrently performing component mounting operations in the plurality of component mounting work areas, respectively, a component-mounted board can be unloaded without awaiting termination of the other component mounting operation or board unloading, and areal productivity can be further improved. Moreover, shortest distances between the boards 2a and 2b positioned and held in the respective component mounting work areas 201 and 202, the component feeding units 8A, 8B, 18A and 18B and the cameras that are usually most frequently used, e.g., two-dimensional camera 9a and 19a, respectively, can be remarkably shortened in comparison with a case where boards are held in the board conveyance paths in central portions of the component mounting work areas as in a conventional case, and this can reduce mounting time and improve productivity.

Moreover, with regard to width adjustment (widthwise shift of board) references of the first loader 1A, the first placement-position determining conveyance unit 1B, the first unloader 1C, the second loader 11A, the second placement-position determining conveyance unit 11B and the second unloader 11C of the board conveying and holding devices 1 and 11 according to the widths of the boards 2a and 2b, a front-side edge portion is set as a reference in the first component mounting work area 201 located on the front side near the operator out of the component mounting work areas divided into two, and a deeper-side edge portion is set as a reference in the second component mounting work area 202 located on a deeper side far from the operator. Therefore, by setting the placement positions FB and SB in the placement-position determining conveyance units 1B and 11B with reference to the support rail portion located closest to the component feeding units 8A, 8B, 18A and 18B and the cameras to be usually most frequently used as one example of the component recognition devices 9 and 19, e.g., two-dimensional cameras 9a and 19a, from among the pair of support rail portions of the placement-position determining conveyance units 1B and 11B, and by making the other support rail portion moved close to or apart from the one support rail portion, it is enabled to cope with board size. Therefore, component suction and holding in the component feeding units 8A, 8B, 18A and 18B, and recognition by the two-dimensional cameras 9a and 19a, are performed consistently near a position in the shortest distance, not depending on sizes of the circuit boards 2a and 2b. Distances of movement of the placement heads 4 and 14, i.e., distances between positions of the three operations of component suction, recognition and placement are linked in the shortest distance, and this can reduce mounting process time and increase production efficiency. In particular, conventionally, when components are mounted on the board in the vicinity of the board conveyance position, the distances between the positions of the three operations of component suction, recognition and placement would become long in the case of small boards, and a mounting process time would be increased. In contrast to this, according to the first embodiment, the board is positioned and mounted in the position where the distances between the positions of the three operations of component suction, recognition and placement become short even for small boards and large boards, and therefore, a mounting process time can be remarkably reduced. Particularly, in each component mounting work area, the component feeding units 8A, 8B, 18A and 18B are arranged along end edges in the board conveyance direction of the component mounting work area as shown in FIG. 1 through FIG. 3. Therefore, the recognition devices 9 and 19 are arranged on a central side in the conveyance direction of the component mounting work areas 201 and 202, and the placement positions FB and SB of the boards 2a and 2b in the placement-position determining conveyance units 1B and 11B are also arranged on the central side in the conveyance direction of the component mounting work areas 201 and 202 for reduction of the distances between the positions of the three operations of component suction, recognition and placement. Therefore, the mounting process time can be further improved. Moreover, by dividing one component mounting work area 200 into two parts, distances of movement of the placement heads 4 and 14 are reduced to allow the mounting process time to be improved. For example, in the mounting apparatus of the first embodiment, time required for mounting one component can be reduced to about one-half that of the conventional case, and the mounting process time can be remarkably improved.

Moreover, the two boards 2a and 2b are arranged as a pair oppositely in the component mounting work area 200 in one component mounting apparatus, and therefore, mounting efficiency per unit area can be improved in comparison with a case where only one board 2 is arranged.

Moreover, if component mounting in the first mounting section 101 and component mounting in the second mounting section 102 are concurrently performed, then a mounting operation can be performed more efficiently, and mounting process time can be improved.

Moreover, the first placement head drive device 5 of the first mounting section 101 and the second placement head drive device 15 of the second mounting section 102 have driving regions that do not overlap each other. Therefore, a mounting operation in the mounting sections can be freely set without consideration for mutual interference of both units.

Moreover, two-dimensional images of the components are taken in by arranging the two-dimensional cameras 9a and 19a that are most frequently used for performing recognition of components in positions located adjacent to the placement positions FB and SB and in the vicinity of central portions of the component feeding devices 8 and 18. Therefore, a distance from component feed to component recognition can be shortened, and mounting process time can be further shortened.

Moreover, the component mounting work area 200 is divided into two equal parts of the first component mounting work area 201 and the second component mounting work area 202 that do not overlap each other, and the component feeding devices 8 and 18, the placement heads 4 and 14, the placement head drive devices 5 and 15 of the heads, the board conveying and holding devices 1 and 11, the recognition cameras 9 and 19 and so on are provided point-symmetrically with respect to the central point 100 of the component mounting work area 200. Therefore, if a program of a component mounting operation is formed in either one of the mounting sections in forming the program of the component mounting operation, then the program can be used as it is or utilized in the other mounting section, thereby enabling easy formation of the program of the component mounting operation.

It is to be noted that the present invention is not limited to the first embodiment and is able to be put into practical use in a variety of forms.

For example, a bypass conveyance unit 30, which is arranged between the first conveyance path and the second conveyance path and through which the board 2, that is not subjected to the mounting operation in the first mounting section 101 and the second mounting section 102, is made to pass, is further provided. Therefore, when a plurality of component mounting apparatuses of the first embodiment are joined together or joined to another component mounting apparatus, a board that is not subjected to a mounting operation in the first mounting section 101 and the second mounting section 102, of the component mounting apparatus of the first embodiment, can be conveyed to an adjacent component mounting apparatus without regard to mounting operations of the first mounting section 101 and the second mounting section 102. This enables improvement of overall productivity of the mounting system and also provision of flexibility for production. In particular, component mounting can be performed by the other component mounting apparatus even during maintenance of the first mounting section 101 and the second mounting section 102, and overall productivity of the mounting system can be further Moreover, if the bypass conveyance unit 30 is composed of an upper bypass conveyance unit and a lower bypass conveyance unit arranged below the upper bypass conveyance unit, then two bypass conveyance units can be secured even though an installation area is small, and this enables further improvement of space utilization efficiency.

Moreover, if the bypass conveyance unit 30 is composed of two juxtaposed bypass conveyance units, then a plurality of bypass conveyance units can be more simply provided.

Figure 6:
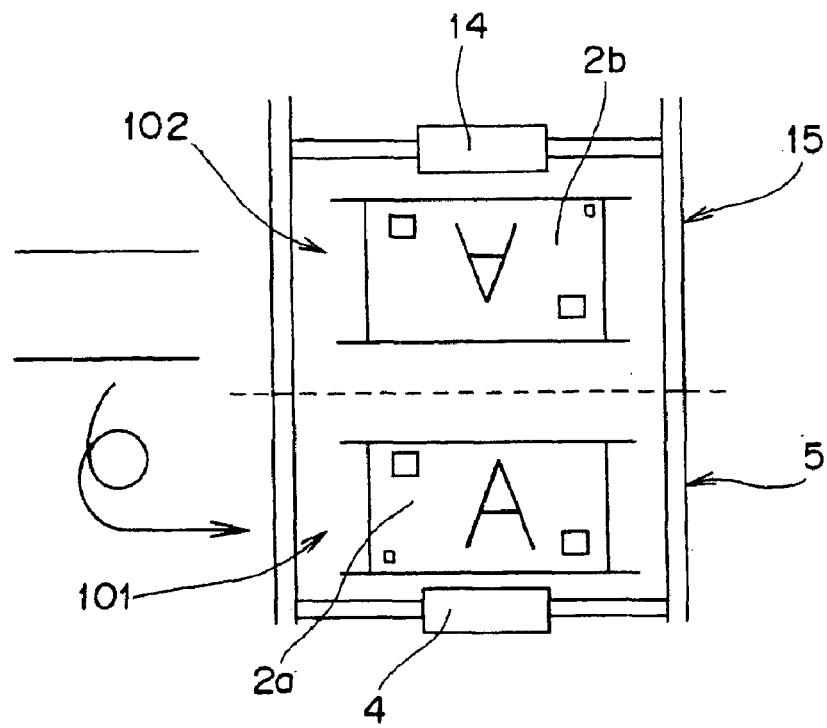
FIG. 6 is an explanatory view showing a state in which a second board is loaded into a second mounting unit while being turned at a phase angle of 180 degrees with respect to a first board loaded into a first mounting unit, and the boards are subjected to mounting operations, respectively, in the component mounting apparatus of FIG. 1, wherein the capitalized English letter "A" at a center of each board is a mark indicating a direction of each board.

Moreover, as shown in FIG. 6, if the second board 2b is loaded into the second mounting section 102 while being turned at a phase angle of 180 degrees with respect to the first board 2a loaded into the first mounting section 101, then a phase of the first board 2a in the first mounting section 101 with respect to the component feeding device 8 and the recognition device 9 becomes identical to a phase of the second board 2b in the second mounting section 102 with respect to the component feeding device 18 and the recognition device 19. This enables use of an identical mounting program and facilitates designing. Furthermore, a mounting operation can be performed through an utterly identical procedure in the two mounting sections 101 and 102. Therefore, mounting process time of mounting operations in the mounting sections 101 and 102 becomes identical, and productivity can be improved. In this case, it is also possible to provide board turning conveyance units that are arranged on an upstream side of the first conveyance path and the second conveyance path, able to turn a board at an angle of 180 degrees and load the board selectively into the first conveyance path and the second conveyance path, and make the units perform the above-mentioned operation.

Figure 7:
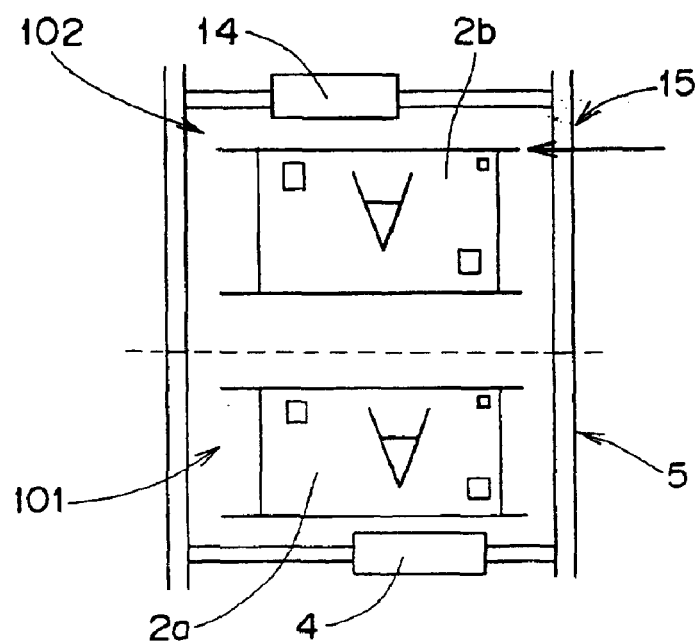
FIG. 7 is an explanatory view showing a state in which the first board loaded into the first mounting unit and the second board loaded into the second mounting unit are subjected to mounting operations, respectively, in an identical phase in the component mounting apparatus of FIG. 1, wherein the capitalized English letter "A" at a center of each board is a mark indicating a direction of each board.

Moreover, if an in-phase mode, in which the second board 2b is loaded into the second mounting section 102 in phase with the first board 2a as shown in FIG. 7, and a reverse mode in which the second board 2b is loaded into the second mounting section 102 while being turned at a phase angle of 180 degrees with respect to the first board 2a as shown in FIG. 6, are selectively used, then a mounting operation can be performed with an optimum mode selected according to board type or the like, and mounting process time can be improved still further.

Moreover, by providing the placement heads 4 and 14 with a plurality of component holding members of, for example, the nozzles for holding components fed by the component feeding devices 8 and 18 that have component feeding units 8A, 8B, 18A and 18B, and arranging the nozzles and component feeding units 8A, 8B, 18A and 18B of the component feeding devices 8 and 18 in an identical direction of arrangement, the placement heads 4 and 14 are only required to move in the X-axis direction without being moved in the Y-axis direction when sucking and holding components, and mounting process time can be further shortened.

Moreover, by providing the placement heads 4 and 14 with a plurality of component holding members of, for example, the nozzles, for holding components fed by the component feeding devices 8 and 18 that have component feeding units 8A, 8B, 18A and 18B, arranging the nozzles and the component feeding units 8A, 8B, 18A and 18B of the component feeding devices 8 and 18 in an identical direction of arrangement, and providing identical intervals between the nozzles and the component feeding units 8A, 8B, 18A and 18B of the component feeding devices 8 and 18 components can be concurrently collectively sucked and held by the nozzles after being received from the component feeding units 8A, 8B, 18A and 18B, and mounting process time can be shortened still further.

Moreover, when performing operations of component feed, holding, recognition and placement in the first mounting section 101, operations of loading, positioning in the first placement position FB and unloading of the first board 2a, operations of component feed, holding, recognition and placement in the second mounting section 102, operations of loading, positioning in the second placement position SB and unloading of the second board 2b, and a recognizing operation or placement operation in either one of the mounting sections of the first mounting section 101 and 102, loading and unloading operations in the other mounting section can be controlled so as not to be performed. By so doing, the recognizing operation or the placement operation can be performed more accurately.

Moreover, it is acceptable to selectively use an in-phase mode operation program for loading the second board 2b into the second mounting section 102 in phase with the first board 2a, and performing operations of component feed, holding, recognition and placement and operations of positioning in the second placement position SB and unloading of the second board 2b, and a reverse mode operation program for loading the second board 2b into the second mounting section 102 by turning this board at a phase angle of 180 degrees with respect to the first board 2a and performing operations of component feed, holding, recognition and placement and operations of loading, positioning in the second placement position SB and unloading of the second board 2b. By so doing, an optimum one can be selected from the in-phase mode operation program and the reverse mode operation program according to a mounting operation, and productivity can be improved still further.

Moreover, it is acceptable to selectively use an in-phase mode operation program for loading the second board 2b into the second mounting section 102 in phase with the first board 2a and performing the operations of component feed, holding, recognition and placement and the operations of positioning in the second placement position SB and unloading of the second board 2b, and a reverse mode operation program for loading the second board 2b into the second mounting section 102 by turning the board at a phase angle of 180 degrees with respect to the first board 2a and performing the operations of component feed, holding, recognition and placement and the operations of positioning in the placement position SB and unloading of the second board 2b, construct the in-phase mode operation program and the reverse mode operation program so that a fundamental operation program for executing fundamental operations of component feed, holding, recognition and placement and the operations of positioning in the placement position SB and unloading of the second board 2b is identical, and an operation data section for executing the fundamental operations is only varied and selectively uses the in-phase mode operation program and the reverse mode operation program. By so doing, a fundamental operation program in the two mounting sections 101 and 102 can be commonly used, and formation of the program can be more efficiently performed.

Moreover, it is acceptable to provide a first mounting operation program for performing operations of component feed, holding, recognition and placement in the first mounting section 101 and operations of loading, positioning in the placement position SB and unloading of the first board 2a, and a second mounting operation program for performing operations of component feed, holding, recognition and placement in the second mounting section 102 and the operations of loading, positioning in the placement position FB and unloading of the first board 2a differently from the first mounting operation program, use the first mounting operation program in the first mounting section 101 and use the second mounting operation program in the second mounting section 102. By so doing, an optimum operation according to a mounting operation in each mounting section can be performed without being influenced by a mounting operation in the other mounting section.

Moreover, it is also possible to determine a type and phase of a board to be loaded into each of the first mounting section 101 and the second mounting section 102 in consideration of apparatus construction information of the first mounting section 101 and the second mounting section 102. By so doing, a phase of each board can be set to an optimum state according to the apparatus construction of each mounting section, and an optimum mounting operation can be performed. For example, although the two-dimensional camera 9a is arranged as the first recognition device 9 in the first mounting section 101, when only the three-dimensional camera 19b is arranged as the second recognition device 19 in the second mounting section 102, it is possible to make the second mounting section 102 perform a mounting operation only for three-dimensional component recognition and make the first mounting section 101 provided with the two-dimensional camera 9a perform an operation for two-dimensional component recognition.

Figure 8:
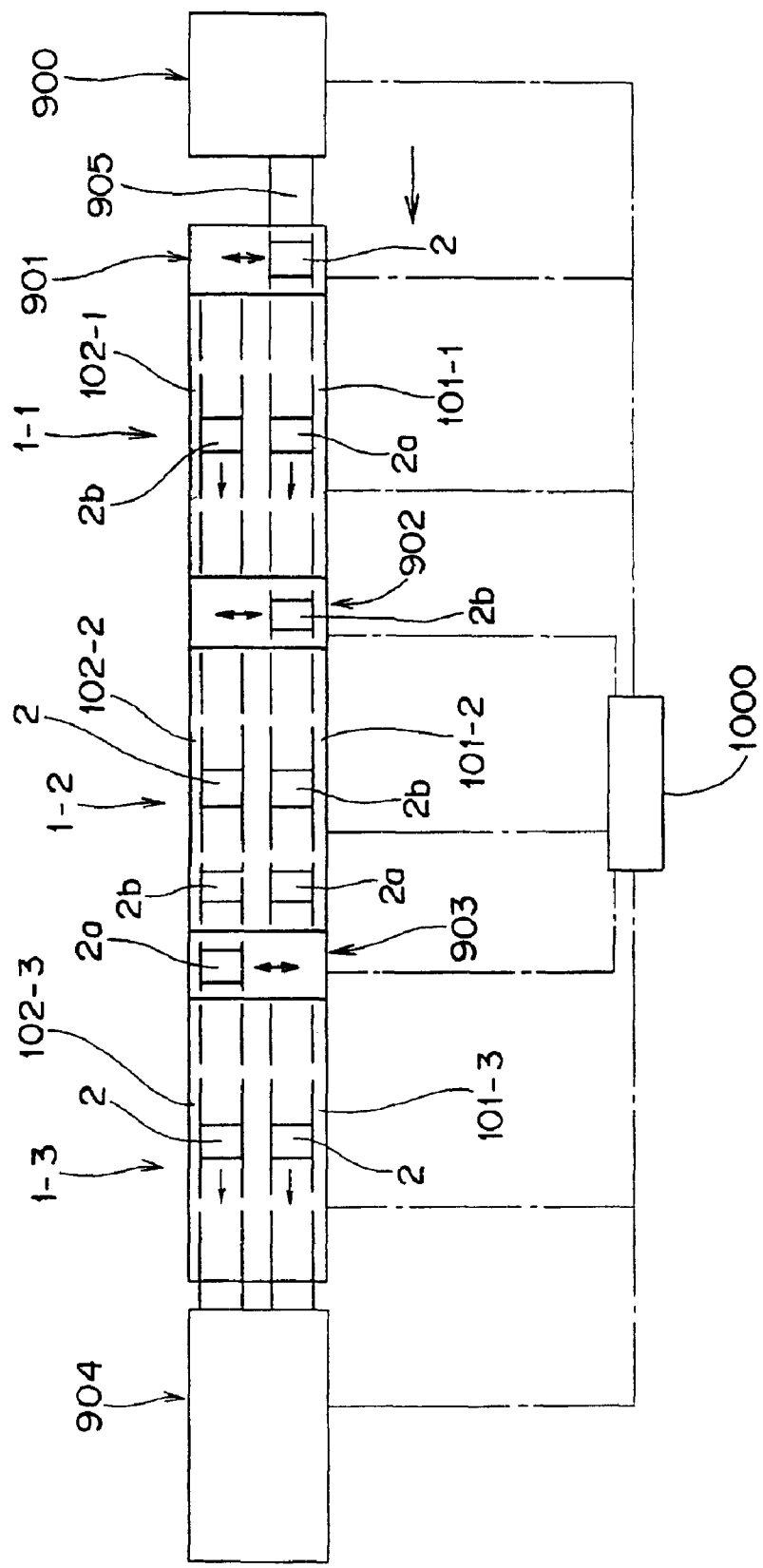
FIG. 8 is an explanatory view showing a component-mounted board producing system that has a solder paste printing device, three component mounting apparatuses of FIG. 1, and a reflow device.
Figure 9:
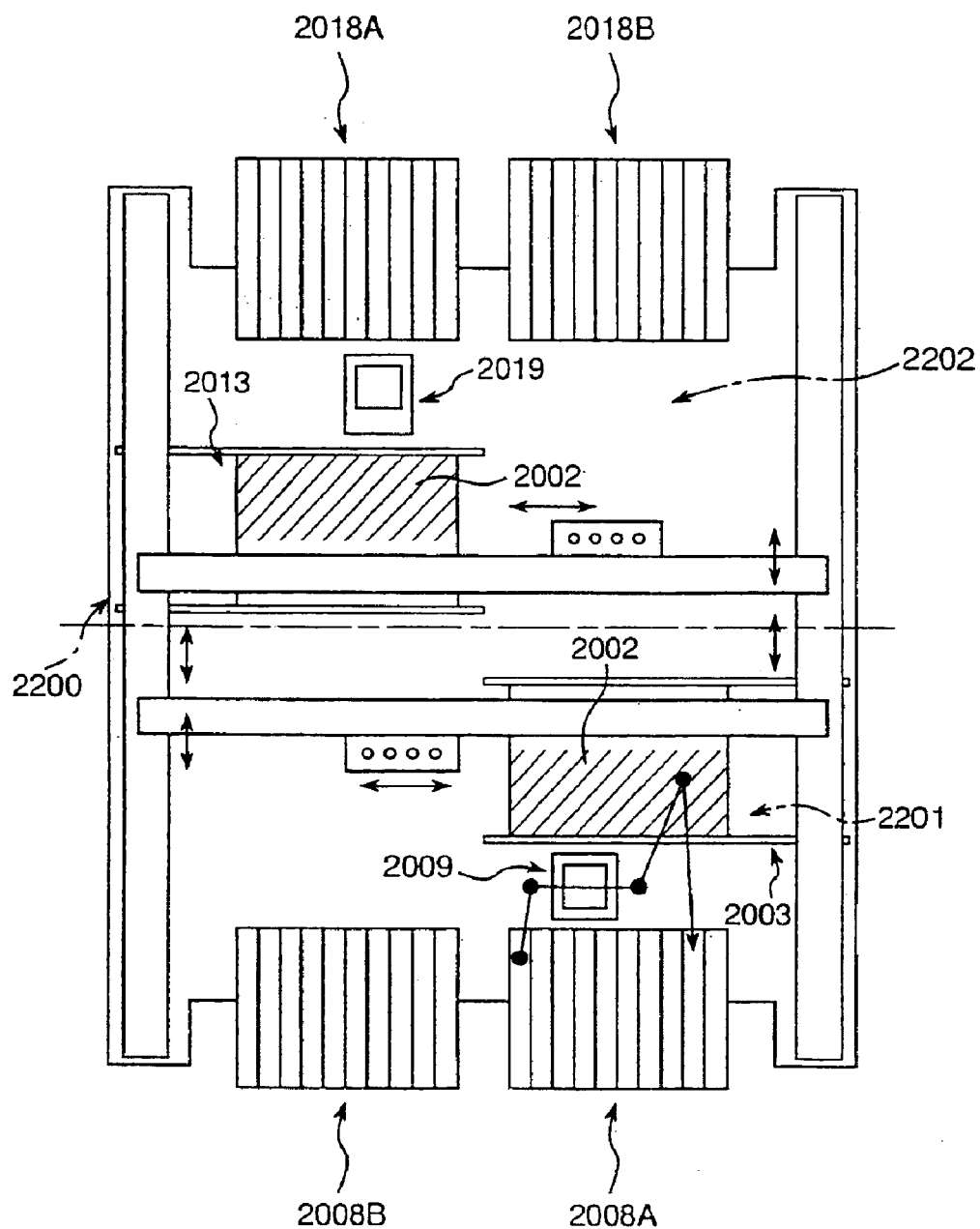
FIG. 9 is a schematic explanatory view of a component mounting apparatus that has already been proposed by the present applicant.

Moreover, it is possible to perform operations of component feed, holding, recognition and placement in the first mounting section 101 and operations of loading, positioning and unloading of the first board 2a, perform operations of component feed, holding, recognition and placement in the second mounting section 102 and operations of loading, positioning and unloading of the second board 2b independently of the operations in the first mounting section 101. Even when any one of the operations of component feed, holding, recognition and placement and the operations of loading, positioning and unloading of the board cannot be performed through some errors in either one of the first mounting section 101 and the second mounting section 102, it is also possible to perform the operations of component feed, holding, recognition and placement and the operations of loading, positioning and unloading of the board in the other mounting section. This will be described more specifically with reference to FIG. 8. FIG. 8 shows a component-mounted board producing system. Reference numeral 900 denotes a solder cream printing device for printing lands and the like in specified portions of a board with a solder cream, reference numerals 901, 902 and 903 denote board conveyance path changing units, reference numeral 904 denotes a reflow device for performing a reflow process, and reference numeral 905 denotes a board conveyance lane. Reference numerals 1-1, 1-2 and 1-3 denote the first, second and third component mounting apparatuses of the aforementioned embodiment, reference numerals 101-1, 101-2 and 101-3 denote the first mounting sections of the first, second and third component mounting apparatuses, and reference numerals 102-1, 102-2 and 102-3 denote the second mounting sections of the first, second and third component mounting apparatuses. Therefore, in this component-mounted board producing system, a board unloaded from the solder cream printing device 900 is normally properly distributed via the conveyance lane 905 into a first conveyance path (lower conveyance path in FIG. 8) and a second conveyance path (upper conveyance path in FIG. 8) by the conveyance path changing unit 901. Two boards 2a and 2b are loaded into the first component mounting apparatus 1-1, and a mounting operation is performed in each of the first mounting section 101-1 and the second mounting section 102-1. After termination of these mounting operations, the two boards 2a and 2b are loaded into the second component mounting apparatus 1-2 via the conveyance path changing unit 902. Then, a mounting operation is performed in each of the first mounting section 101-2 and the second mounting section 102-2. After termination of these mounting operations, the two boards 2a and 2b are loaded into the third component mounting apparatus 1-3 via the conveyance path changing unit 903. Then, a mounting operation is performed in the first mounting section 101-3 and the second mounting section 102-3. After termination of these mounting operations, the boards are loaded into the reflow device 904 so as to be subjected to a reflow process, and a component-mounted board is completed. These devices are operated under control of control unit 1000.

In a component-mounted board producing system as described above, if the mounting operation is stopped due to occurrence of a supply error, a holding error, a recognition error or a placement error in the first mounting section 101-1 of the first component mounting apparatus 1-1, then the mounting operation is continued or stopped in the second mounting section 101-2 of the first component mounting apparatus 1-1. When the mounting operation is continued, the board 2b is unloaded from the second mounting section 101-2 when the mounting operation of the board 2b ends, and a next board is loaded. At this time, it is properly performed to receive the board 2a to be mounted next in the first mounting section 101-1, make the board pass as it is without undergoing mounting in the second mounting section 101-2 and load the board into the conveyance path changing unit 902. Then, the board 2a located in the second conveyance path is moved to the first conveyance path side in the conveyance path changing unit 902 and thereafter loaded into the first mounting section 101-2 of the second component mounting apparatus 1-2, and the same mounting operation as the mounting operation that should properly have been performed in the first mounting section 101-1 of the first component mounting apparatus 1-1 is performed in the first mounting section 101-2. At this time, by supplying information necessary for the mounting operation, such as mounting operation data and an operation program for the first mounting section 101-1 of the first component mounting apparatus 1-1, to the second component mounting apparatus 1-2 by the control unit 1000, the same mounting operation can be performed without any trouble. It is to be noted that the first mounting section 101-1 of the first component mounting apparatus 1-1 and the first mounting section 101-2 of component mounting apparatus 1-2 are required to have fundamentally identical device constructions. With this arrangement, the mounting operation in the other mounting section can be performed without being influenced by various errors (for example, supply error, holding error, recognition error or placement error) in one mounting section, and constant productivity can be maintained even if the mounting operation in the other mounting section is stopped due to an error or the like.

Moreover, it is acceptable to provide a continuous mode in which, even when the mounting operation in either one mounting section of the first mounting section 101 and the second mounting section 102 cannot be performed, the mounting operation is continued in the other mounting section, and a stop mode in which the mounting operation is stopped in the other mounting section, and selectively use either one of the modes. By so doing, it is permitted to select an optimum mode by properly selecting the continuous mode and the stop mode according to the component mounting apparatus or the apparatus located adjacently on a downstream side of this apparatus. Even when the mounting operation in either one of the mounting sections cannot be performed, an optimum operation can be performed from a viewpoint of the overall production system that includes the aforementioned component mounting apparatus.

Moreover, it is acceptable to provide a first continuous mode in which, even when the mounting operation in either mounting section of the first mounting section 101 and the second mounting section 102 cannot be performed, the mounting operation of a board currently undergoing mounting is continued but a mounting operation of a next board is not performed, a second continuous mode in which a mounting operation of not only a board currently undergoing mounting but also a mounting operation of a next board are performed, and a stop mode in which a mounting operation is stopped in the other mounting section and selectively used is any one of the modes. By so doing, an optimum mode can be selected by properly selecting the first continuous mode, the second continuous mode or the stop mode, and an optimum operation can be performed from a viewpoint of the overall production system that includes the component mounting apparatus even when the mounting operation in either one of the mounting sections cannot be performed.

Moreover, it is acceptable to provide a component mounting system that has a third continuous mode in which, when a mounting operation in either mounting section of the first mounting section 101 and the second mounting section 102 cannot be performed in the first component mounting apparatus of two joined mounting apparatuses, a mounting operation is continued in the other mounting section, a fourth continuous mode in which the mounting operation is continued not in the other mounting section of the first component mounting apparatus but in either mounting section of the first mounting section 101 and the second mounting section 102 of the second apparatus, and a stop mode in which a mounting operation is stopped in the other mounting section of the first component mounting apparatus and selectively used is any one of the modes. With this arrangement, an optimum mode can be selected by properly selecting the third continuous mode, the fourth continuous mode or the stop mode. Even when the mounting operation in either one of the mounting sections of the first component mounting apparatus cannot be performed, an optimum operation can be performed from a viewpoint of the overall production system that includes the two component mounting apparatuses by making either mounting section of the other mounting section, i.e. the first component mounting apparatus and the mounting section of the second component mounting apparatus, perform a substitute mounting operation.

Moreover, teaching information of a reference position in a board placement position of the first mounting section 101 (for example, teaching information of a reference position obtained by abutting a corner portion of a board against a positioning portion of the placement-position determining conveyance unit) and so on can be used as teaching information of the reference position of the board in the second mounting section 102. With this arrangement, work for making each mounting section perform a teaching operation can be eliminated.

Moreover, it is possible to selectively use a synchronous mode in which a conveyance operation of the first board 2a of the first mounting section 101 and a conveyance operation of the second board 2b of the second mounting section 102 are synchronized with each other, and an asynchronous mode in which a conveyance operation of the first board 2a of the first mounting section 101 and a conveyance operation of the second board 2b of the second mounting section 102 are not synchronized with each other. By so doing, a mounting operation can be performed by selecting an optimum mode from among the synchronous mode and the asynchronous mode according to a type of the board, mounting operation and so on, and mounting process time can be improved still further. In particular, when the synchronous mode is selected during a mounting operation of boards of an identical model, mounting operations in both mounting sections start concurrently and end concurrently, and therefore, mounting process time can be further improved.

Moreover, the component mounting apparatus is arranged just before the reflow furnace, and the first board 2a and the second board 2b can also be unloaded synchronously from the first mounting section 101 and the second mounting section 102 when mounted boards are unloaded to a reflow process in the reflow furnace. By so doing, the reflow process can be concurrently performed by concurrently loading the first board 2a and the second board 2b into the reflow furnace, so that the reflow process can be efficiently performed in comparison with a case where a reflow process is performed by loading the first board 2a and the second board 2b into the reflow furnace in accordance with varied timing.

Moreover, as shown in FIG. 3, by providing the unloaders 1A and 11A, the placement-position determining conveyance units 1B and 11B and the unloaders 1C and 11C with a board positioning stopper 32 and a board arrival detection sensor (not shown) at both front and rear ends in the board conveyance direction, the boards 2a and 2b can be positioned either at the front end or the rear end in the board conveyance direction. Therefore, the pre-placement standby positions FA and SA, the placement positions FB and SB and the post-placement standby positions FC and SC for positioning the boards 2a and 2b in the component mounting work areas 201 and 202 can be arbitrarily determined on the basis of information of sizes of the boards 2a and 2b, a state of distribution of positions in which components are to be mounted, a state of distribution of the positions in which components are sucked and held after received from a component feeding device and so on.

When a tray type component feeding unit is arranged in place of the first component feeding unit 8A or 8B or the second component feeding unit 18A or 18B, it is acceptable to provide an automatic tray replacing unit to automatically replace the tray type component feeding unit. By so doing, a mounting operation is not stopped by shortage of components of the component feeding device or the like during component mounting, and component feed is continuously performed. In addition, performances during actual production, such as a fast mounting speed, i.e., real production capacity can be improved.

Moreover, if constituent elements of the component mounting apparatuses, such as the component feeding units, their automatic replacing units, the recognition devices, the loaders, the placement-position determining conveyance units and the unloaders, are each formed into a module, then the component mounting apparatus can be developed by properly replacing the elements according to improvement of the mounting apparatus in the future. That is, the component mounting apparatus can be developed only by replacing the module of each constituent element on the basis of the fundamental elements. Moreover, if the constituent elements are formed into modules as described above, it is possible to cope with a change of types of the boards and components only by properly replacing the module of each constituent element even at a time of changing the types of the boards and components, and productivity per device installation area, i.e., areal productivity can also be improved.

Moreover, although the component mounting work area 200 of the aforementioned mounting apparatus is divided into the two parts of the first component mounting work area 201 and the second component mounting work area 202, the structure is not limited to division into two equal parts and may be divided into two parts at an arbitrary ratio.

(Second Embodiment)

A component mounting system and method of a second embodiment of the present invention will be described next with reference to FIG. 10 through FIG. 22.

Figure 10:
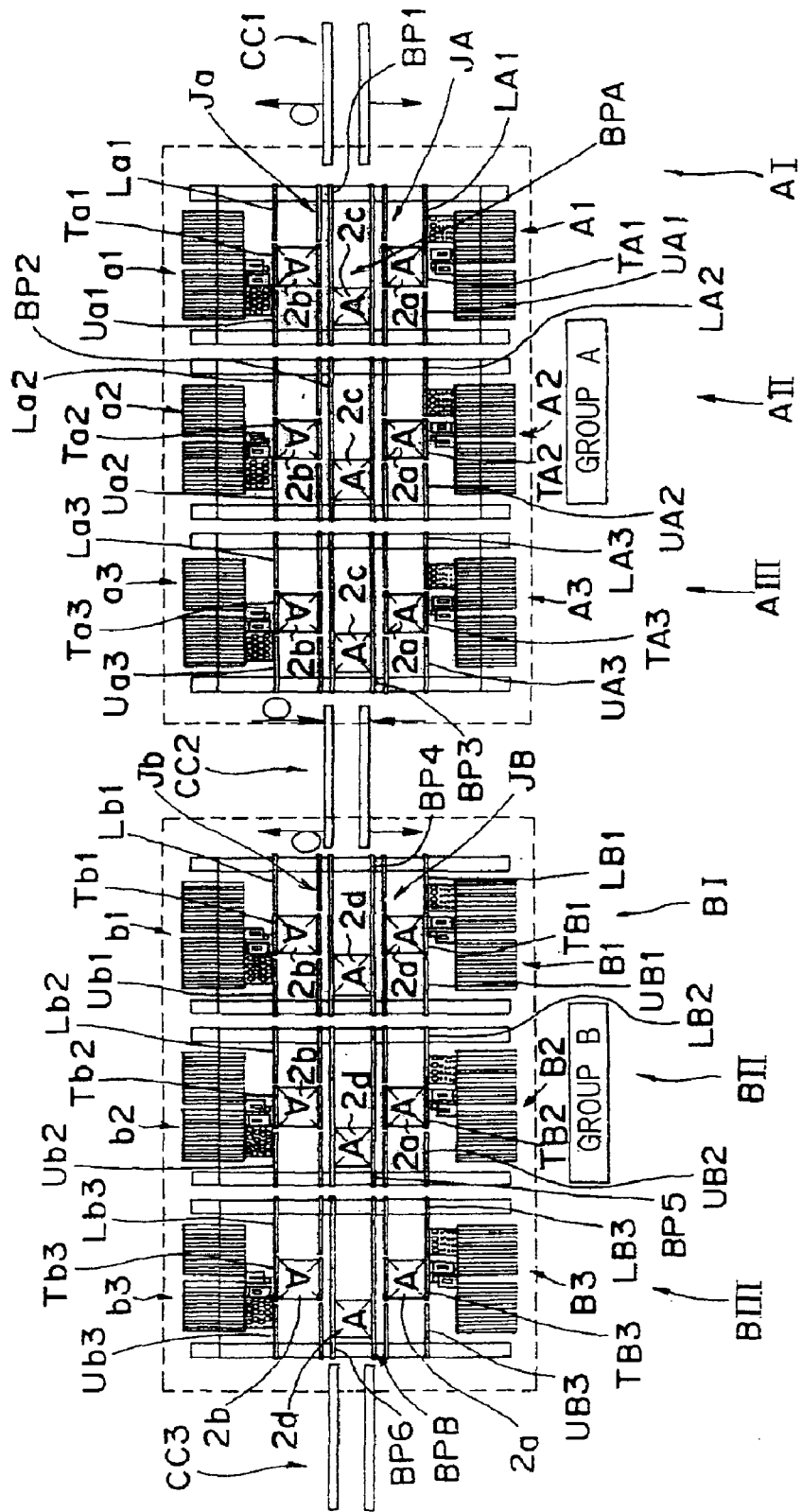
FIG. 10 is schematic plan view showing an electronic component-mounted board production line in which two mounting apparatus groups, each of which is composed of three component mounting apparatuses of FIG. 1 as one group are joined together and first, second, and third connective conveyance units are arranged on an upstream side and a downstream side of each of the mounting apparatus groups in a component mounting system according to a second embodiment of the present invention, wherein upward and downward arrows in the figure indicate directions of movement of the connective conveyance units.

According to this second embodiment, as shown in FIG. 10, a plurality of component mounting apparatuses according to the first embodiment are joined together to constitute an electronic component-mounted board production line, and a board (unmounted board or bare board) 2c to be mounted with components is efficiently loaded into each component mounting apparatus, and a mounted board 2d is unloaded. It is to be noted that this second embodiment is provided for handling a board that is unloaded from a printer and mounted with no electronic component However, the present invention is not limited to this and is allowed to be applied even in, for example, a case where an electronic component(s) is to be further mounted on a board on which electronic components have already been partially mounted in the course of a production line of the electronic component-mounted board. In the above case, the term "unmounted board" in the following description means a board on which electronic components have already been partially mounted.

In the component mounting system of the second embodiment shown in FIG. 10, three component mounting apparatuses of FIG. 1 according to the first embodiment are joined together to constitute one mounting apparatus group. Two mounting apparatus groups are joined together, and they are referred to as mounting apparatus group A and mounting apparatus group B. In three places of a place located on a pre-processing side of mounting apparatus group A, a place located on a post-processing side of the mounting apparatus group A and a pre-processing side of mounting apparatus group B, and a place located on a post-processing side of mounting apparatus group B are arranged first, second and third connective conveyance units CC1, CC2 and CC3 (corresponding to the conveyance path changing units 901, 902 and 903 of the first embodiment) which can be moved in a direction perpendicular to a direction in which board 2 is conveyed and is able to turn the board 2 at an angle of 180 degrees. As a result, an electronic component-mounted board production line is composed of mounting apparatus group A, mounting apparatus group B and the first, second and third connective conveyance units CC1, CC2 and CC3. Upward and downward arrows in FIG. 10 indicate directions of movement of each connective conveyance unit CC.

Figure 11:
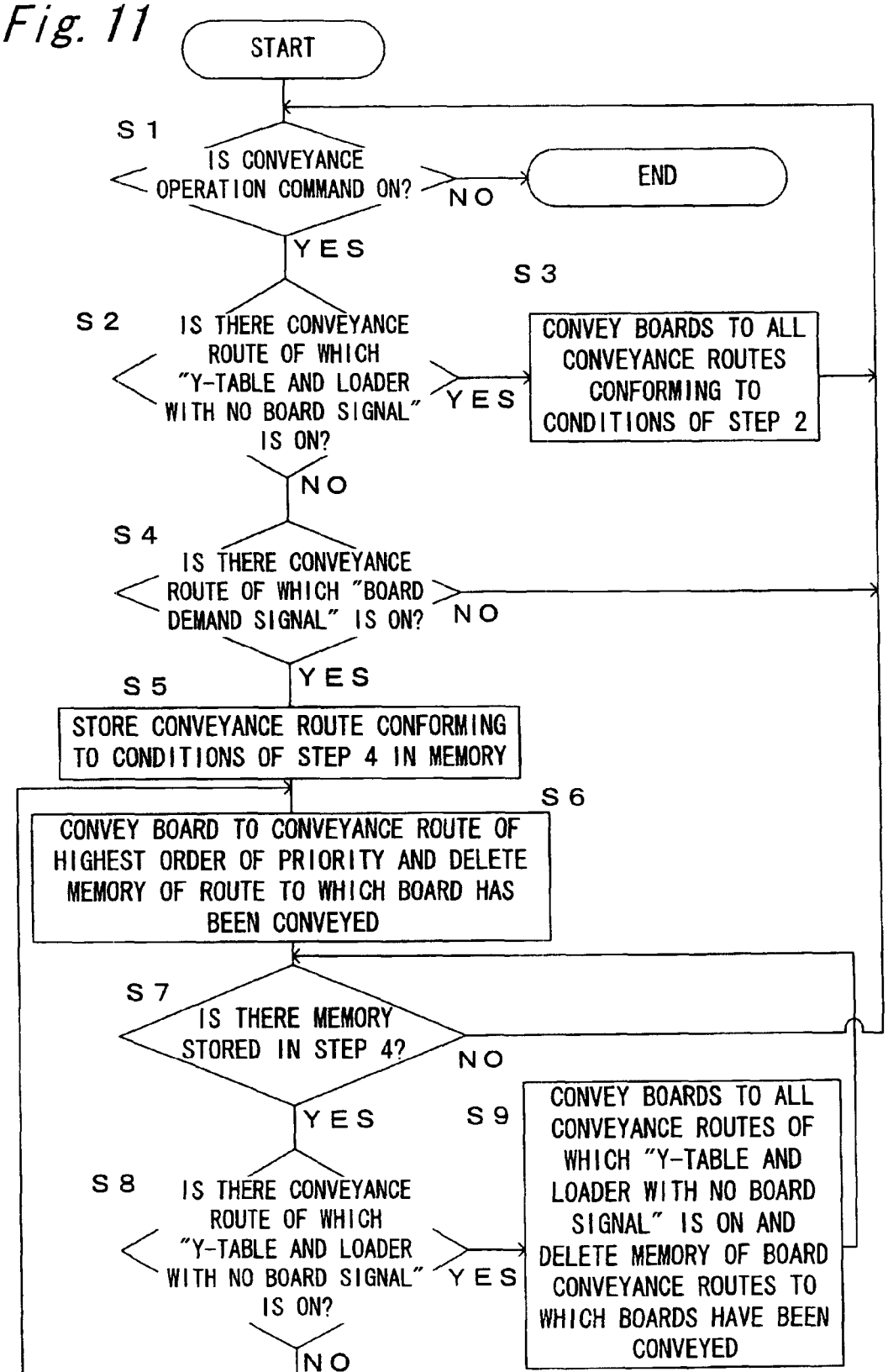
FIG. 11 is a view showing a flowchart of operation of the first connective conveyance unit of the component mounting system according to the second embodiment.
Figure 12:
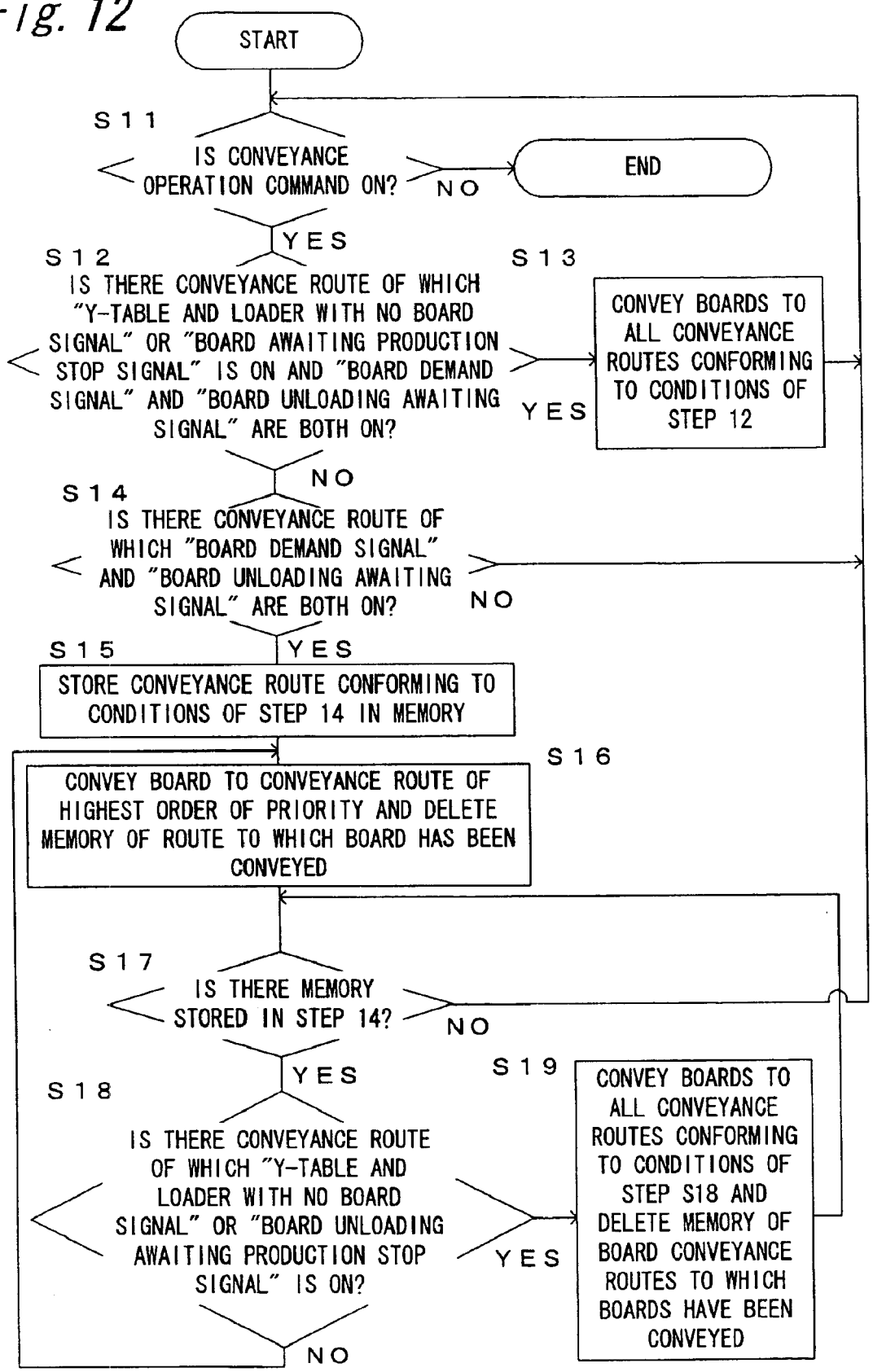
FIG. 12 is a view showing a flowchart of operation of the second connective conveyance unit of the component mounting system according to the second embodiment.

FIG. 11 is a flowchart showing operation of the first connective conveyance unit CC1 of the component mounting system of the second embodiment FIG. 12 is a flowchart showing operation of the second connective conveyance unit CC2 of the component mounting system of the second embodiment.

Figure 13:
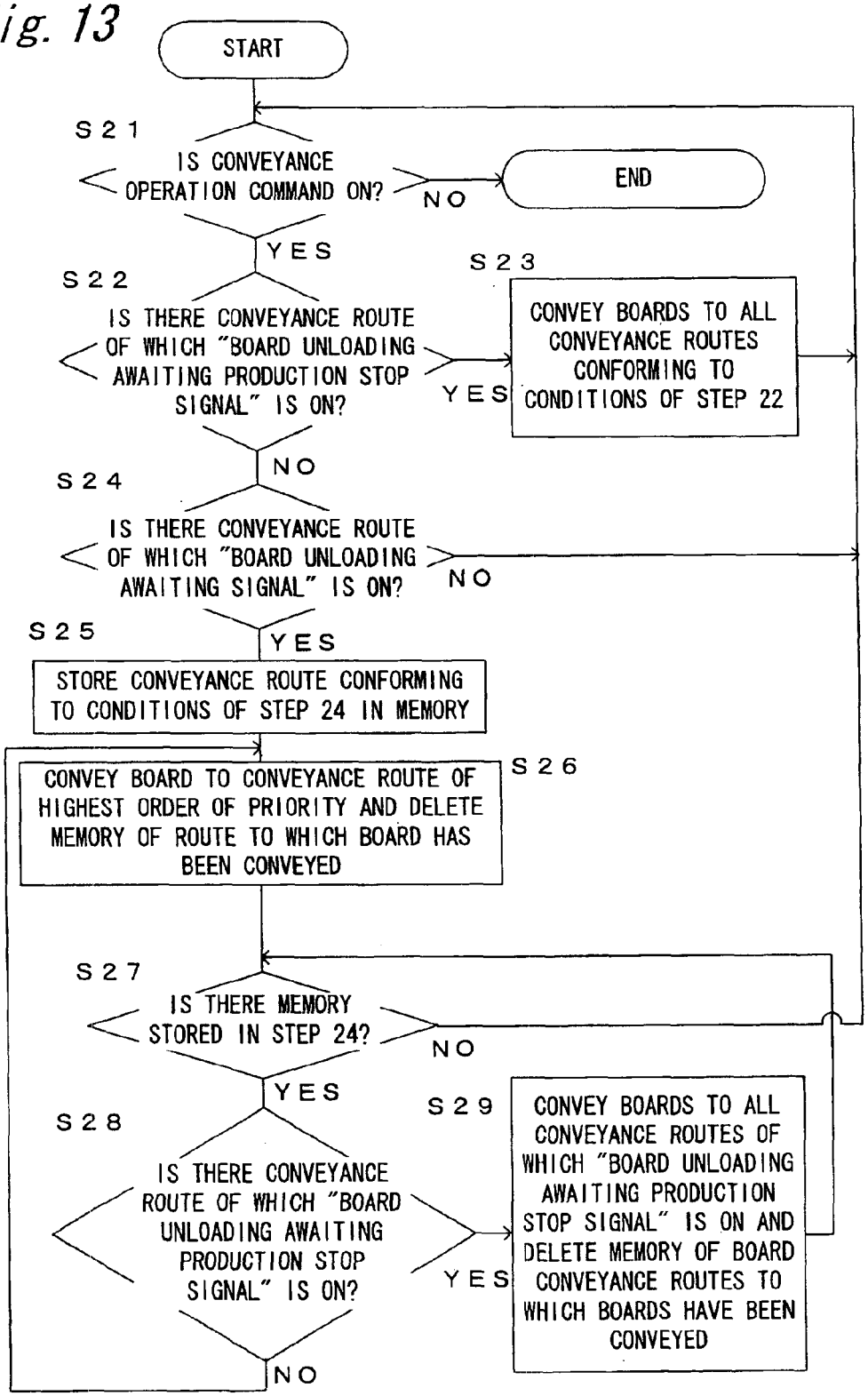
FIG. 13 is a view showing a flowchart of operation of the third connective conveyance unit of the component mounting system according to the second embodiment.

FIG. 13 is a flowchart showing operation of the third connective conveyance unit CC3 of the component mounting system of the second embodiment.

Figure 14:
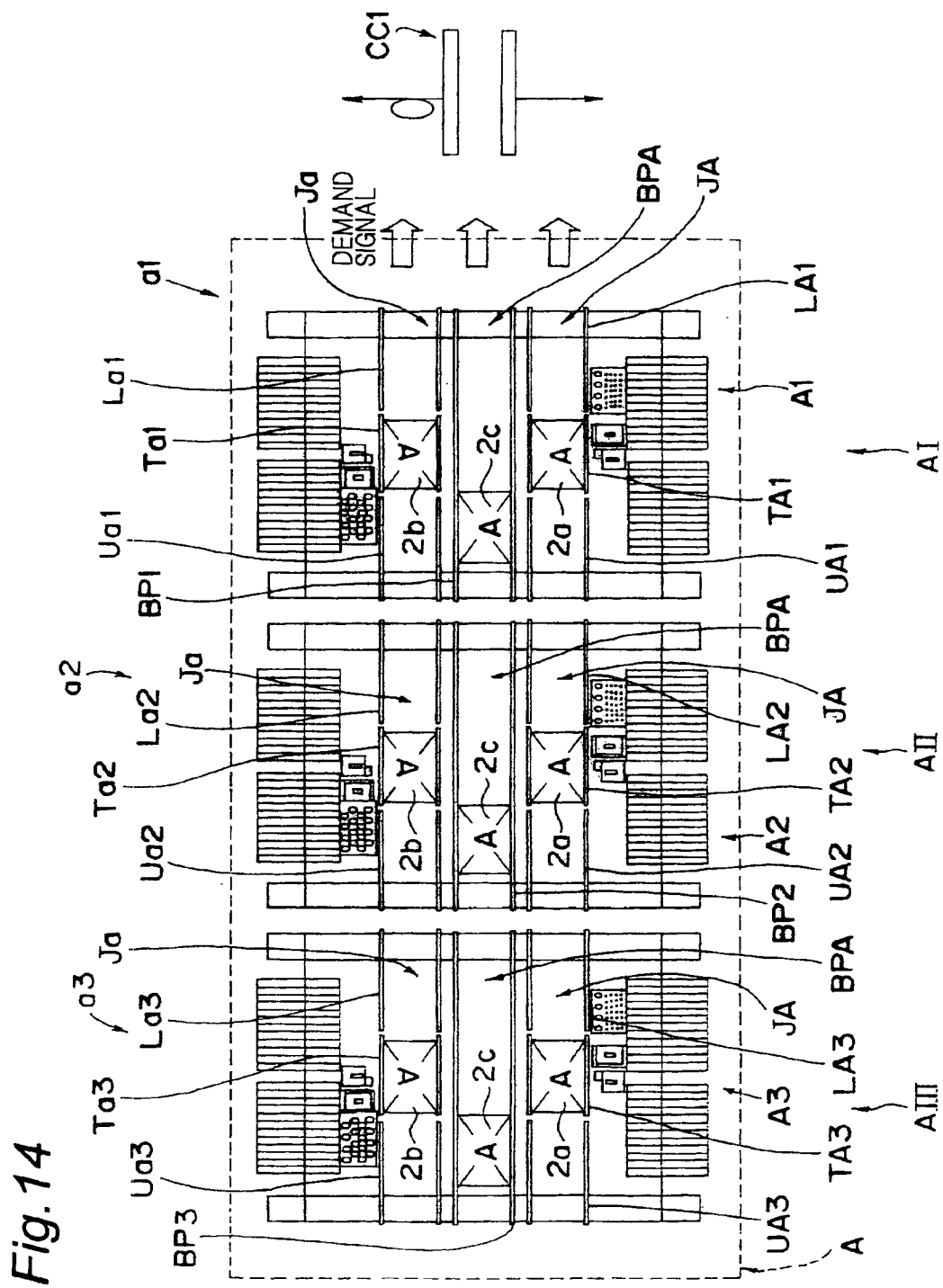
FIG. 14 is an enlarged schematic plan view showing mounting apparatus group A and the first connective conveyance unit located on the upstream side of FIG. 10, wherein upward and downward arrows in the figure indicate directions of movement of the connective conveyance unit.

FIG. 14 is an enlarged schematic plan view showing mounting apparatus group A and first connective conveyance unit CC1 located on an upstream side of the board conveyance direction of FIG. 10. The upward and downward arrows in this figure indicate directions of movement of the first connective conveyance unit CC1.

Figure 15:
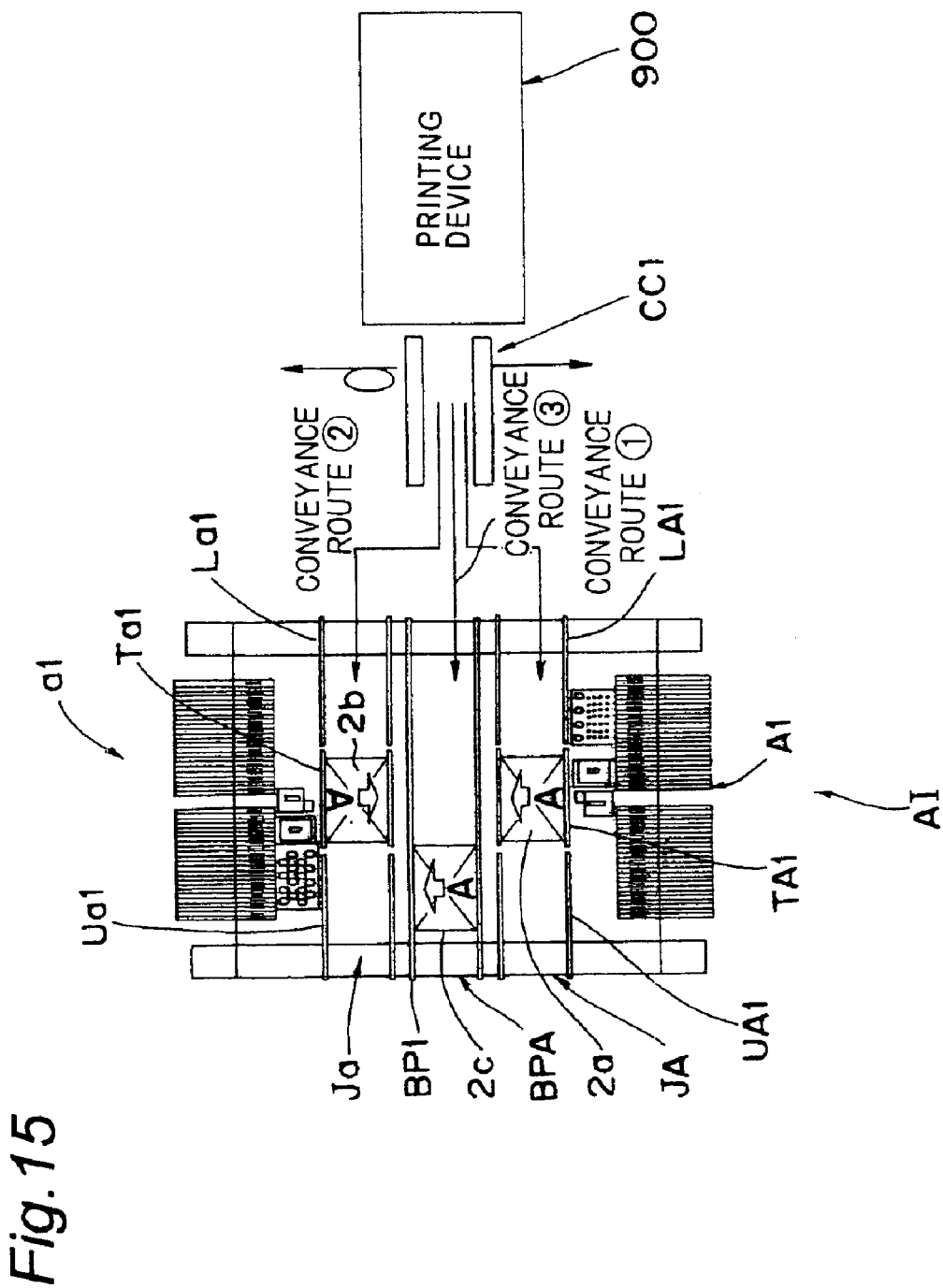
FIG. 15 is an enlarged schematic plan view showing an uppermost-stream-side component mounting apparatus in upstream-side mounting apparatus group A of FIG. 10, the first connective conveyance unit, and a printer located on its upstream side, wherein upward and downward arrows indicate directions of movement of the connective conveyance unit and sidewise arrows indicate a board conveyance direction.

FIG. 15 is an enlarged schematic plan view showing a component mounting apparatus AI located on an uppermost-stream side of mounting apparatus group A located on an upstream side, the first connective conveyance unit CC1, and a printer 900 located on an upstream side of the unit CC1 in the board conveyance direction of FIG. 10. The upward and downward arrows in this figure indicate directions of movement of the first connective conveyance unit CC1, and the sidewise arrows indicate the board conveyance direction.

Figure 16:
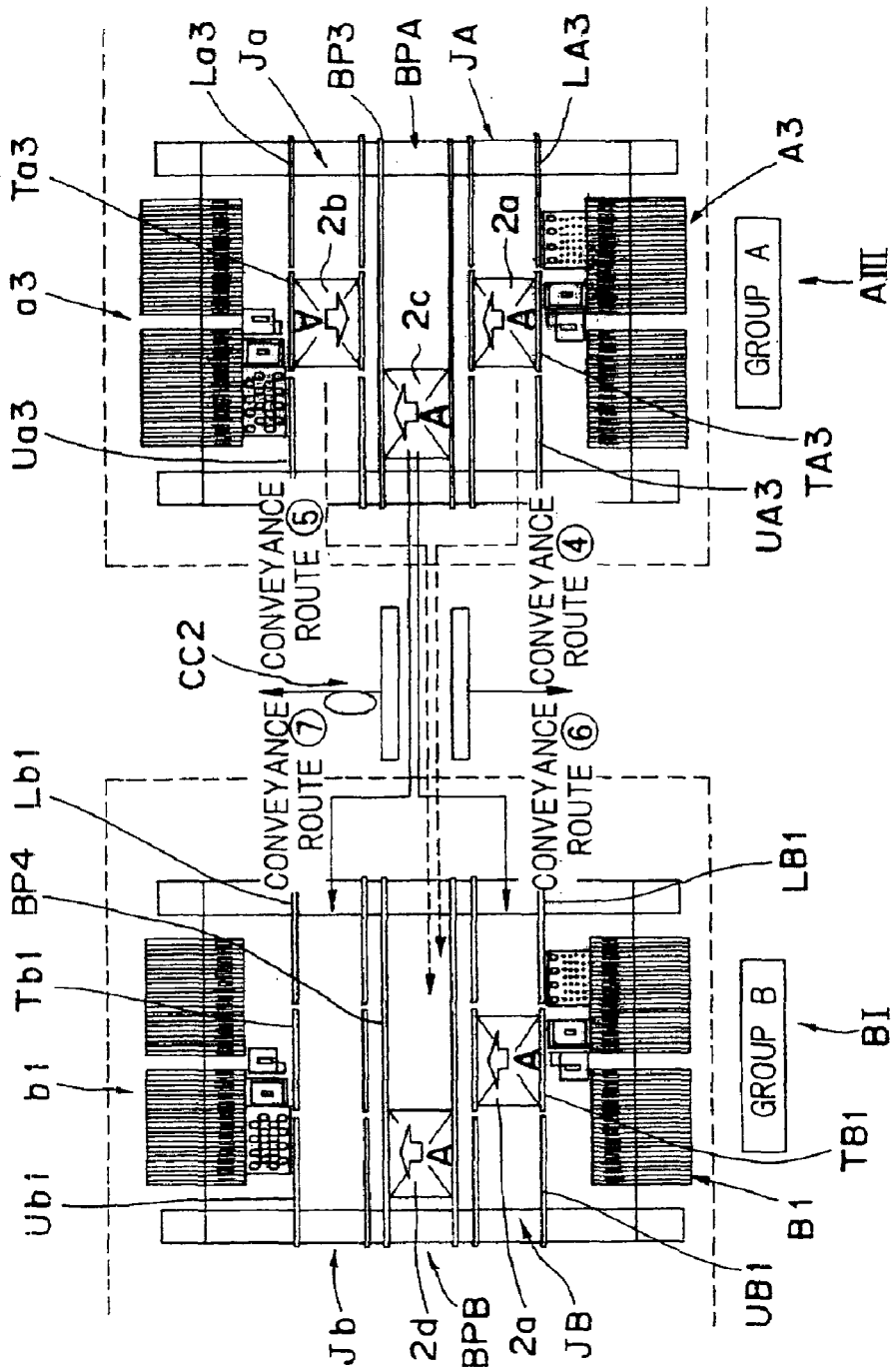
FIG. 16 is an enlarged schematic plan view showing a downmost-stream-side component mounting apparatus in upstream-side mounting apparatus group A of FIG. 10, the second connective conveyance unit, and an uppermost-stream-side component mounting apparatus in downstream-side mounting apparatus group B, wherein upward and downward arrows in the figure indicate directions of movement of the connective conveyance unit and sidewise arrows therein indicate a board conveyance direction.

FIG. 16 is an enlarged schematic plan view showing a component mounting apparatus AIII located on a downmost-stream side of mounting apparatus group A located on an upstream side, a second connective conveyance unit CC2, and a component mounting apparatus BI located on an uppermost-stream side of mounting apparatus group B located on a downstream side of the board conveyance direction of FIG. 10. The upward and downward arrows in this figure indicate directions of movement of the second connective conveyance unit CC2, and the sidewise arrows indicate the board conveyance direction.

Figure 17:
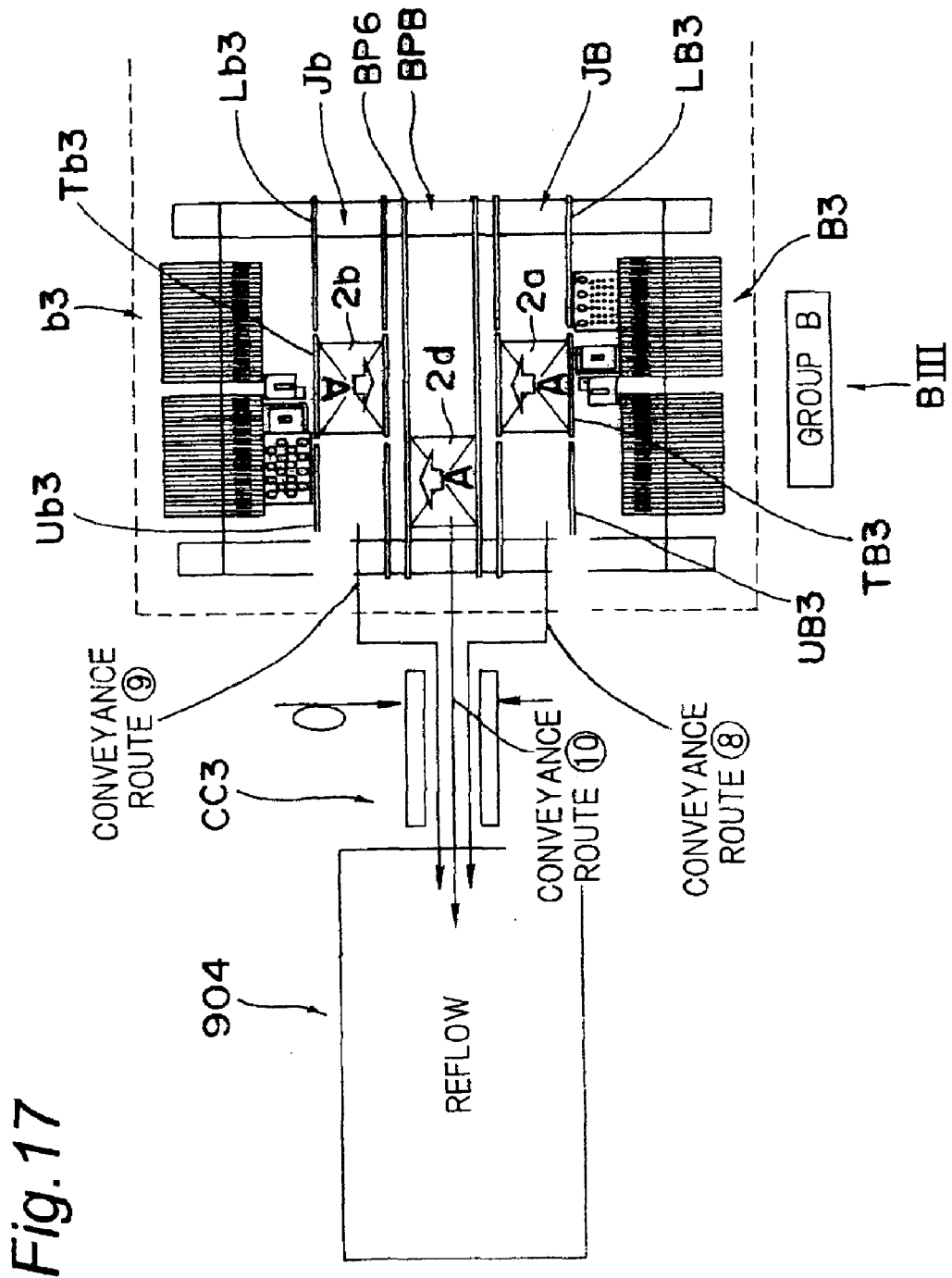
FIG. 17 is an enlarged schematic plan view showing a downmost-stream side component mounting apparatus in downstream-side mounting apparatus group B of FIG. 10, the third connective conveyance unit, and a reflow device on its downstream side, wherein upward and downward arrows in the figure indicate directions of movement of the connective conveyance unit and sidewise arrows therein indicate a board conveyance direction.

FIG. 17 is an enlarged schematic plan view showing a component mounting apparatus BIII located on a downmost-stream side of mounting apparatus group B located on a downstream side, a third connective conveyance unit CC3, and a reflow device 904 located on a downstream side of the unit CC3 in the board conveyance direction of FIG. 10. The upward and downward arrows in this figure indicate directions of movement of the third connective conveyance unit CC3, and the sidewise arrows indicate the board conveyance direction.

Figure 18:
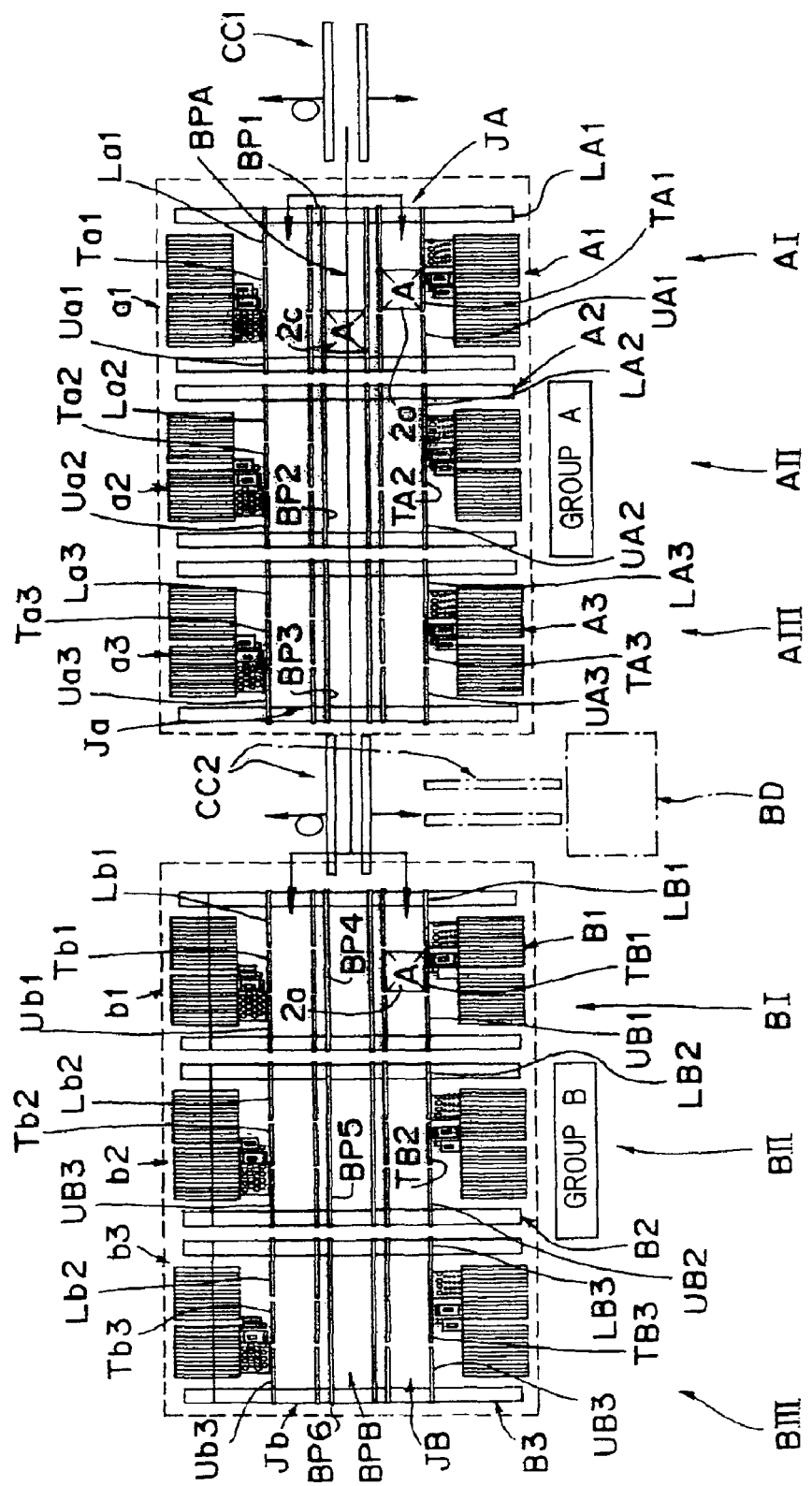
FIG. 18 is a schematic plan view showing the two mounting apparatus groups A and B and the first and second connective conveyance units in the component mounting system according to the second embodiment of FIG. 10, wherein upward and downward arrows in the figure indicate directions of movement of the connective conveyance units.

FIG. 18 is a schematic plan view showing mounting apparatus groups A and B and the first and second connective conveyance units CC1 and CC2 in the component mounting system of the second embodiment of FIG. 10. The upward and downward arrows in this FIG. indicate directions of movement of the first and second connective conveyance units CC1 and CC2, and the sidewise arrows indicate the board conveyance direction.

Figure 19:
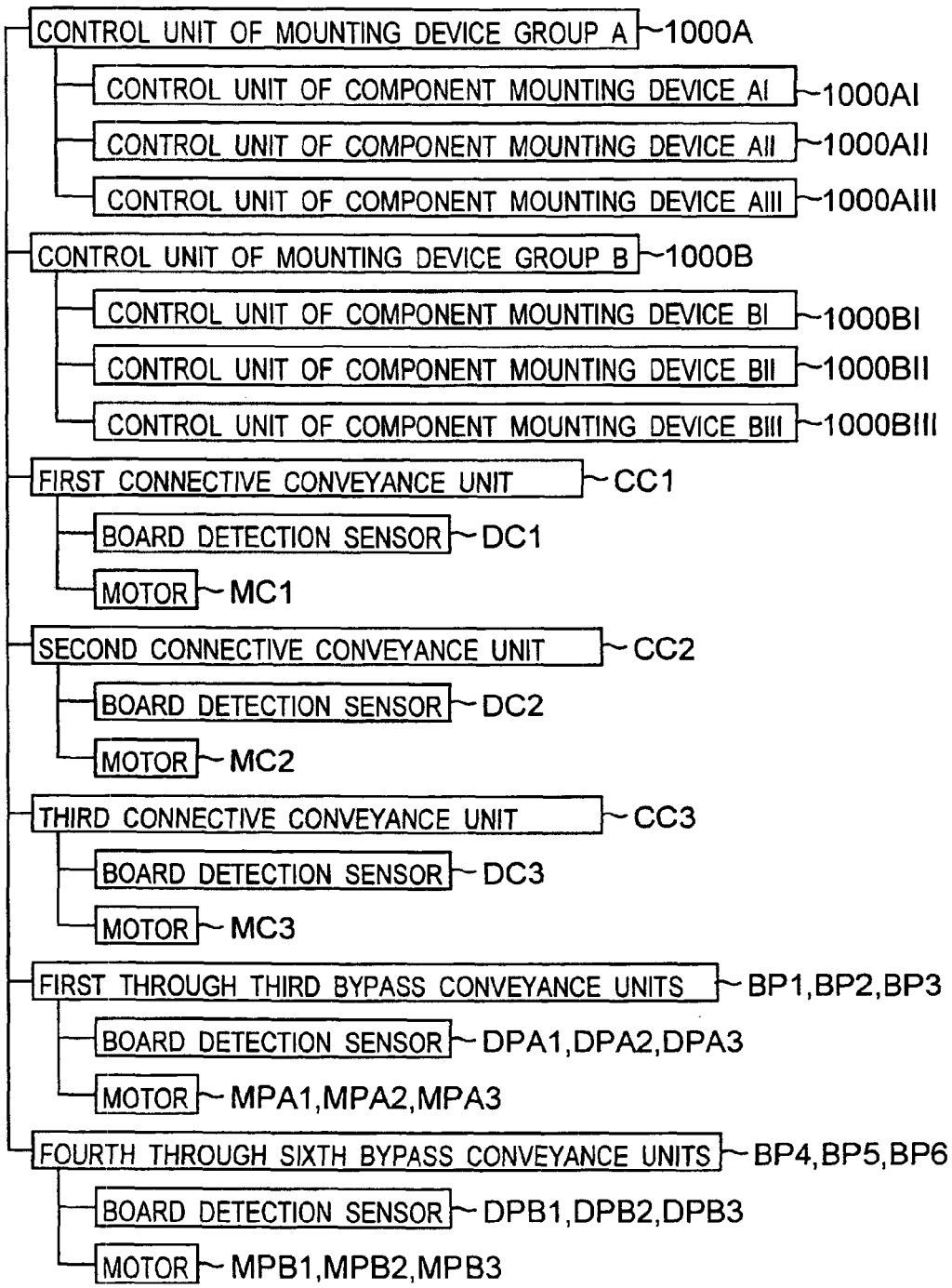
FIG. 19 is a block diagram showing structure of a control section of the electronic component-mounted board production line of the component mounting system according to the second embodiment.

FIG. 19 is a block diagram showing structure of a control section of the electronic component-mounted board production line of the component mounting system of the second embodiment.

Figure 20:
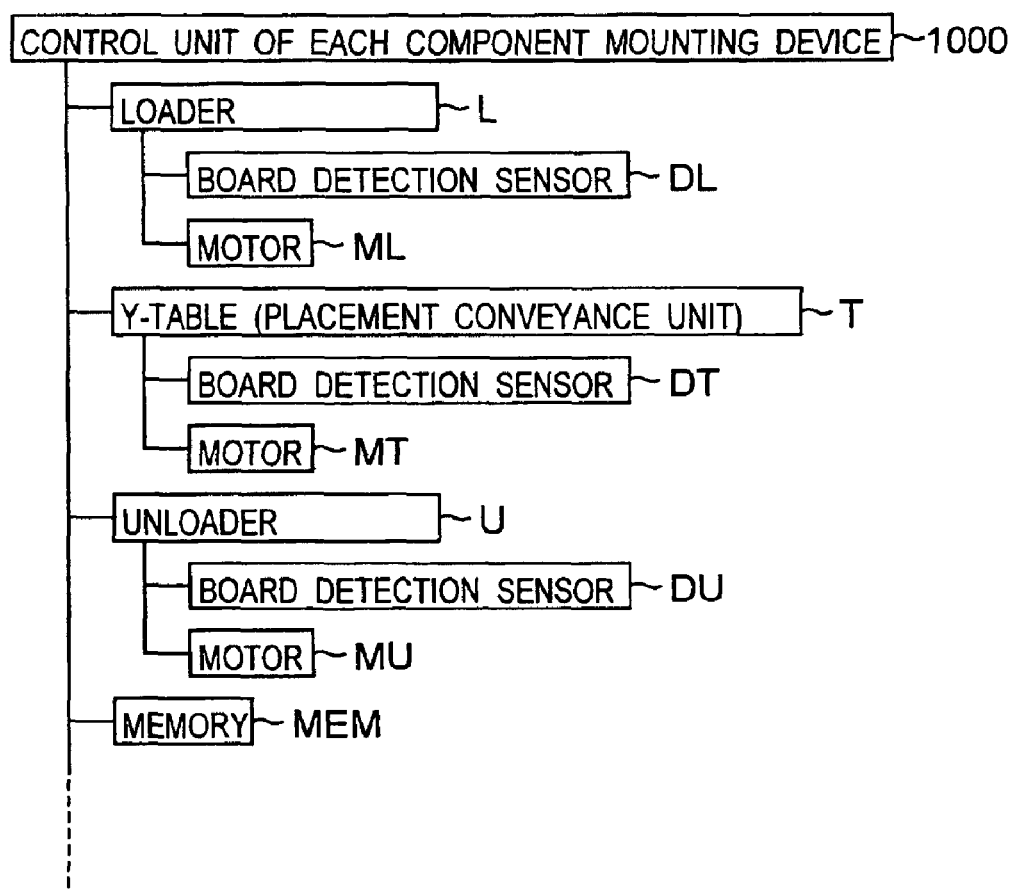
FIG. 20 is a block diagram partially showing a unique portion of the component mounting system of the second embodiment in a control unit of each component mounting apparatus in the electronic component-mounted board production line of the component mounting system according to the second embodiment.

FIG. 20 is a block diagram partially showing a peculiar portion of the component mounting system of the second embodiment in the control unit 1000 of each component mounting apparatus in the electronic component-mounted board production line of the component mounting system of the second embodiment.

Figure 21:
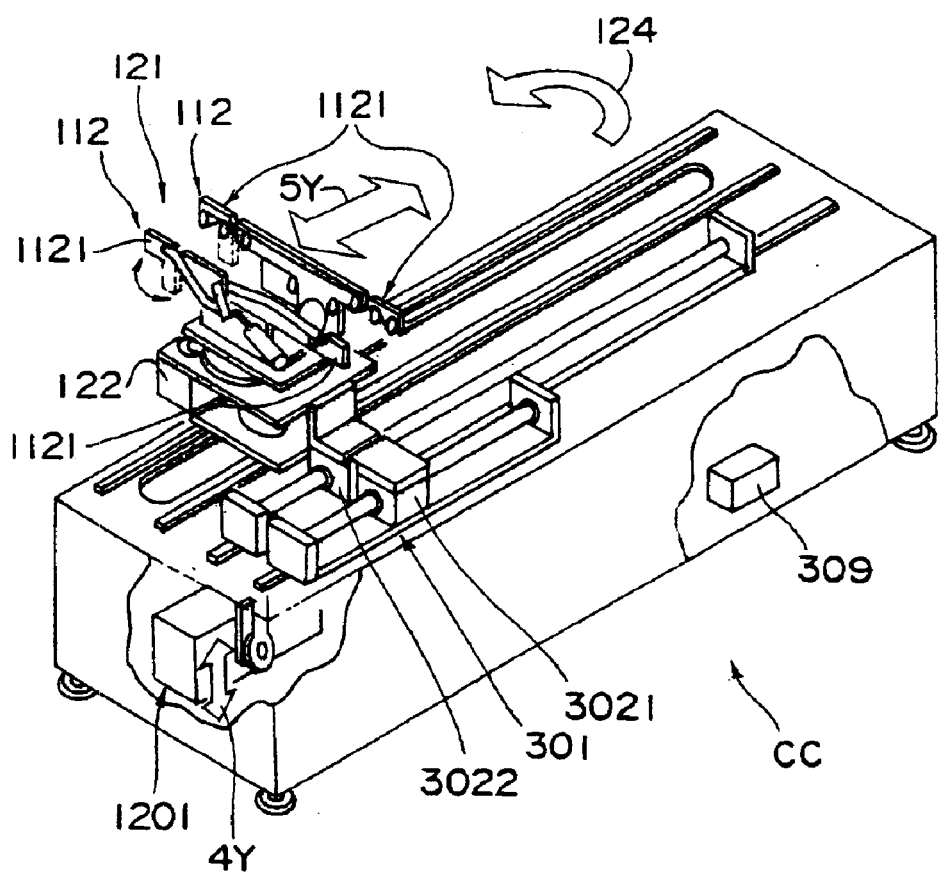
FIG. 21 is a perspective view showing a board conveying device which is an example of the connective conveyance unit of the electronic component-mounted board production line of the component mounting system according to the second embodiment.

FIG. 21 is a perspective view showing an example of each connective conveyance unit CC of the electronic component-mounted board production line of the component mounting system of the second embodiment.

Figure 22:
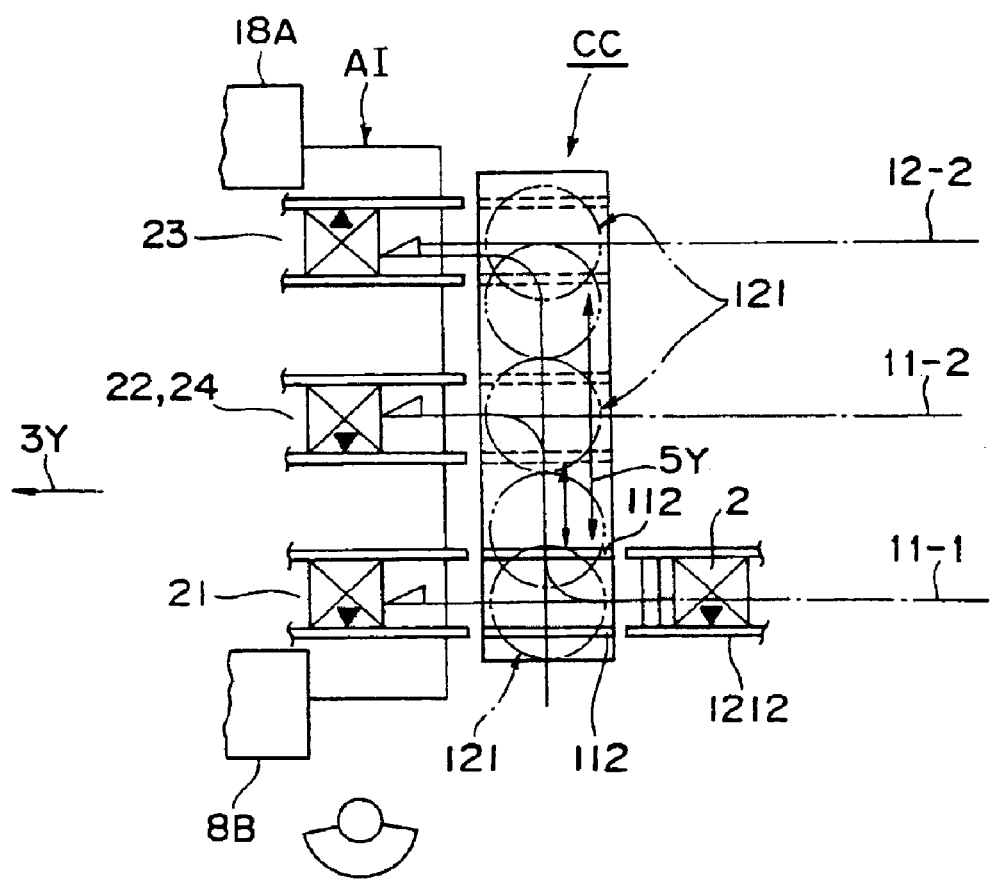
FIG. 22 is a plan view of the board conveying device which is an example of the connective conveyance unit of FIG. 21.

FIG. 22 is a plan view of the connective conveyance unit CC of FIG. 21.

Among the three component mounting apparatuses AI, AII and AIII of mounting apparatus group A of the component mounting system, front-side mounting sections A1, A2 and A3 (each corresponding to the first mounting section 101 of FIG. 1) are arranged on a front side of FIG. 10, and rear-side mounting sections a1, a2 and a3 (each corresponding to the second mounting section 102 of FIG. 1) are arranged on a rear side. The front-side mounting section A1 and the rear-side mounting section a1 constitute component mounting apparatus AI, the front-side mounting section A2 and the rear-side mounting section a2 constitute component mounting apparatus AII, and the front-side mounting section A3 and the rear-side mounting section a3 constitute component mounting apparatus AII. Likewise, among the three component mounting apparatuses BI, BII and BIII of the mounting apparatus group B, front-side mounting sections B1, B2 and B3 (each corresponding to the first mounting section 101 of FIG. 1) are arranged on the front side of FIG. 10, and rear-side mounting sections b1, b2 and b3 (each corresponding to the second mounting section 102 of FIG. 1) are arranged on the rear side. The front-side mounting section B1 and the rear-side mounting section b1 constitute component mounting apparatus BI, the front-side mounting section B2 and the rear-side mounting section b2 constitute component mounting apparatus BII, and the front-side mounting section B3 and the rear-side mounting section b3 constitute component mounting apparatus BIII. Similarly to the component mounting apparatus of FIG. 1, each mounting section is provided with a loader L (one example of the pre-placement conveyance unit, corresponding to the first loader 1A or the second loader 2A of the first embodiment), a Y-table T (one example of the placement conveyance unit, corresponding to the first placement-position determining conveyance unit 1B or the second placement-position determining conveyance unit 11B of the first embodiment) and an unloader U (one example of the post-placement conveyance unit, corresponding to the first unloader 1C or the second unloader 2C of the first embodiment). Moreover, a bypass lane BP (corresponding to the bypass conveyance unit 30 of the first embodiment) is provided in a middle portion of the front-side mounting section and the rear-side mounting section.

Moreover, a first mounting lane JA is composed of a loader LA1, a Y-table TA1, an unloader UA1, a loader LA2, a Y-table TA2, an unloader UA2, a loader LA3, a Y-table TA3 and an unloader UA3, which belong to a series of front-side mounting sections A1, A2 and A3 of mounting apparatus group A. A second mounting lane Ja is composed of a loader La1, a Y-table Ta1, an unloader Ua1, a loader La2, a Y-table Ta2, an unloader Ua2, a loader La3, a Y-table Ta3 and an unloader Ua3, which belong to a series of rear-side mounting sections a1, a2 and a3 of mounting apparatus group A. A first bypass lane BPA is composed of first through third bypass conveyance units BP1, BP2 and BP3 arranged in central portions of the three component mounting apparatuses AI, AII and AIII, respectively, of mounting apparatus group A.

Moreover, a first mounting lane JB is composed of a loader LB1, a Y-table TB1, an unloader UB1, a loader LB2, a Y-table TB2, an unloader UB2, a loader LB3, a Y-table TB3 and an unloader UB3, which belong to a series of front-side mounting sections B1, B2 and B3 of mounting apparatus group B. A second mounting lane Jb is composed of a loader Lb1, a Y-table Tb1, an unloader Ub1, a loader Lb2, a Y-table Tb2, an unloader Ub2, a loader Lab, a Y-table Tb3 and an unloader Ub3, which belong to a series of rear-side mounting sections b1, b2 and b3 of mounting apparatus group B. A second bypass lane BPB is composed of fourth through sixth bypass conveyance units BP4, BP5 and BP6 arranged in central portions of the three component mounting apparatuses BI, BII and BIII, respectively, of mounting apparatus group B.

If the bypass conveyance units BP, or at least the bypass conveyance unit BP located on a downstream side of the board conveyance direction, is composed of an upper-side bypass lane and a lower-side bypass lane arranged on a lower side of the upper-side bypass lane, then two bypass lanes can be secured even though an installation area is small, and space utilization efficiency can be increased. Moreover, in this case, it is acceptable to arrange each mounting lane on a roughly identical plane as that of, for example, the upper-side bypass lane, use the upper-side bypass lane specially as an unmounted board conveyance lane and use the lower-side bypass lane specially as a mounted board conveyance lane.

If the bypass conveyance units BP, or at least the bypass conveyance unit BP located on the downstream side, is composed of two bypass conveyance units juxtaposed right and left, then a plurality of bypass lanes can be more easily provided.

Each connective conveyance unit CC (CC1, CC2, CC3) receives one board 2 (2a, 2b, 2c, 2d) from one lane that is located adjacently to each connective conveyance unit CC and located on an upstream side of the board conveyance direction, and enables unloading of the board to one conveyance lane that is located adjacently to each connective conveyance unit CC and located on a downstream side of the board conveyance direction. Each connective conveyance unit CC has a structure roughly identical to that of the aforementioned loader L (LA1, LA2, LA3, La1, La2, La3, LB1, LB2, LB3, Lb1, Lb2, Lb3), the Y-table T (TA1, TA2, TA3, Ta1, Ta2, Ta3, TB1, TB2, TB3, Th1, Tb2, Tb3) and the unloader U (UA1, UA2, UA3, Ua1, Ua2, Ua3, UB1, UB2, UB3, Ub1, Ub2, Ub3) and has a structure roughly identical to that of the first and second loaders 1A and 2A, the first and second placement-position determining conveyance units 1B and 2B, the first and second unloaders 1C and 2C of the component mounting apparatus of the first embodiment. Each connective conveyance unit CC can be driven back and forth in the board conveyance direction by synchronizing a pair of belts by virtue of a drive device of one connective conveyance unit motor or two connective conveyance unit motors. Moreover, width adjustment can be performed according to a width of the board 2 by making a position of at least one belt movable with respect to the other belt according to the width of the board 2 to be conveyed on the basis of size data of the board 2 preparatorily stored in the memory MEM or a database 1001. More specifically, the adjustment can be performed by rotating a ball screw arranged in a widthwise direction by driving of a motor for width adjustment in the widthwise direction and moving a member for supporting one belt fixed to a nut portion meshed with the ball screw close to or apart from a member for supporting the other belt in the widthwise direction. If the motor for the width adjustment is a pulse motor, then the width adjustment can be performed by rotating the pulse motor by a number of pulses with an automatic widthwise shift pulse signal fed from the control unit 1000 or the like. This width adjustment operation is not performed when a board is detected by the board detection sensor DC of a corresponding connective conveyance unit CC, and is performed only when no board is detected.

FIG. 21 and FIG. 22 show one example of each connective conveyance unit CC. Details will be described later. A pair of conveyor rail portions 112 and 112 for loading and unloading the board 2 are placed on a turning device 121, and the turning device 121 is made rotatable to an angle of at least 180 degrees, preferably 360 degrees, by virtue of a rotation drive device 122 such as a rotary actuator. The turning device 121 is moved in a direction perpendicular to the board conveyance direction by a drive section, such as two air cylinders 3021 and 3022 of a later-described second moving unit 301, and enables conveyance of the board 2 held by the pair of conveyor rail portions 112 and 112 with respect to any one of the first mounting lane JA, the first bypass lane BPA and the second mounting lane Ja. The air cylinder 3021 enables the turning device 121 to be positioned in either one of the mounting lane JA and the bypass lane BPA, while the air cylinder 3022 enables the turning device 121 to be positioned in either one of the first mounting lane JA and the second mounting lane Ja. Moreover, when the first bypass lane BPA is composed of the two upper and lower bypass lanes, boards can be conveyed to their respective bypass lanes by moving up and down the turning device 121 by a drive device, such as a rotary actuator, of a first moving unit 1201. Reference numeral 309 denotes a control section of the connective conveyance unit CC, the control section receiving a variety of signals described in detail below, controlling a distributing or integrating operation on a basis of a received signal, and outputting a signal described in detail below. It is preferable to provide each conveyor rail portion 112 with a contraction rail 1121 at both its ends, or at least one end portion, so that a turning radius of the turning device 121 can be reduced as much as possible by bending or expansion and contraction.

As an example of the connective conveyance unit CC, a board conveying device for conveying circuit boards 2 to be fed to the electronic component mounting apparatus, more specifically, a board conveying device that performs distribution of circuit boards 2 for a plurality of board conveyance paths is described below in detail with reference to FIGS. 21 to 27. It is noted that like constituent members are designated by like reference numerals throughout the drawings.

FIG. 21 shows the board conveyance unit CC, and FIG. 22 is a plan view of a board conveying device which is an example of the connective conveyance unit of FIG. 21. This board conveying device operates for conveying a board 2 carried in from any one of a first conveyor position 11-1, a second conveyor position 11-2 and a third conveyor position 12-2, which are located on an upstream side, to any one of a first board-conveying conveyor portion 21, a second board-conveying conveyor portion 22, a third board-conveying conveyor portion 23 and a fourth board-conveying conveyor portion 24, which are located on a downstream side. It is noted that the first board-conveying conveyor portion 21, the third board-conveying conveyor portion 23 and the fourth board-conveying conveyor portion 24 that serves for use as a bypass lane are arranged at an equal height level, while the second board-conveying conveyor portion 22 is arranged for use as a second bypass lane above or below the fourth board-conveying conveyor portion 24, although the second board-conveying conveyor portion 22 may be omitted as in the foregoing embodiment.

The board conveyance unit CC is provided with a conveying and turning device 1101 (FIG. 23), a first moving unit 1201, a second moving unit 301 and a control section 309, wherein these units are integrally formed into one unit so as to execute functions of the board conveyance unit. Since devices of the conveying and turning device and the like are integrally formed into one unit, the board conveyance unit CC can be made quite compact in terms of its installation space as compared with a conventional connective conveyance unit including no rail contracting unit in a conveyance direction 3Y of the circuit board 2 as shown in FIG. 22. As a concrete example, whereas the conventional connective conveyance unit requires an installation space of about 1.8 m, the board conveyance unit CC of this embodiment requires only about 0.45 m. In the following description, the conveying and turning device 1101, the first moving unit 1201, the second moving unit 301 and the control section 309 are explained in detail.

First, the conveying and turning device 1101 is explained.

The conveying and turning device 1101 is provided with a holding and conveying device 111, a turning device 121 and a rail contracting unit 131, and performs conveyance of the circuit board 2 along the conveyance direction 3Y and turning of the circuit board 2, as well as contraction of rails.

Figure 24:
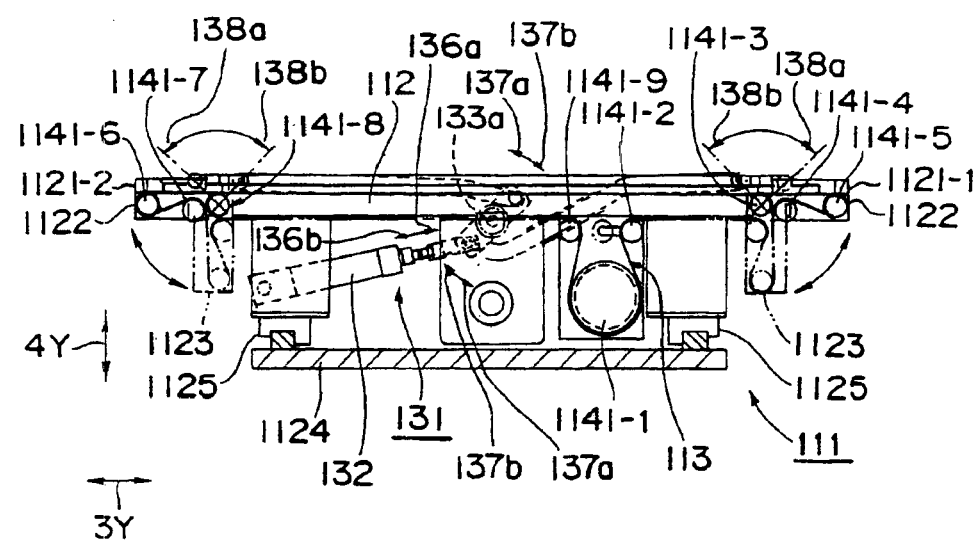
FIG. 24 is a sectional view of a holding and conveying device provided in the board conveying device shown in FIG. 21, as viewed at portion A—A of FIG. 25.
Figure 25:
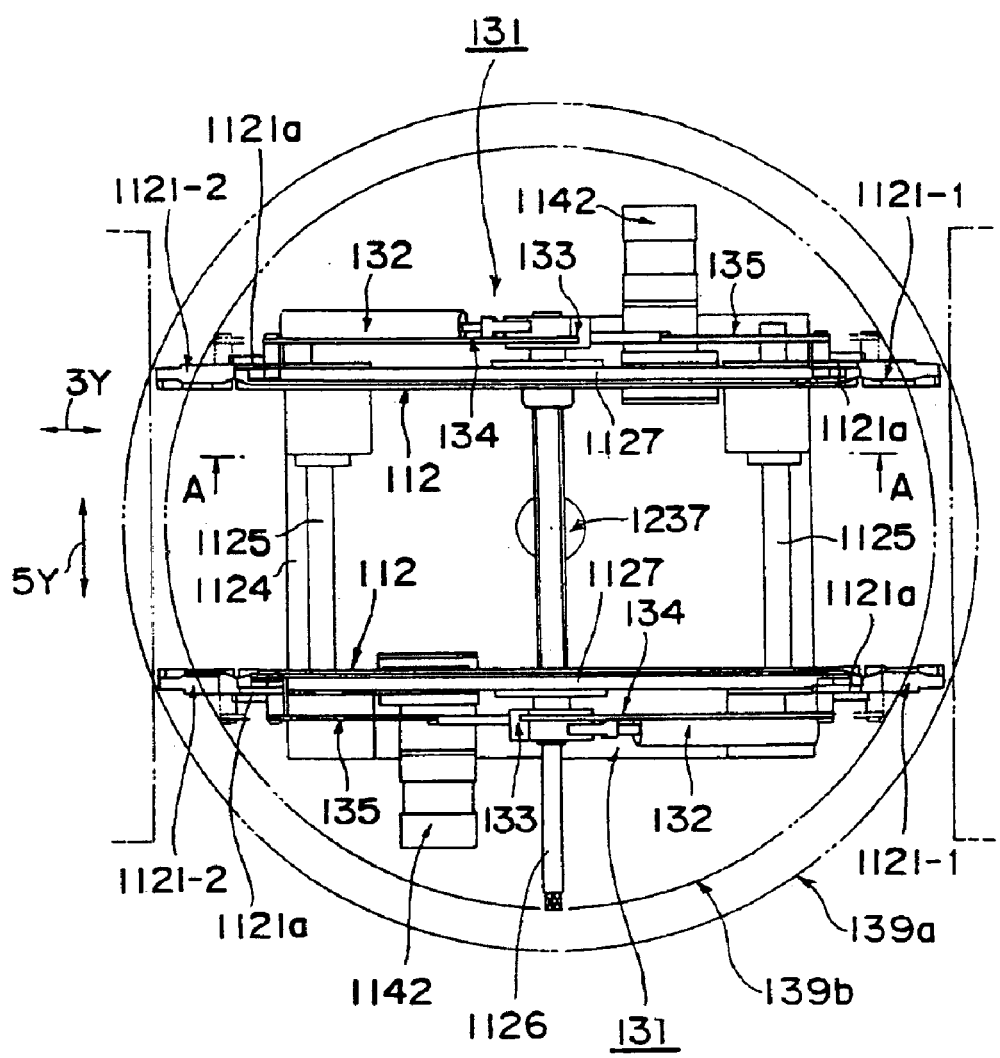
FIG. 25 is a plan view of the holding and conveying device shown in FIG. 24.

The holding and conveying device 111, which is a unit for holding and conveying the circuit board 2 toward the conveyance direction 3Y, has a pair of conveyor rail portions 112, conveyor belts 113, and a belt drive portion 114 for driving the conveyor belts 113 as shown in FIGS. 24 and 25. Each of the conveyor rail portions 112 has a rail member 1127 which extends along the conveyance direction 3Y so as to be able to support both-side end edge portions of the board 2 along the conveyance direction 3Y, and a contraction rail 1121 which is rotatably fitted to each rail member 1127 at both end portions of the rail member 1127 as detailed later, and which is moved between a conveyance position 1122 and a bending position 1123 by the rail contracting unit 131. Each conveyor rail portion 112 is provided on a base plate 1124. Moreover, in order that a width between the conveyor rail portions 112 extending along a direction 5Y, orthogonal to the conveyance direction 3Y and to a thicknesswise direction 4Y of the circuit board 2 to be conveyed, can be adjusted according to the width of the circuit board 2 to be conveyed, the conveyor rail portion 112 shown on an upper side in FIG. 25 can be moved along a pair of sliders 1125, which are laid on the base plate 1124 along the orthogonal direction SY by rotating a rotational screw 1126 in its circumferential direction.

The conveyor belts 113 are belts which extend along the conveyor rail portions 112 and which support the circuit board 2 with both-side end edge portions of the circuit board 2 placed thereon, and convey the circuit board 2 toward the conveyance direction 3Y. The belt drive portion 114 is provided with, in this embodiment, a motor 1142 for driving the conveyor belts 113, as well as a pulley 1141-1, a belt-tension pulley 1141-2 and conveyance pulleys 1141-3 to 1141-9 mounted on an output shaft of the motor 1142, as shown in FIG. 24. The conveyor belts 113 are wound around the pulleys 1141-1 to 1141-9 as shown in this figure, and move in a sequence of pulley 1141-1 to 1141-9 to pulley 1141-1 so as to move the circuit board 2 toward the conveyance direction 3Y.

In addition, the conveyor belts 113, the belt drive portion 114 and the pulleys 1141-2 to 1141-9 are provided in each of the conveyor rail portions 112.

With the holding and conveying device 111 constructed as described above, the circuit board 2 is conveyed toward the conveyance direction 3Y by drive of the motor 1142 with both-side end edge portions of the circuit board 2 supported on the conveyor belts 113 provided in the conveyor rail portions 112, respectively.

Figure 23:
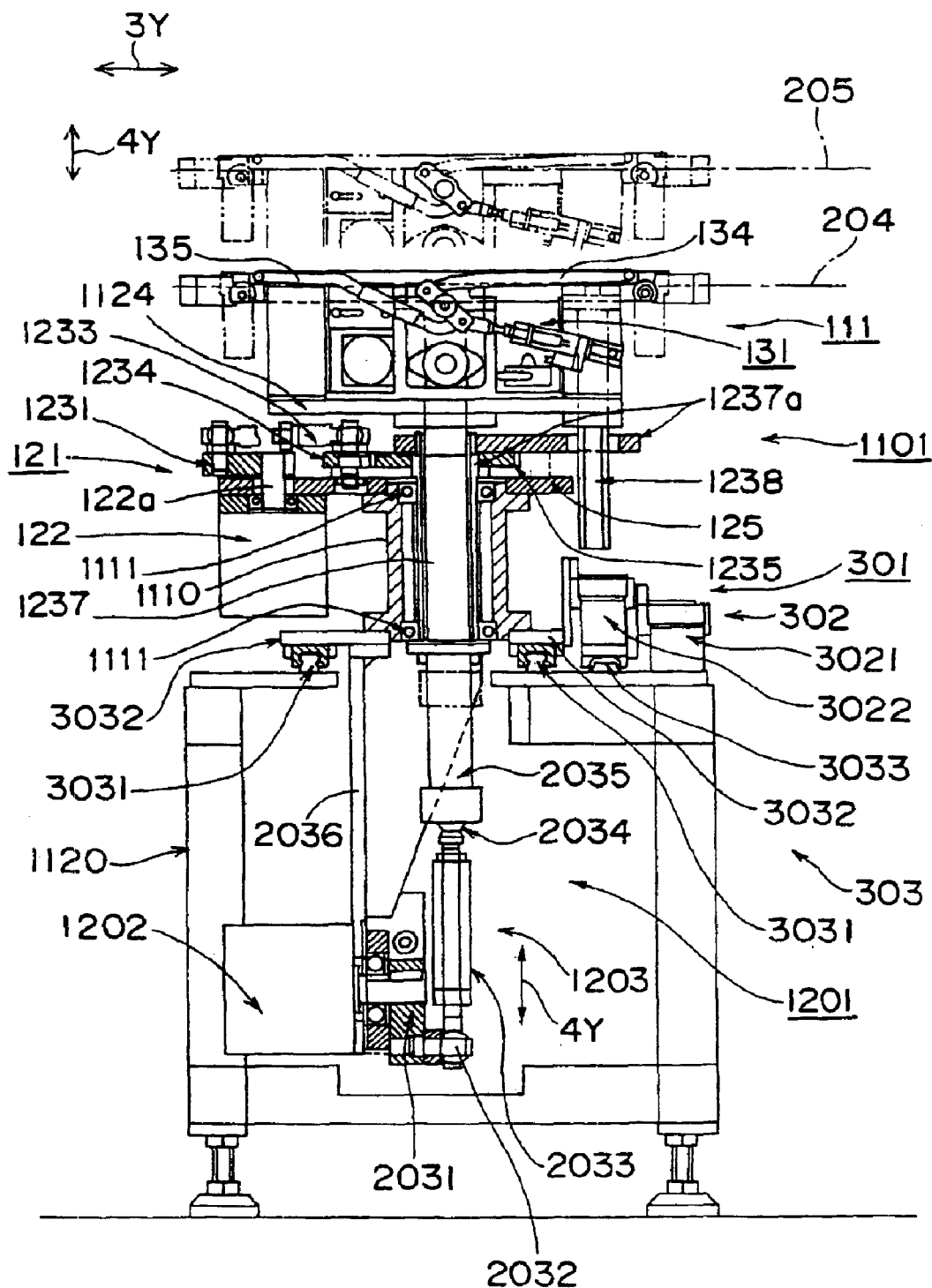
FIG. 23 is a sectional view of the board conveying device which is an example of the connective conveyance unit shown in FIG. 21.

The turning device 121 is a unit for turning the holding and conveying device 111 about rotating shaft 1237 in a direction 124 around an axis of the rotating shaft 1237, which extends along a thicknesswise direction 4Y of the circuit board 2, as shown in FIG. 23. The turning device 121 is equipped with a rotary actuator 122 as a turn driving source, and a turning mechanism 123 which is driven by the rotary actuator 122 to turn the holding and conveying device 111. The turning mechanism 123 is explained below.

Figure 26:
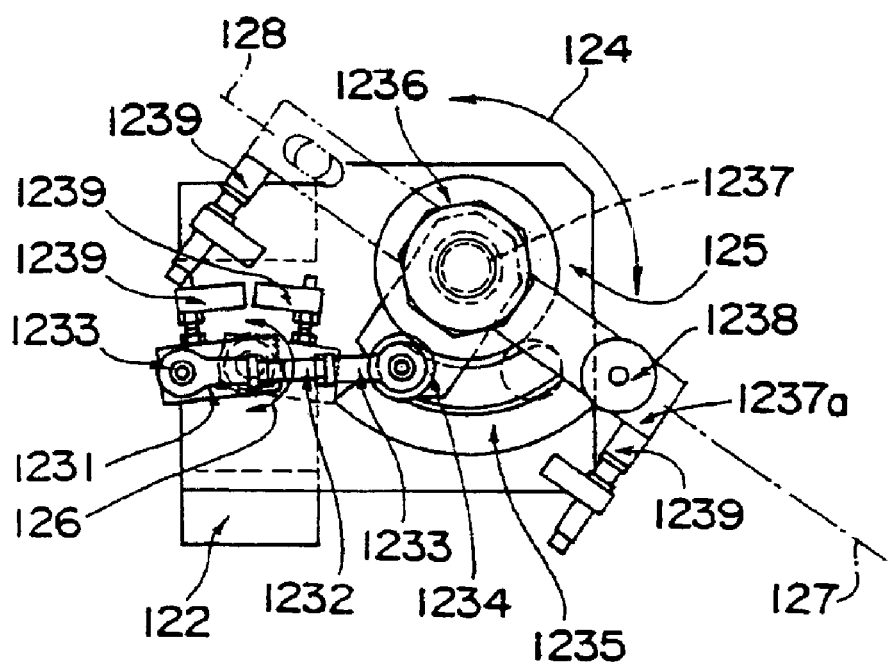
FIG. 26 is a plan view of a turning device shown in FIG. 23.

As shown in FIGS. 23 and 26, an output shaft 122a of the rotary actuator 122 fitted to a base plate 125 of the turning mechanism 123 is fitted to one end of a lever 1231 serving for transfer of rotational drive, and a rod 1233 having a shaft 1232 is rotatably fitted at its one end to another end of the lever 1231. A planet gear 1234 is rotatably fitted to another end of the rod 1233. The planet gear 1234 is to be engaged with an internal gear 1235 and a gear 1236, and a plate 1237a fixed to the rotating shaft 1237 is fitted to the gear 1236. The rotating shaft 1237 is supported against a frame member 1110 of the board conveyance unit CC via two bearings 1111 so as to be turnable in their circumferential direction, while the bearings 1111 support the base plate 125. One end of the rotating shaft 1237 is connected to the base plate 1124 of the holding and conveying device 111, while the other end of the rotating shaft 1237 is connected to a later-described shaft 2035. Also, a shaft 1238 for both rotation and up-and-down movement is insertable into a guide hole of the plate 1237a. In addition, reference numeral 1239 denotes a stopper. Also, the frame member 1110 is fitted onto a base plate 3032 fitted to a slider 3031 laid along the orthogonal direction 5Y on a frame 1120 of the board conveyance unit CC.

Operation of the turning mechanism 123 constructed as described above is explained.

When the output shaft 122a of the rotary actuator 122 is turned forward in its circumferential direction 126, the rotating shaft 1237 and the plate 1237a are turned in the direction 124 around the axis by 180 degrees from a first position 127 to a second position 128 by the planet gear 1234, the internal gear 1235 and the gear 1236 via the lever 1231, the shaft 1232 and the rod 1233. Resultantly, the holding and conveying device 111 connected to the rotating shaft 1237 is turned by 180 degrees. It is noted that when the output shaft 122a of the rotary actuator 122 is turned in reverse, the rotating shaft 1237 and the plate 1237a can be turned by 180 degrees from the second position 128 to the first position 127.

Although the turning drive device is implemented by the rotary actuator 122 in this embodiment as described above, it is still allowable to employ a motor. Further, although description has been made on a constitutional example involving horizontal turns in FIGS. 24 and 26, the invention may be carried out similarly also with turns in other vertical or inclined directions.

Next, the rail contracting unit 131 is explained with reference to FIGS. 24 and 25.

It is noted that the rail contracting unit 131 is provided in each of the conveyor rail portions 112 of the above-described holding and conveying device 111 with the same structure.

Reference numeral 132 denotes a drive device in the rail contracting unit 131, and an air cylinder is employed therefor in this example. An output shaft of the drive device 132 is connected to one end portion of a lever 133 which is fitted to the conveyor rail portions 112 so as to be rotatable about a central portion 133a as a rotational center. Also, one end of a link rod 134 is rotatably connected to the one end portion of the lever 133, while another portion of the rod 134 is rotatably connected to one end of a lever 1121a provided on contraction rail 1121-1. Similar to these, one end of a link rod 135 is rotatably connected to another end portion of the lever 133, while another end of the rod 135 is rotatably connected to one end of a lever 1121a provided on a contraction rail 1121-2. It is noted that in FIGS. 24 and 25, a contraction rail 1121 located on the right side is assumed as contraction rail 1121-1 and a contraction rail 1121 located on the left side is assumed as the contraction rail 1121-2 for explanation's sake.

The contraction rail 1121-1 and the contraction rail 1121-2 are rotatably fitted to their corresponding conveyor rails 112, respectively, so as to turn between conveyance position 1122 and bending position 1123, as described above, about a rotating shaft of the pulley 1141-3 shown in FIG. 24 in a case of the contraction rail 1121-1, and about a rotating shaft of the pulley 1141-8. Therefore, the pulley 1141-3 and the pulley 1141-8 can be said to be rotational-center pulleys for the contraction rails 1121.

Further, the pulleys 1141-5 and 1141-7 are provided at one-end portions of the contraction rails 1121, respectively, and rotating shafts of the pulleys 1141-5 and 1141-7 are disposed so as to be located on circumferences about the pulley 1141-3 and the pulley 1141-8, respectively. Therefore, even when the contraction rails 1121 are turned between the conveyance position 1122 and the bending position 1123 about the pulley 1141-3 and the pulley 1141-8, neither a distance between the pulley 1141-3 and the pulley 11414 nor a distance between the pulley 1141-8 and the pulley 1141-7 changes. Accordingly, even when the contraction rails 1121 are turned as described above, occurrence of any changes in tensile force that is acting on the conveyor belts 113 is prevented.

Operation of the rail contracting unit 131 constructed as described above is described below.

When the output shaft of the drive device 132 is moved along an arrow 136a so that the lever 133 is turned about the central portion 133a along an arrow 137a, the rods 134 and 135 are moved, causing the levers 1121a of the contraction rails 1121-1 and 1121-2, respectively, to be moved along an arrow 138a. This movement in turn causes the contraction rail 1121-1 and the contraction rail 1121-2 to be turned from the conveyance position 1122 to the bending position 1123 as described above about the rotating shaft of the pulley 1141-3 as a rotational center for the contraction rail 1121-1 and about the rotating shaft of the pulley 1141-8 as a rotational center for the contraction rail 1121-2.

Meanwhile, when the output shaft of the drive device 132 is moved along an arrow 136b, the lever 133 is turned along an arrow 137b and the levers 1121a are turned along an arrow 138b. Accordingly, the contraction rails 1121 are turned from the bending position 1123 to the conveyance position 1122.

As described above, with provision of the rail contracting unit 131, the contraction rails 1121 provided at both end portions of the conveyor rail portions 112 become bendable so that an overall length of the conveyor rail portions 112 can be shortened. Accordingly, in a case where the holding and conveying device 111 is turned by the turning device 121 without bending the contraction rails 1121, a range of a locus drawn by an end portion of each of the conveyor rail portions 112 becomes a circle shown by reference numeral 139a in FIG. 25. On the other hand, when the contraction rails 1121 are bent and turned, the range of a locus drawn by an end portion of each of the conveyor rail portions 112 becomes a circle shown by reference numeral 139b, narrower than the range 139a. Therefore, the circuit board 2 can be turned in a space smaller than in the conventional case, and moreover, it is no longer necessary to move up and down the conveyor rail portions 112 for turning operations, as would be necessary in the conventional case. In addition, providing the rail contracting unit 131 is effective also as measures for avoidance of interference with adjacent conveyors or operative units.

Furthermore, with the pulleys 1141-4 and 1141-7 added and by changing the way of stretching the conveyor belts 113 between the pulleys as described above, it becomes implementable to shorten the overall length of the conveyor rail portions 112 without adding any tensioners for the conveyor belts 113.

Although an air cylinder is used as the drive device 132 in this embodiment as described above, it is also possible to use a motor. Rotation of the lever 133 may also be implemented by using a rotary actuator or a motor.

Further, although the contraction rails 1121 are provided at both ends of the conveyor rail portions 112 and both moved in the above description, it is also allowable that only either one of them is moved according to relations of an installation space or the like. It is also possible to provide a contraction rail 1121 only at one end of the conveyor rail portion 112.

Further, the contraction rails 1121 are formed so as to be bendable in a gravitational direction in the above-described embodiment. However, without being limited to this, it is also possible to adopt a structure that allows the overall length of the conveyor rail portions 112 to be reduced without changing a tensile force of the conveyor belts 113 as compared with the conventional case. As an example, structure can be provided such that the contraction rails 1121 are bent in an anti-gravitational direction or extended and contracted relative to the rail member 1127 in its extension direction.

Further, the turning operation of the holding and conveying device 111 by the turning device 121 and the bending operation of the contraction rails 1121 by the rail contracting unit 131 can be performed either independently of each other or simultaneously.

Next, the first moving unit 1201 is explained below with reference to FIG. 23.

The first moving unit 1201 has a drive device 1202 of the first moving unit 1201, which is implemented by a rotary actuator in this embodiment, and a first moving mechanism 1203 which is driven by the drive device 1202 to move the rotating shaft 1237 along the wise direction 4Y.

The first moving mechanism 1203 has a pin 2032, a lever 2031 mounted on the output shaft of the drive device 1202, with the pin 2032 protrusively provided on the lever 2031 at one end of the lever 2031, a shaft 2033 which has one end rotatably engaged with the pin 2032 and another end connected to a link ball 2034 and which is arrayed coaxially with the rotating shaft 1237, and a shaft 2035 which has one end connected to the link ball 2034 and another end connected to the rotating shaft 1237 and which is arrayed coaxially with the rotating shaft 1237.

It is noted that the drive device 1202 is fixed to a fitting plate 2036 which is fixed to base plate 3032 fitted to slider 3031 on frame 1120 and which extends in the thicknesswise direction 4Y. Therefore, as described later, when the conveying and turning device 1101 is moved in the orthogonal direction 5Y along the slider 3031 by the second moving unit 301, the first moving unit 1201 is also moved therewith.

Also, whereas rotation of the rotating shaft 1237 in its circumferential direction causes the shaft 2035 to rotate in the same direction as described above, provision of the link ball 2034 prohibits the shaft 2033 from being rotated similarly in a circumferential direction together with circumferential rotation of the shaft 2035.

Operation of the first moving unit 1201 constructed as described above is explained.

Upon rotation of the output shaft of the drive device 1202, the lever 2031 starts to rotate in the state shown in FIG. 23, where one end of the shaft 2033 is resultantly rotated on a fulcrum of the link ball 2034 via the pin 2032. This rotational motion is transformed into linear motion by the link ball 2034, thereby pushing up the shaft 2035 and the rotating shaft 1237 along the thicknesswise direction 4Y. As a result, the holding and conveying device 111 connected to the rotating shaft 1237 as described above is moved from a first height position 204 indicated by solid line in FIG. 23 to a second height position 205 indicated by two-dot chain line along the thicknesswise direction 4Y. The first height position 204 corresponds to, for example, an installation level of the second board-conveying conveyor portion 22, and the second height position 205 corresponds to, for example, an installation level of the fourth board-conveying conveyor portion 24. In addition, rotating in reverse the output shaft of the drive device 1202 allows the holding and conveying device 111 to be moved from the second height position 205 to the first height position 204 along the thicknesswise direction 4Y.

With provision of the first moving unit 1201 as described above, it becomes implementable to move the holding and conveying device 111 along the thicknesswise direction 4Y.

Although a rotary actuator is used as the drive device 1202 in the above description, it is still allowable to use a motor. Further, although the thicknesswise direction 4Y corresponds to the vertical, up-and-down direction in this embodiment, the invention may also be carried out similarly with other horizontal or inclined directions.

Next, the second moving unit 301 is explained below with reference to FIGS. 21 and 23.

The second moving unit 301, which is a unit for moving the above-described conveying and turning device 1101 and the first moving unit 1201 mounted on the conveying and turning device 1101 along the orthogonal direction 5Y, has a drive section 302 including two air cylinders 3021 and 3022, and a conveyance unit 303 in this embodiment.

The conveyance unit 303 has sliders 3031 laid on the frame 1120, the base plate 3032 fitted to the sliders 3031, and a slider 3033 laid on the frame 1120 along the orthogonal direction 5Y and serving for sliding air cylinder 3022, wherein the base plate 3032 is fixed to the drive section 302. Further, the frame member I 110 of the turning device 121 is fitted to the base plate 3032.

The air cylinder 3021 serves to move the conveying and turning device 1101 and the first moving unit 1201 between the first board-conveying conveyor portion 21 (corresponding to the first mounting lane JA in a case where the board conveying device CC is the first connective conveyance unit CC1, and to the first mounting lane JB in a case where the board conveying device CC is the second connective conveyance unit CC2), and the second board-conveying conveyor portion 22 or the fourth board-conveying conveyor portion 24 (corresponding to the first bypass lane BPA in a case where the board conveying device CC is the first connective conveyance unit CC1, to the second bypass lane BPB in a case where the board conveying device CC is the second connective conveyance unit CC2, and to one conveyance lane directed toward the reflow device 904 in a case where the board conveying device CC is the third connective conveyance unit CC3). The air cylinder 3022 serves for movement between the second board-conveying conveyor portion 22 or the fourth board-conveying conveyor portion 24, and the third board-conveying conveyor portion 23 (corresponding to the second mounting lane Ja in a case where the board conveying device CC is the first connective conveyance unit CC1, and to the second mounting lane Jb in a case where the board conveying device CC is the second connective conveyance unit CC2). The air cylinder 3022 is fitted to the slider 3033 so as to be movable by air cylinder 3021.

Operation of the second moving unit 301 constructed as described above is explained.

In a case where the conveying and turning device 1101 and the first moving unit 1201 are arranged in correspondence, for example, to the first board-conveying conveyor portion 21, the air cylinder 3022 is moved on the slider 3033 by driving the air cylinder 3021.

Accordingly, the conveying and turning device 1101 and the first moving unit 1201 mounted on the drive section 302 are moved from an arrangement position of the first board-conveying conveyor portion 21 to an arrangement position of the second board-conveying conveyor portion 22 or the fourth board-conveying conveyor portion 24. Further, by driving the air cylinder 3022, the conveying and turning device 1101 and the first moving unit 1201 are moved from the arrangement position of the second board-conveying conveyor portion 22 or the fourth board-conveying conveyor portion 24 to an arrangement position of the third board-conveying conveyor portion 23.

Also, by operating the air cylinder 3021 and the air cylinder 3022 in a direction reverse to the foregoing, the conveying and turning device 1101 and the first moving unit 1201 can be moved from the arrangement position of the third board-conveying conveyor portion 23 to the arrangement position of the second board-conveying conveyor portion 22 or the fourth board-conveying conveyor portion 24, and further to an arrangement position of the first board-conveying conveyor portion 21.

Indeed using an air cylinder as the drive section 302 as in this embodiment allows an apparatus manufacturing cost to be reduced, but, of course, this mode is not limitative. A pulse motor or AC servomotor may be used as the drive section 302. It is also possible to adopt a ball screw structure as the drive section 302, in which case one ball screw will do.

Further, although description has been made on an example in which the orthogonal direction 5Y is a horizontal direction in this embodiment, yet invention may be carried out similarly also with other vertical or inclined directions.

The control section 309 performs operation control over individual drive sections in the conveying and turning device 1101, the first moving unit 1201 and the second moving unit 301 as described above, and moreover, performs control over a conveyance operation of the circuit board 2 in the board conveying device CC as described below.

Operation of the board conveying device CC of this embodiment constructed as described above is explained below.

As shown in FIG. 22, the circuit board 2 that has been conveyed up along a preceding-step conveyance path 1212 is loaded onto the conveyor rail portions 112 of the conveying and turning device 1101 preliminarily arranged at the first conveyor position 11-1 (corresponding to a position located along the first mounting lane JA in a case where the board conveying device CC is the first connective conveyance unit CC1, and to a position located along the first mounting lane JB in a case where the board conveying device CC is the second connective conveyance unit CC2). It is noted that in the conveying and turning device 1101, the contraction rails 1121 are arranged at the conveyance positions 1122 during loading and unloading of the circuit board 2.

In compliance with a board demand signal derived from a succeeding-step unit, for example, from the uppermost-stream side component mounting apparatus AI, from among upstream-side mounting apparatus group A in the case where the board conveying device CC is the first connective conveyance unit CC1, or from the uppermost-stream side component mounting apparatus BI, from among upstream-side mounting apparatus group B in a case where the board conveying device CC is the second connective conveyance unit CC2, or from the reflow device 904 in a case where the board conveying device CC is the third connective conveyance unit CC3, the conveying and turning device 1101 is moved along the orthogonal direction 5Y by the second moving unit 301 as described above, and thereafter unloads the circuit board 2 to a pertinent one of the first board-conveying conveyor portion 21, either the second board-conveying conveyor portion 22 or the fourth board-conveying conveyor portion 24, or the third board-conveying conveyor portion 23. In addition, in the case where the board conveying device CC is the third connective conveyance unit CC3, the circuit board 2 is unloaded to only one conveyance lane directed to the reflow device 904.

Then, for movement of the conveying and turning device 1101 along the orthogonal direction 5Y by the second moving unit 301, for example, for its movement from the first conveyor position 11-1 to the second conveyor position 11-2 (corresponding to a position located along a bypass lane arranged above or below the first bypass lane BPA in the case where the board conveying device CC is the first connective conveyance unit CC1, to a position located along a bypass lane arranged above or below the second bypass lane BPB in the case where the board conveying device CC is the second connective conveyance unit CC2, and to a position located along a bypass lane arranged above or below one conveyance lane directed toward the reflow device 904 in the case where the board conveying device CC is the third connective conveyance unit CC3) that allows the conveying and turning device 1101 to face the second board-conveying conveyor portion 22, the first moving unit 1201 is operated so that a height level of the holding and conveyance device 111 is changed simultaneously as the second moving unit 301 is operated. On the other hand, for movement, for example, from the first conveyor position 11-1 to the second conveyor position 11-2 (corresponding to a position located along the first bypass lane BPA in the case where the board conveying device CC is the first connective conveyance unit CC1, to a position located along the second bypass lane BPB in the case where the board conveying device CC is the second connective conveyance unit CC2, and to a position located along one conveyance lane directed toward the reflow device 904 in the case where the board conveying device CC is the third connective conveyance unit CC3) that allows the conveying and turning device 101 to face the fourth board-conveying conveyor portion 24, it is sufficient to operate only the second moving unit 301 because of the same height level, and there is no need for changing the height level of the holding and conveying device 111 by operating the first moving unit 1201. Furthermore, for movement, for example, from the first conveyor position 11-1 to the third conveyor position 12-2 (corresponding to a position located along the second mounting lane Ja in the case where the board conveying device CC is the first connective conveyance unit CC1, and to a position located along the second mounting lane 1b in the case where the board conveying device CC is the second connective conveyance unit CC2), the turning device 121 is operated, simultaneously as the second moving unit 301 is operated, so that the holding and conveying device 111 turned to make a reference end face of the circuit board 2 adjusted to the mounting apparatus 26. In addition, for execution of the turning of the holding and conveying device 111, the rail contracting unit 131 is operated before start of this turning operation so that the contraction rails 1121 are placed in the bending position 1123.

In this way, while the conveying and turning device 1O1 is being moved along the orthogonal direction 5Y by the second moving unit 301, movement of the holding and conveying device 111 toward the thicknesswise direction 4Y and turning toward the direction 124 around the axis are concurrently performed, by which a conveyance process time can be shortened as compared with the conventional case.

According to the board conveying device CC of this embodiment, as described above, by virtue of provision of the conveying and turning device 101, the first moving unit 1201 and the second moving unit 301, it becomes implementable to move the circuit board 2 along any one of the its thicknesswise direction 4Y, the orthogonal direction 5Y and the direction 124 around an axis. Also, even in a case where a plurality of lines of conveyance paths are provided, by virtue of the provision of the conveying and turning device 1101, the first moving unit 1201 and the second moving unit 301, it becomes implementable to convey the circuit board 2 to a respective conveyance path with a one-device constitution. Further, an attribute that the constitution can be implemented by one device allows an installation space of the board conveying device to be remarkably reduced as compared with the conventional case.

Further, provision of the rail contracting unit 131 in the conveying and turning device 1101 makes it possible to reduce space involved in turning of the holding and conveying device 111. This contributes to space saving of the board conveying device as well as to prevention of interference with other devices adjacent to the conveying and turning device 1101.

Further, by operating the conveying and turning device 1101, the first moving unit 1201 and the second moving unit 301 either sequentially or sequentially and simultaneously, it also becomes implementable to convey the circuit board 2 to any arbitrary conveyance position out of, for example, upper-stage three lines and lower-stage one line, as well as to move the circuit board 2 for a directional change. Therefore, conveyance process time can be shortened as compared with the conventional case. Furthermore, it is also possible to simultaneously perform two or more operations out of four operations of a board conveying operation, a turning operation in the conveying and turning device 1101, a moving operation in the first moving unit 1201 and a moving operation in the second moving unit 301. Therefore, conveyance process time can be shortened as compared with the conventional case.

Furthermore, although the board conveying device CC in the above-described embodiment is equipped with the conveying and turning device 1101, the first moving unit 1201 and the second moving unit 301, it is also allowable to provide a board conveying device equipped with only the holding and conveying device 11 and the rail contracting unit 131. For example, a board conveying device equipped with only the holding and conveying device 111 and the rail contracting unit 131 can be adopted for a so-called loader and unloader which are provided in the component mounting apparatus to perform loading and unloading, respectively, of circuit boards to and from an X-Y table movable in X- and Y-directions perpendicular to each other. Thus, with adoption of such a board conveying device equipped with the rail contracting unit 131 for the loader and the unloader, a rail length of the conveyor rail portions 112 can be reduced by operating the rail contracting unit 131 for movement of the X-Y table in the X- and Y-directions, so that interference with the X-Y table can be avoided, thereby allowing a movable range of X-Y table to be ensured.

Figure 27:
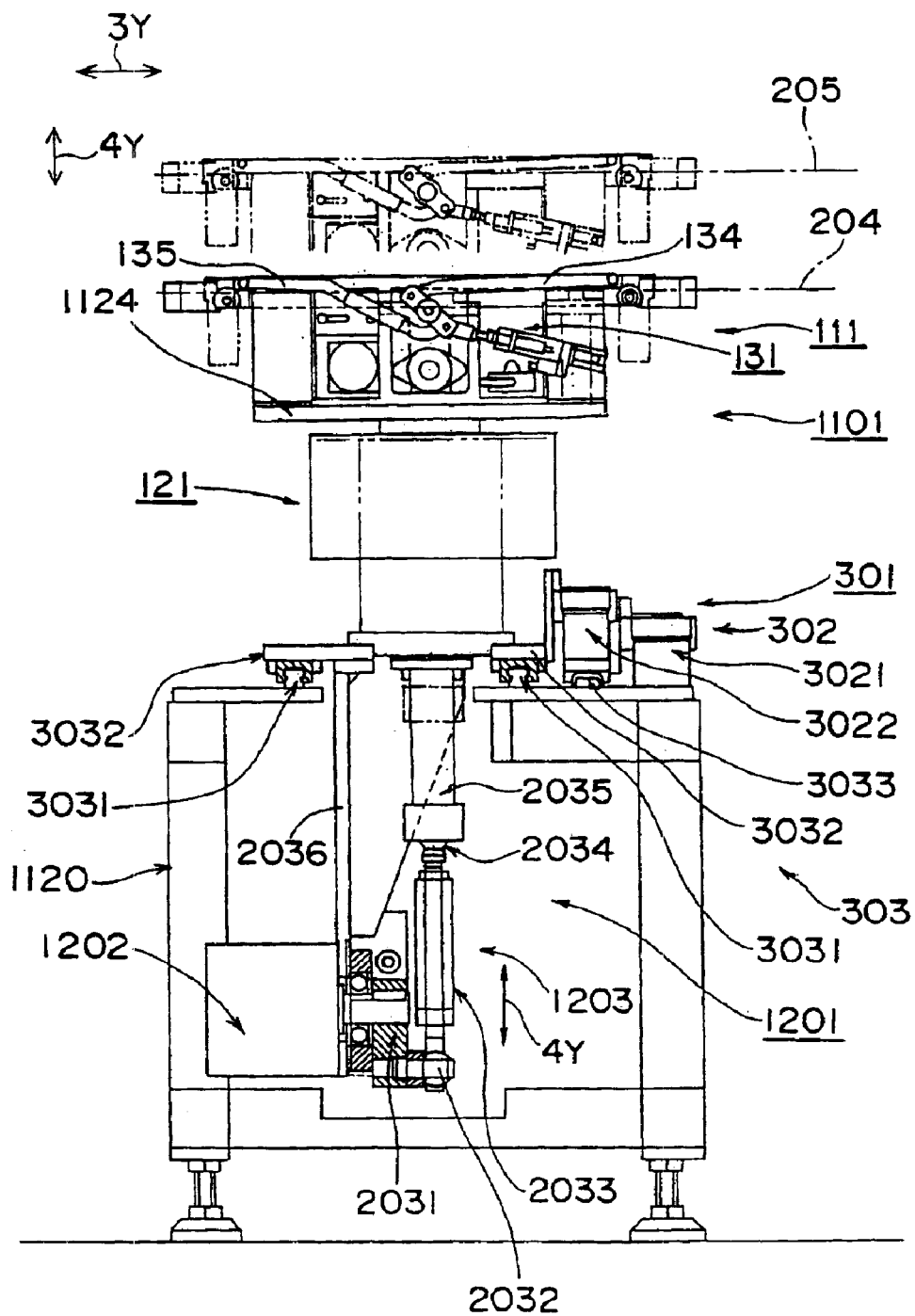
FIG. 27 is a sectional view of a modification of the board conveying device shown in FIG. 21.
Figure 28:
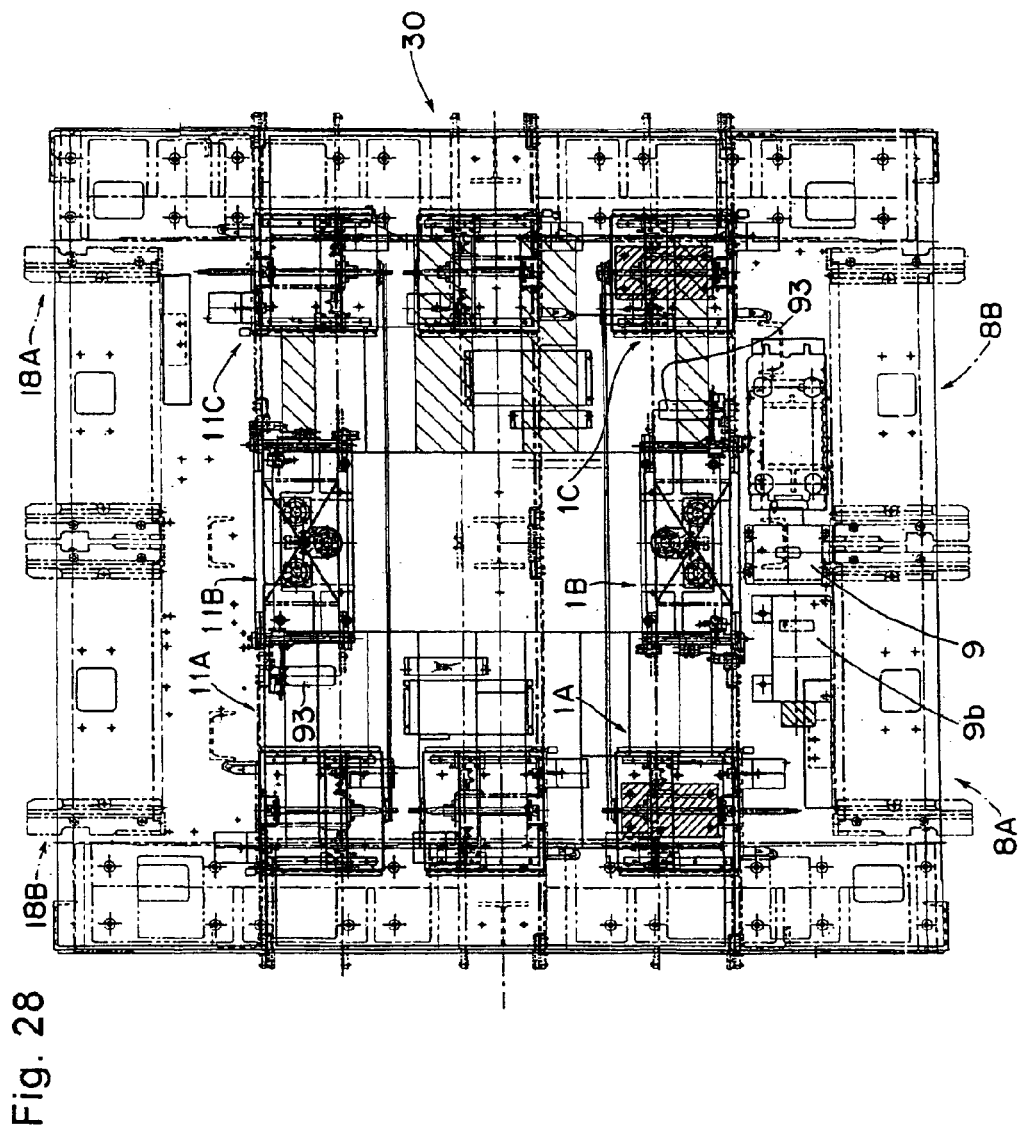
FIG. 28 is a detailed plan view of a main frame of the component mounting apparatus according to the first embodiment of FIG. 1.
Figure 29:
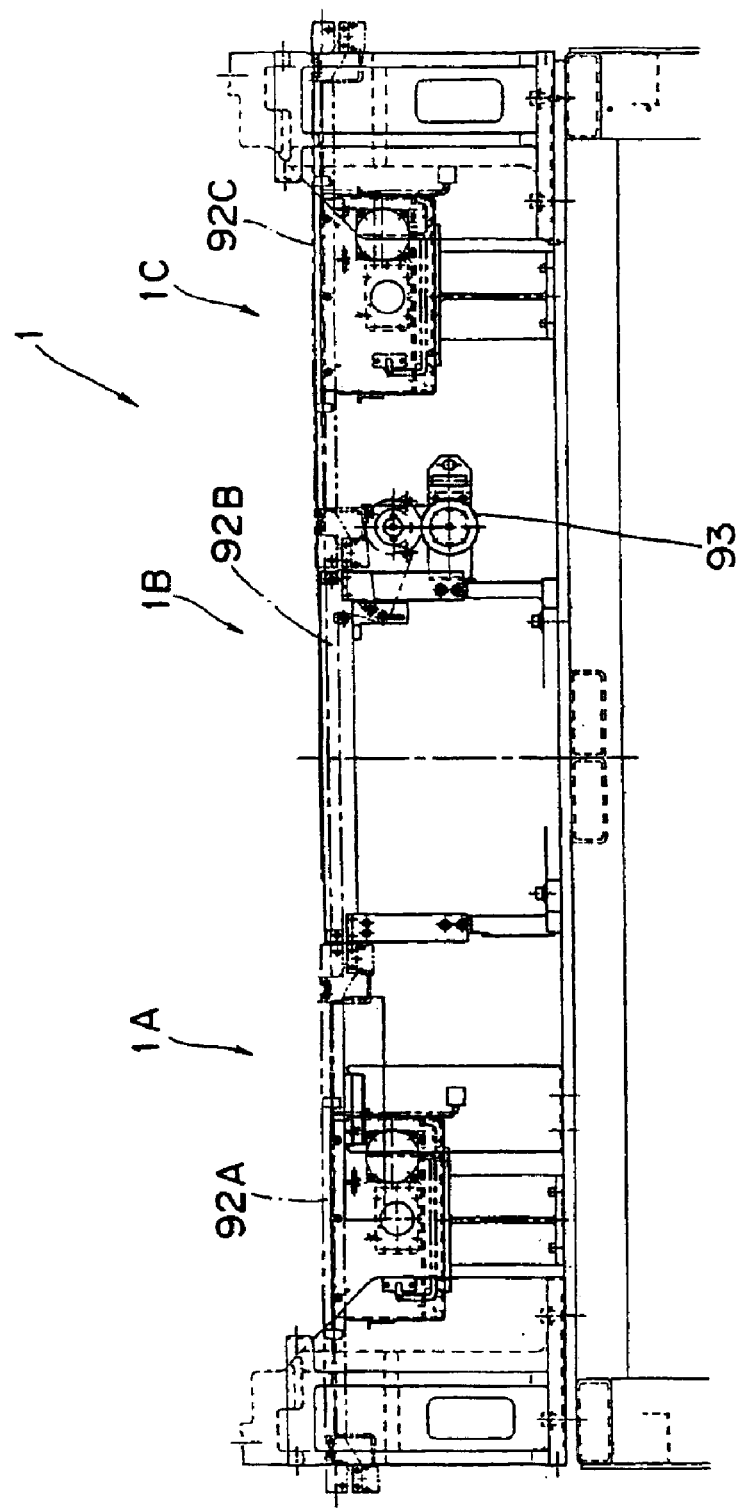
FIG. 29 is a detailed front view of the main frame of FIG. 28.
Figure 30:
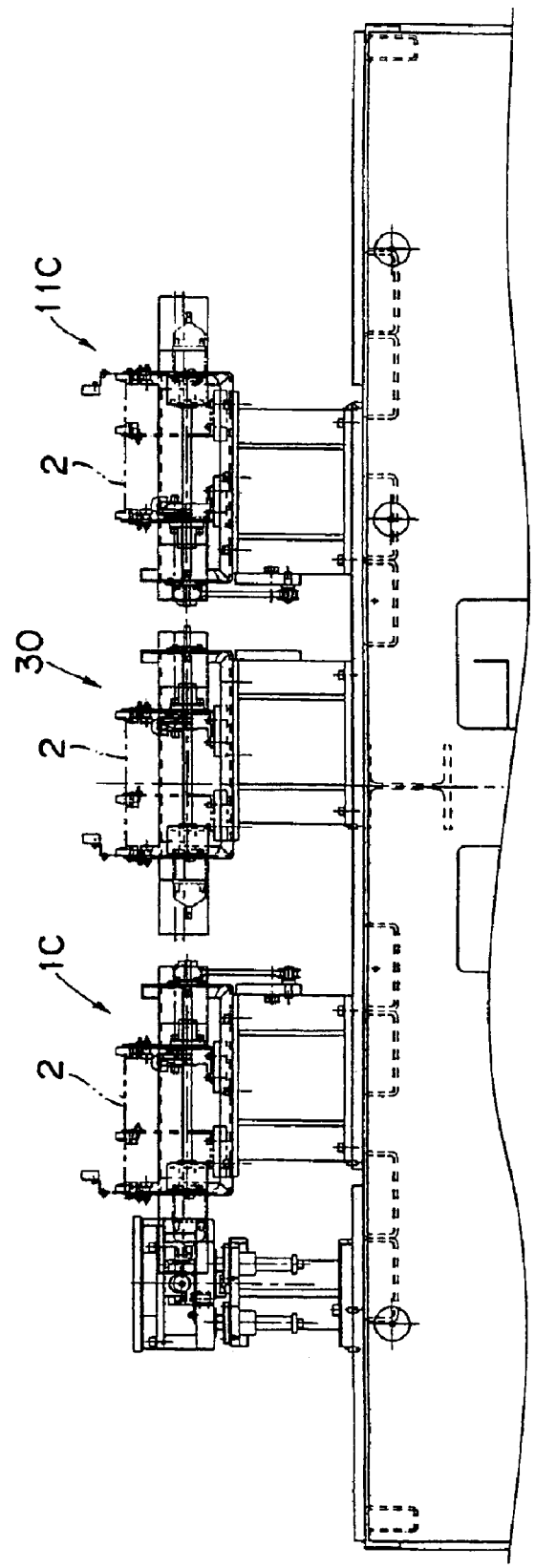
FIG. 30 is a detailed right-hand side view of the main frame of FIG. 28.

Further, in the board conveying device CC of the above-described embodiment, the first moving unit 1201 moves the holding and conveying device 111 alone in the thicknesswise direction 4Y. However, it is also possible to provide a constitution that the conveying and turning device 1101, with the turning device 121 included as well, is moved in the thicknesswise direction 4Y as shown in FIG. 27.

As described in detail above, according to the board conveying device of the present invention, which includes the holding and conveying device and the rail contracting unit, the overall length of the conveyor rail portions is contracted by the rail contracting unit, so that the installation space of the board conveying device can be reduced as compared with the conventional case. Further, prevention of interference with devices adjacent to the holding and conveying device can be fulfilled by the rail contracting unit.

Further, when the conveying and turning device having the turning device is provided, and the holding and conveying device is turned by the turning device, the overall length of the conveyor rail portions is contracted by the rail contracting unit, so that the space involved in turning of the holding and conveying device can be reduced. Therefore, an installation space of the board conveying device can be reduced as compared with the conventional case.

Also, with the first moving unit further provided, operation of contracting the overall length of the conveyor rail portions by the rail contracting unit, and operation of moving the circuit board in its thicknesswise direction can be performed simultaneously. Therefore, even in a case where a plurality of conveyance paths for conveying circuit boards are disposed at different positions along the circuit-board thicknesswise direction, the conveying and turning device can be disposed so as to correspond to each of the conveyance paths. Thus, while space saving is fulfilled, circuit-board conveyance process time can be reduced as compared with the conventional case.

Furthermore, with the second moving unit provided, it becomes implementable to perform a turning operation of the circuit board and a moving operation in the thicknesswise direction while moving the circuit board in an orthogonal direction. Therefore, even in a case where a plurality of conveyance paths are arrayed on the same plane, and moreover, the conveyance paths are arranged at different positions along the circuit-board thicknesswise direction, the conveying and turning device can be disposed so as to correspond to each of the conveyance paths. Thus, while space saving is fulfilled, circuit-board conveyance process time can be reduced as compared with the conventional case.

Furthermore, since the conveying and turning device, the first moving unit and the second moving unit are provided in a one-unit device, installation work for the board conveying device becomes simpler, as compared with the conventional case where those units are provided in a plurality of devices. Also, with provision of the control unit for performing operational control of the conveying and turning device, the first moving unit and the second moving unit, it becomes achievable to implement distributive conveyance of circuit boards for a plurality of lines of conveyance paths with a minimum installation space and with a short process time.

FIG. 19 shows structure of the control section of the electronic component-mounted board production line of the component mounting system of the second embodiment.

As shown in FIG. 19, control unit 1000A of mounting apparatus group A, control unit 1000B of mounting apparatus group B, the first connective conveyance unit CC1, the second connective conveyance unit CC2, the third connective conveyance unit CC3, the first bypass lane BPA and the second bypass lane BPB are connected together.

Moreover, power supply to individual component mounting apparatuses of mounting apparatus group A, power supply to individual component mounting apparatuses of mounting apparatus group B, power supply to and first connective conveyance unit CC1, power supply to and second connective conveyance unit CC2 and power supply to the third connective conveyance unit CC3 are performed individually independently.

With the above constitution, board size information for width adjustment in each connective conveyance unit CC can be outputted from the control unit 1000A of mounting apparatus group A and the control unit 1000B of mounting apparatus group B to the first connective conveyance unit CC1, the second connective conveyance unit CC2 and the third connective conveyance unit CC3. In each mounting apparatus group, width adjustment in the loader L, the Y-table T, the unloader U and the bypass conveyance path BP can be automatically performed according to information from the control unit.

Moreover, according to the aforementioned constitution, the first connective conveyance unit CC1 can drive the first and second bypass conveyance units BP1 and BP2 by obtaining board detection information from the apparatuses located on the downstream side of the board conveyance direction, or, for example, the first, second and third bypass conveyance units BP1, BP2 and BP3 and the component mounting apparatuses AI and AII located on the uppermost-stream side and the downstream side of mounting apparatus group A, or outputting a drive signal and electric power to the first and second bypass conveyance units BP1 and BP2 for driving of the first and second bypass conveyance units BP1 and BP2. As one example, in the second embodiment, the first connective conveyance unit CC1 obtains the board detection information indirectly via the first, second and third bypass conveyance units BP1, BP2 and BP3, not directly from the second connective conveyance unit CC2. However, the board detection information may be obtained directly from the second connective conveyance unit CC2.

Moreover, with the aforementioned constitution, the second connective conveyance unit CC2 can drive the third and fourth bypass conveyance units BP3 and BP4 by obtaining board detection information from the apparatuses located on the downstream side of the board conveyance direction, or, for example, the fourth, fifth and sixth bypass conveyance units BP4, BP5 and BP6 and the component mounting apparatuses B1 and BII located on the uppermost-stream side and the downstream side of mounting apparatus group B and the apparatuses located on the upstream side of the board conveyance direction, or, for example, the third bypass conveyance unit BP3 and the component mounting apparatuses AII and AII located on the uppermost-stream side and the downstream side of mounting apparatus group A, or outputting a drive signal and electric power to the third bypass conveyance unit BP3 and the fourth bypass conveyance unit BP4 for driving of the third bypass conveyance unit BP3 and the fourth bypass conveyance unit BP4.

Moreover, with the aforementioned constitution, the third connective conveyance unit CC3 obtains board detection information from the fourth through sixth bypass conveyance units BP4 through BP6, the component mounting apparatus AIII located on the downmost-stream side of mounting apparatus group A and the component mounting apparatuses BIIII and BII located on the downmost-stream side and the upstream side of mounting apparatus group B.

Therefore, if, for example, operations of all or part of the component mounting apparatuses of mounting apparatus group A all or part of the component mounting apparatuses of mounting apparatus group B are stopped, the bypass conveyance unit BP relevant to a driven connective conveyance unit CC can be driven by driving the first connective conveyance unit CC1 or the second connective conveyance unit CC2 or the third connective conveyance unit CC3, and board conveyance with respect to the bypass lane can be performed without regard to stoppage of the driving of the component mounting apparatus.

The control unit 1000A of mounting apparatus group A is connected to a control unit 1000AI of the component mounting apparatus AI, a control unit 1000AII of mounting apparatus group AII and a control unit 1000AIII of mounting apparatus group AIII. Moreover, the control unit 1000B of mounting apparatus group B is connected to a control unit 1000BI of component mounting apparatus BI, a control unit 1000BII of mounting apparatus group BII and a control unit 1000BIII of mounting apparatus group BIII.

The control unit of each component mounting apparatus has a relationship of connection to drive devices and sensors as shown in FIG. 5 and controls component mounting operations described in connection with, for example, the first embodiment. It is to be noted that the loaders 1A and 11A correspond to the loader L (LA1, LA2, LA3, La1, La2, La3, LB1, LB2, LB3, Lb1, Lb2, Lb3), the placement conveyance units 1B and 11B correspond to the Y-table T (TA1, TA2, TA3, Ta1, Ta2, Ta3, TB , TB2, TB3, Th1, Tb2, Tb3), and the first unloader 1C or the second unloader 2C corresponds to the unloader U (UA1, UA2, UA3, Ua1, Ua2, Ua3, UB1, UB2, UB3, Ub1, Ub2, Ub3).

The first connective conveyance unit CC1 is provided with a board detection sensor DC1 for detecting presence or absence of the board 2, and a motor MC1 for synchronously rotatively driving a pair of conveyance belts board conveyance in the first connective conveyance unit CC1. A board is being conveyed when the board 2 is detected by the board detection sensor DC1, and the board can be conveyed when the board 2 is not detected.

The second connective conveyance unit CC2 is provided with a board detection sensor DC2 for detecting presence or absence of the board 2, and a motor MC2 for synchronously rotatively driving a pair of conveyance belts for board conveyance in the second connective conveyance unit CC2. A board is being conveyed when the board 2 is detected by the board detection sensor DC2, and the board can be conveyed when the board 2 is not detected.

The third connective conveyance unit CC3 is provided with a board detection sensor DC3 for detecting presence or absence of the board 2, and a motor MC3 for synchronously rotatively driving a pair of conveyance belts for board conveyance in the third connective conveyance unit CC3. A board is being conveyed when the board 2 is detected by the board detection sensor DC3, and the board can be conveyed when the board 2 is not detected.

The first through third bypass conveyance units BP1, BP2 and BP3 that constitute the first bypass lane BPA are provided with board detection sensors DPA1, DPA2 and DPA3 for detecting presence or absence of the board 2, and motors MPA1, MPA2 and MPA3 for synchronously rotatively driving a pair of conveyance belts for board conveyance in the first bypass lane BPA. The bypass conveyance unit BP is in a board standby state when the board 2 is detected by the board detection sensors DPA1, DPA2 and DPA3, and the bypass conveyance unit BP is in a board awaiting state when the board 2 is not detected. A bypass conveyance unit BP that has the board detection sensor DPA by which the board 2 is not detected outputs a "board demand signal" to a bypass conveyance unit located on an upstream side of the bypass conveyance unit BP, or to the connective conveyance unit CC. When the third bypass conveyance unit BP3 is in a board standby state, a "board unloading awaiting signal" is outputted to the second connective conveyance unit CC2 located on a downstream side.

The fourth through sixth bypass conveyance units BP4, BP5 and BP6 that constitute the second bypass lane BPB are provided with board detection sensors DPB1, DPB2 and DPB3 for detecting presence or absence of the board 2, and motors MPB1, MPB2 and MPB3 for synchronously rotatively driving a pair of conveyance belts for board conveyance in the second bypass lane BPB. A bypass conveyance unit BP is in a board standby state when the board 2 is detected by the board detection sensors DPB1, DPB2 and DPB3, and the bypass conveyance unit BP is in the board awaiting state when the board 2 is not detected. The bypass conveyance unit BP that has the board detection sensor DPB by which the board 2 is not detected outputs the "board demand signal" to a bypass conveyance unit located on the upstream side of the bypass conveyance unit BP, or to the connective conveyance unit CC. When the sixth bypass conveyance unit BP6 is in a board standby state, the "board unloading awaiting signal" is outputted to the third connective conveyance unit CC3 located on a downstream side.

Moreover, a particular portion of the component mounting system of the second embodiment in the control unit 1000 of each component mounting apparatus is partially shown in FIG. 20. A remaining constitution is shown in FIG. 5. As shown in FIG. 20, the control unit 1000 of each component mounting apparatus is connected to the loader L, the Y-table T, the unloader U and the memory MEM, and driving of the loader L, the Y-table T and the unloader U can be controlled by the control unit 1000 on the basis of a program and data stored in the memory MEM.

The loader L is provided with a board detection sensor DL for detecting presence or absence of the board 2, and a motor ML for synchronously rotatively driving a pair of conveyance belts for board conveyance of the loader L. The loader L is in a board standby state when the board 2 is detected by the board detection sensor DL, and the loader L is in a board awaiting state when the board 2 is not detected. The control unit 1000AI or 1000AII or 1000AIII or 1000BI or 1000BII or 1000BIII of the component mounting apparatus that has the loader L in a board awaiting state outputs a "board demand signal" to the unit or device located on an upstream side of the loader L, or for example, connective conveyance unit CC or the unloader U. When the unloader U receives the "board demand signal" and the unloader U is making the board 2 stand by, the board 2 in the standby state is unloaded toward the loader L. When the connective conveyance unit CC receives the "board demand signal", a board distributing operation described later is performed.

The Y-table T is provided with a board detection sensor DT for detecting presence or absence of the board 2, and a motor MT for synchronously rotatively driving a pair of conveyance belts for board conveyance of the Y-table T. When the board 2 is detected by the board detection sensor DT, the Y-table T is in a component mounting state or a state immediately before or after component mounting. At this time, when a board standby state is provided in the unloader U located on a downstream side of this Y-table T, an already mounted board on the Y-table T cannot be unloaded toward the unloader U located on the downstream side. An unmounted board 2c cannot be fed onto the Y-table T, and a mounting operation is stopped. Consequently, a "board unloading awaiting production stop signal" is outputted to the loader L located on the downstream side of the unloader U, or to connective conveyance unit CC.

When the board 2 is not detected, the Y-table T is in the board awaiting state, and a "board demand signal" is outputted to the loader L located on an upstream side of the Y-table T by the control unit 1000AI or 1000AII or 1000AIII or 1000B1 or 1000BII or 1000BIII of the component mounting apparatus that has the Y-table T in the board awaiting state. When the loader L receives the "board demand signal" and the loader L is making the board 2 stand by, the board 2 in the standby state is unloaded toward the Y-table T. When the loader L is in the board awaiting state too, a "Y-table and loader with no board signal" is outputted to the connective conveyance unit CC located on the upstream side of the loader L.

The unloader U is provided with a board detection sensor DU for detecting presence or absence of the board 2, and a motor MU for synchronously rotatively driving a pair of conveyance belts for board conveyance of the unloader U. When the board 2 is detected by the board detection sensor DU, the unloader U is in a board awaiting state, and a "board unloading awaiting signal" is outputted to connective conveyance unit CC located on a downstream side. When the board 2 is not detected, the unloader U is in a board awaiting state, and a board unloading enable signal is outputted to the Y-table T located on an upstream side of the unloader U by the control unit 1000AI or 1000AII or 1000AIII or 1000B1 or1000BII or 1000BIII of the component mounting apparatus that has the unloader U in the board awaiting state. Only when the Y-table T receives the board unloading enable signal and a component mounting operation is completed, mounted board 2d is unloaded from the Y-table T toward the unloader U.

Information of various data and programs necessary for a board distributing operation, a component mounting operation and so on can be stored in the memory MEM. For example, when the "board demand signal", the "Y-table and loader with no board signal", the "board unloading awaiting signal" and a "board unloading awaiting production stop signal" are simultaneously outputted from two or more lanes in each connective conveyance unit, it is acceptable to store these signals and information of an order of priority of unloading of the lanes in such a case, with the signals and information being predetermined by an operator or a mounting program.

The component mounting system of the second embodiment of the aforementioned constitution operates as follows.

First of all, after describing an outline of the first through third connective conveyance units CC1 through CC3, a board conveyance operation of the component mounting system will be described in detail.

The first connective conveyance unit CC1 can perform a board distributing operation in consideration of a balance between mounting apparatus group A and mounting apparatus group B by awaiting a "board demand signal" outputted from the first mounting lane JA, the second mounting lane Ja and the first bypass lane BPA when there is no board, and conveying a board to a corresponding lane on the basis of the "board demand signal" issued from this lane. For example, in a case where same component-mounted boards are produced in mounting apparatus group A and mounting apparatus group B and component-mounted board production efficiency of mounting apparatus group B is higher than component-mounted board production efficiency of mounting apparatus group A, by conveying a board to be mounted (i.e., a board before component mounting) to mounting apparatus group B by priority with respect to mounting apparatus group A by virtue of the first bypass lane BPA, a board distributing operation in consideration of balance between mounting apparatus group A and mounting apparatus group B can be performed from a viewpoint of production efficiency. Moreover, in a case where different component-mounted boards are produced in mounting apparatus group A and mounting apparatus group B, and a component-mounted board production time in mounting apparatus group B is shorter than a component-mounted board production time in mounting apparatus group A, by conveying a board to be mounted to mounting apparatus group B by priority with respect to mounting apparatus group A by virtue of the first bypass lane BPA, a board distributing operation in consideration of balance between mounting apparatus group A and mounting apparatus group B can be performed from a viewpoint of production efficiency.

The second connective conveyance unit CC2 can perform a board distributing operation in consideration of "board unloading awaiting" and "board conveyance request" by awaiting a "board demand signal" outputted from the first mounting lane JB, the second mounting lane Jb and the second bypass lane BPB when there is no board and conveying a board to a corresponding lane on the basis of the "board demand signal" issued from this lane.

Unmounted board $2c$ is conveyed to any one of the first or second mounting lane JA or Ja or the first bypass lane BPA of first mounting apparatus group A by the first connective conveyance unit CC1. The Unmounted board $2c$ conveyed to any one of the first or second mounting lane JA or Ja of first mounting apparatus group A is subjected to a component mounting operation in the front-side mounting units A1, A2 and A3 or the rear-side mounting units a1, a2 and a3 of the component mounting apparatuses AI, AII and AIII of mounting apparatus group A. Unmounted board $2c$ conveyed to the first bypass lane BPA is conveyed as it is to the second connective conveyance unit CC2 without undergoing any component mounting operation. It is also possible to make the board stand by in the standby positions of the bypass conveyance units BP1, BP2 and BP3 of the bypass lane BPA of the component mounting apparatuses AI, AII and AII of mounting apparatus group A, which constitutes the first bypass lane BPA as occasion demands. The unmounted board $2c$ from the first bypass lane BPA is conveyed to the first or second mounting lane JB or Jb of mounting apparatus group B by the second connective conveyance unit CC2. Mounted board $2d$ from the first or second mounting lane JA or Ja of mounting apparatus group A is conveyed to the second bypass lane BPB by the second connective conveyance unit CC2.

The third connective conveyance unit CC3 can perform an integrating operation of the mounted board $2d$ with the first lane. More specifically, board conveyance can be performed so that mounted boards $2d$ unloaded from the three conveyance lanes of the first and second mounting lanes JB and Jb and the second bypass lane BPB of the front-side and rear-side mounting units B3 and b3 of the third component mounting apparatus BIII of mounting apparatus group B are integrated into one conveyance lane toward, for example, the reflow device 904. It is to be noted that a board unloaded from the second mounting lane Jb of the rear-side mounting unit b3 is turned at an angle of 180° when conveyed into the second mounting lane Jb. Therefore, this board is required to be set back to an original reference phase by being turned at an angle of 180° on the third connective conveyance unit CC3 after being unloaded. However, when not turned at an angle of 180° in being loaded into the second mounting lane Jb, there is no need for taking this action.

The following will describe an example in which same component-mounted boards 2 are produced in each of the first mounting lane JA of mounting apparatus group A, the second mounting lane Ja of mounting apparatus group A, the first mounting lane JB of mounting apparatus group B and the second mounting lane Jb of mounting apparatus group B of the electronic component-mounted board production line.

The connective conveyance unit CC with a board turn function as shown in FIG. 21 and FIG. 22 is arranged between the mounting apparatus groups, and the connective conveyance unit CC performs a board distributing operation for unloading in a distributing manner boards received from any one of the three lanes or received from the bypass lane into either of the lanes, or an integrating operation for unloading in an integrating manner a board received from any one of the three lanes toward one downstream lane.

In order to provide a line balance of an electronic component-mounted board production line, the boards $2b$ loaded into the second mounting lanes Ja and Jb are turned at an angle of 180°, thereafter subjected to board loading, turned at an angle of 180° and thereafter subjected to board unloading. By so doing, quite the same component mounting operation can be performed by quite the same production program as those of the first mounting lanes JA and JB even by the second mounting lanes Ja and Jb, and management of production process time can be easily performed in unity.

A fundamental component mounting operation of this electronic component-mounted board production line is as follows.

As indicated by conveyance routes (1) and (2) in FIG. 15, unmounted board $2c$ on which solder is printed by the printer 900 is unloaded to the first mounting lane JA or the second mounting lane Ja of mounting apparatus group A via the first connective conveyance unit CC1, and the component mounting operation is performed by the front-side mounting units A1, A2 and A3 or the rear-side mounting units a1, a2 and a3 as shown in FIG. 10 and FIG. 14. As indicated by conveyance routes (4) and (5) in FIG. 16, mounted board $2d$ of which mounting has been completed in the front-side mounting units A1, A2 and A3 or the rear-side mounting unit a1, a2 and a3 of mounting apparatus group A is unloaded toward the second connective conveyance unit CC2 located on the downstream side of mounting apparatus group A. In the second connective conveyance unit CC2, the mounted board 2d is unloaded toward a rear-side mounting unit of mounting apparatus group B, or, for example, the reflow device 904 via the second bypass lane BPB while being distributed into the second bypass lane BPB of mounting apparatus group B, as indicated by conveyance route (10) in FIG. 17. In FIG. 10, FIGS. 14 through 16 and FIG. 18, a board obtained after unloading of the unmounted board 2c toward the first mounting lane JA or the second mounting lane Ja is denoted by 2a or 2b.

On the other hand, as indicated by conveyance route (3) in FIG. 15, the unmounted board 2c on which solder is printed by the printer 900 is distributed into the first bypass lane BPA of mounting apparatus group A via the first connective conveyance unit CC1, and conveyed to the second connective conveyance unit CC2 by way of the first bypass lane BPA. In the second connective conveyance unit CC2, the unmounted board 2c is unloaded toward the first mounting lane JB or the second mounting lane Jb of mounting apparatus group B, and a component mounting operation is performed by the front-side mounting units B1, B2 and B3 or the rear-side mounting units b1, b2 and b3 as shown in FIG. 10. As indicated by conveyance routes (6) and (7) in FIG. 16, the mounted board 2d of which mounting has been completed in the front-side mounting units BI, B2 and B3 or the rear-side mounting unit b1, b2 and b3 of mounting apparatus group B is unloaded toward the third connective conveyance unit CC3 located on a downstream side of mounting apparatus group B. In the third connective conveyance unit CC3, the mounted board 2d is unloaded toward the rear-side mounting unit of mounting apparatus group B, or, for example, the reflow device 904, as indicated by conveyance routes (8) and (9) in FIG. 17. In FIG. 10 and FIGS. 15 through 18, a board obtained after unloading of the unmounted board 2c toward the first mounting lane JB or the second mounting lane Jb is denoted by 2a or 2b.

In the third connective conveyance unit CC3, the board 2b unloaded from the first mounting lane JB and the second mounting lane 1b of mounting apparatus group B and the second bypass lane BPB is loaded into a rear-side mounting unit, or, for example, the reflow device 904.

The board 2b unloaded from the second mounting lane Jb of the mounting apparatus group B in the third connective conveyance unit CC3 is turned at an angle of 180° on the third connective conveyance unit CC3 and thereafter loaded into a rear-side mounting unit, or, for example, the reflow device 904.

For example, in order to continue production in mounting apparatus group B while a procedural change for board model change, replenishment of components in short supply and so on are performed, the first and second bypass conveyance units BP1 and BP2 of the first bypass lane BPA perform operational control in the first connective conveyance unit CC1, and the third bypass conveyance unit BP3 performs operational control in the second connective conveyance unit CC2. Moreover, power supply is performed from the first connective conveyance unit CC1 and the second connective conveyance unit CC2, by which the first through third bypass lanes BPA, BP2 and BP3 of the first bypass lane BPA can be operated even when the electronic component mounting apparatuses AI, AII and AIII of mounting apparatus group A are turned off.

By ending the board conveyance operation by the connective conveyance unit CC within a line process time of the electronic component-mounted board production line (i.e., a process time of an operation that needs the most time out of the operations of the component mounting apparatuses, the printer 900 and the reflow device 904, as exemplified here by a process time of unloading the mounted board 2d from the reflow device 904 through the reflow process), production efficiency can be prevented from being reduced through the board conveyance operation.

The board distribution and integrating operations in the connective conveyance unit CC will be described in detail below.

A fundamental rule of a board distribution function of the first connective conveyance unit CC1 will be described first.

As a prerequisite, if there is no board 2 held or standing by in a conveyance lane (the loader LA1 of the first mounting lane JA, the loader La1 of the second mounting lane Ja and the first bypass conveyance unit BP1 of the first bypass lane BPA) located adjacent to the first connective conveyance unit CC1 of the component mounting apparatus AI located on the uppermost-stream side of mounting apparatus group A (when no board is detected by a corresponding board detection sensor), then a "board demand signal" is inputted from the lane with no board to the control section of the first connective conveyance unit CC1.

When the "board demand signal" comes from the conveyance lane (the loader LA1 of the first mounting lane JA, the loader La1 of the second mounting lane Ja and the first bypass conveyance unit BP1 of the first bypass lane BPA) (when the "board demand signal" is turned on), the first connective conveyance unit CC1 sends the board 2 to the lane that has outputted the "board demand signal". Therefore, on the basis of the "board demand signal", any one of conveyance routes (1), (2) and (3) is selected, and the board 2 is conveyed along the selected conveyance route. If the "board demand signal" comes from two or more lanes at the same time (i.e., when two or more "board demand signals" are turned on at the same time), boards 2 are successively conveyed to the lanes according to an order of priority predetermined by an operator or a mounting program. When the "board demand signals" come from the three lanes of, for example, the first mounting lane JA, the second mounting lane Ja and the first bypass lane BPA in this order according to an order of priority, boards 2 are sent to the lanes in this order. This order of priority should preferably be able to be changed and added by the program in the first connective conveyance unit CC1. It is to be noted that the "board demand signal" outputted from the first bypass lane BPA is outputted when there are boards less than the number (three in the second embodiment) of boards that can be stocked in the first bypass lane BPA, i.e., the first through third bypass conveyance units BP1 through BP3.

Presence or absence of the "board demand signal" in the first connective conveyance unit CC1 is checked in accordance with a time when the first connective conveyance unit CC1 is not performing board conveyance (in other words, a time when the board detection sensor DC1 is detecting no board). That is, the first connective conveyance unit CC1 does not perform the checking at all during a board conveyance operation, and the first connective conveyance unit CC1 checks the "board demand signal" in accordance with the time when a board conveyance operation in the first connective conveyance unit CC1 ends. When the board conveyance operation is not performed, the first connective conveyance unit CC1 consistently checks the "board demand signal". However, when two or more "board demand signals" come at a point in time when the "board demand signal" is checked, boards are successively conveyed to all the lanes that are outputting the "board demand signal", and thereafter, the "board demand signal" is checked again. It is to be noted that this operation is performed when a "board unloading awaiting production stop signal" and a "Y-table and loader with no board signal"described later are not outputted.

As a result of making the first connective conveyance unit CC1 perform the board distributing operation as described above, the boards 2 can be distributed to the first mounting lane JA and the second mounting lanes Ja of mounting apparatus group A in a well-balanced manner. In a case where the aforementioned distributing operation is not performed, for example, if a board is conveyed only to a lane from which the "board demand signal" has come in advance, then the boards 2 are to be one-sidedly unloaded toward either one of the first mounting lane JA and the second mounting lane Ja, consequently loosing line balance.

It is also acceptable to input a board unloading stop signal toward the lane to the control section of the first connective conveyance unit CC1 while a procedural change for board model change, replenishment of components in short supply and so on are performed in either the first mounting lane JA or the second mounting lane Ja so as to prevent a board from being unloaded from the first connective conveyance unit CC1 toward the lane where the procedural change is being performed, and perform no check of an output of the "board demand signal"from the lane where the procedural change is being performed.

A fundamental rule of a board distribution function of the second connective conveyance unit CC2 will be described next.

As a prerequisite, if there is no board 2 held or standing by in a conveyance lane (the loader LB1 of the first mounting lane JB, the loader Lb1 of the second mounting lane Jb and the fourth through sixth bypass conveyance units BP4 through BP6 of the second bypass lane BPA) located adjacent to the second connective conveyance unit CC2 of the component mounting apparatus B1 located on the uppermost-stream side of mounting apparatus group B (when no board is detected by a corresponding board detection sensor), then a "board demand signal" is inputted from the lane with no board to the control section of the second connective conveyance unit CC2.

When a "board demand signal" comes from the conveyance lane (the loader LB1 of the first mounting lane JB, the loader Lb1 of the second mounting lane Jb and the fourth through sixth bypass conveyance units BP4 through BP6 of the second bypass lane BPA) (when the "board demand signal" is turned on), the second connective conveyance unit CC2 sends the board 2 to the lane that has outputted the "board demand signal". Therefore, on the basis of the "board demand signal", any one of conveyance routes (4), (4) (6) and (7) is selected, and the board 2 is conveyed along the selected conveyance route. If the "board demand signal" comes from two or more lanes at the same time (i.e., when two or more "board demand signals" are turned on at the same time), boards 2 are successively conveyed to these lanes according to an order of priority predetermined by an operator or a mounting program. When the "board demand signals" come from the three lanes of, for example, the first mounting lane JB, the second mounting lane Jb and the second bypass lane BPB in this order according to an order of priority, boards 2 are sent to the lanes in this order. This order of priority should preferably be able to be changed and added by a program in the second connective conveyance unit CC2. It is to be noted that the "board demand signal" outputted from the second bypass lane BPB is outputted when there are boards less than the number (three in the second embodiment) of boards that can be stocked in the second bypass lane BPB, i.e., the fourth through sixth bypass conveyance units BP4 through BP6.

Presence or absence of the "board demand signal" in the second connective conveyance unit CC2 is checked in accordance with a time when the second connective conveyance unit CC2 is not performing board conveyance (in other words, a time when the board detection sensor DC2 is detecting no board). That is, the second connective conveyance unit CC2 does not perform checking at all during a board conveyance operation, and the second connective conveyance unit CC2 checks the "board demand signal" in accordance with a time when the board conveyance operation in the second connective conveyance unit CC2 ends. When the board conveyance operation is not performed, the second connective conveyance unit CC2 consistently checks the "board demand signal". However, when two or more "board demand signals" come at a point in time when the "board demand signal" is checked, boards are successively conveyed to all the lanes that are outputting the "board demand signal", and thereafter, the "board demand signal" is checked again. It is to be noted that this operation is performed when a "board unloading awaiting production stop signal" and a "Y-table and loader with no board signal" described later are not outputted.

As a result of making the second connective conveyance unit CC2 perform the board distributing operation as described above, the boards 2 can be distributed to the first mounting lane JB and the second mounting lanes Jb of mounting apparatus group B in a well-balanced manner. In a case where the aforementioned distributing operation is not performed, for example, if a board is conveyed only to the lane from which the "board demand signal" has come in advance, then the boards 2 are to be one-sidedly unloaded toward either one of the first mounting lane JB and the second mounting lane Jb, consequently loosing line balance.

It is also acceptable to input a board unloading stop signal toward a lane to the control section of the second connective conveyance unit CC2 while a procedural change for board model change, replenishment of components in short supply and so on are performed in either the first mounting lane JB or the second mounting lane 1b so as to prevent the board from being unloaded from the second connective conveyance unit CC2 toward the lane where the procedural change is being performed, and perform no check of the output of the "board demand signal" from the lane where the procedural change is being performed.

A fundamental rule of a board distribution function of the third connective conveyance unit CC3 will be described next.

As a prerequisite, if a "board unloading awaiting signal" comes from conveyance lanes of the unloader UB3 of the first mounting lane JB of the component mounting apparatus BIII that is adjacent to the third connective conveyance unit CC3 and located on the downmost-stream side of mounting apparatus group B, the loader Ub3 of the second mounting lane Jb of the component mounting apparatus BIII and the sixth bypass conveyance path BP6 of the second bypass lane BPB, mounted board 2d of the conveyance lane that has outputted the "board unloading awaiting signal" is sent. Therefore, according to the "board unloading awaiting signal", selection between conveyance routes (8), (9) and (10) is performed, and the mounted board 2d is conveyed to the reflow device 904.

The "board unloading awaiting signal" of the first mounting lane JB and the second mounting lane Jb is outputted when a board exists in the "board standby position" of the unloaders UB3 and Ub3 of the first mounting lane JB and the second mounting lane Jb.

The "board unloading awaiting signal" of the second bypass lane BPB is outputted when the board 2 exists in the board unloading position of the sixth bypass conveyance unit BP6 of the first bypass lane BPB.

When a plurality of "board unloading awaiting signals" are outputted, board conveyance is performed according to a determined order of priority. A board outputted from the second mounting lane Ja is turned at an angle of 180 ° in the third connective conveyance unit CC3 and thereafter loaded into the reflow device 904.

A board distributing operation in consideration of line balance of mounting apparatus group A and mounting apparatus group B will be described next in addition to a fundamental rule of a board distribution function of the connective conveyance units CC.

First of all, in the first connective conveyance unit CC1 located on the uppermost-stream side of mounting apparatus group A, unless board distribution is performed by grasping states of production of the first mounting lane JA and the second mounting lane Ja of the mounting apparatus group A and the first mounting lane JA and the second mounting lane Ja of the mounting apparatus group B, line balance of the electronic component-mounted board production line is worsened and productivity cannot be improved. Therefore, it is required to perform the distributing operation according to several rules of operational practice.

A rule of operational practice of the first connective conveyance unit CC1 is as follows.

When a "board demand signal" comes from the loader LA1 of the first mounting lane JA and the loader La1 of the second mounting lane Ja of the mounting apparatus AI located on the uppermost-stream side of mounting apparatus group A, and the first bypass conveyance unit BP1 of the first bypass lane BPA, the first connective conveyance unit CC1 sends a board.

When two or more "board demand signals" come at the same time, boards are conveyed according to a determined order of priority.

The "board demand signal" is checked while the first connective conveyance unit CC1 is not performing board conveyance.

Further, when no board exists in both the loader LA1 of the first mounting lane JA of the component mounting apparatus AI located on the uppermost-stream side of mounting apparatus group A and the Y-table TA1 located on the downstream side of the loader, or when no board exists in both the loader La1 of the second mounting lane Ja of the component mounting apparatus AI located on the uppermost-stream side of mounting apparatus group A and the Y-table Ta1 located on the downstream side of the loader, a "Y-table and loader with no board signal" is outputted from the control unit 1000AI of the component mounting apparatus AI to the first connective conveyance unit CC1 located on the upstream side of the loaders LA1 and La1.

When the "Y-table and loader with no board signal" comes to the first connection unloading section CC1, meaning a state in which production is stopped for a reason that the component mounting apparatus AI is awaiting loading of a board, the board is sent to the lane that is outputting the "Y-table and loader with no board signal" prior to the "board demand signal" which means that no board exists only in the loaders LA1 and La1.

The "Y-table and loader with no board signal" is also outputted from the first bypass lane BPA. That is, when no board exists in both the loader LB1 of the first mounting lane JB of the component mounting apparatus B1 located on the uppermost-stream side of mounting apparatus group B located on the downstream side of the first bypass lane BPA and the Y-table TB1 located on the downstream side of the loader, or when no board exists in both the loader Lb1 of the second mounting lane Jb of the component mounting apparatus B1 located on the uppermost-stream side of mounting apparatus group B and the Y-table Tm1 located on the downstream side of the loader, the "Y-table and loader with no board signal" is outputted from the control unit 1000BI of the component mounting apparatus B1 to the second connective conveyance unit CC2 located on the upstream side of the loaders LB1 and Lb1. The second connective conveyance unit CC2 that has received this signal outputs the signal to the first bypass lane BPA of mounting apparatus group A. The first bypass lane BPA of mounting apparatus group A outputs the "Y-table and loader with no board signal" to the first connective conveyance unit CC1.

When the "Y-table and loader with no board signal" comes from the first bypass lane BPA to the first connection unloading section CC1, meaning a state in which production is stopped for a reason that the component mounting apparatus B1 is awaiting loading of a board, the board is sent to the first bypass lane BPA that is outputting the "Y-table and loader with no board signal" prior to the "board demand signal" which means that no board exists only in the loaders LA1 and La1.

FIG. 11 shows a flowchart of a concrete distributing operation of the first connective conveyance unit CC1.

It is determined in step S1 whether or not a conveyance operation command is on. That is, it is first determined that a conveyance operation can be performed. Only when a conveyance operation can be performed, program flow proceeds to step S2 to execute the following board conveyance operation. When the conveyance operation command is not on, meaning an end, a board loading operation by the first connective conveyance unit CC1 is stopped at the end. The conveyance operation command is not on when driving of the component mounting apparatus is stopped for some reasons of, for example, component feed to a component feeding unit and maintenance. In such a case, the above-mentioned determination is made in order to prevent a board from being loaded.

Next, it is determined in step S2 whether or not there is a conveyance route of which a "Y-table and loader with no board signal" is on. More specifically, it is determined whether or not a "Y-table and loader with no board signal" has come from any one of the first mounting lane JA and the second mounting lane Ja of mounting apparatus group A and the first bypass lane BPA.

When there is a conveyance route of which the "Y-table and loader with no board signal" is on in step S2, boards are conveyed in step S3 to all conveyance routes that conform to conditions of step 2. Subsequently, program flow returns to step S1. That is, when there is a conveyance route of which the "Y-table and loader with no board signal" is on, the boards are conveyed to all the conveyance routes that conform to the conditions according to an order of priority, and processes of step S1 and step S2 are executed again after an end of conveyance.

When there is no conveyance route of which the "Y-table and loader with no board signal" is on in step S2, it is determined in step S4 whether or not there is a conveyance route of which a "board demand signal" is on. That is, when the "Y-table and loader with no board signal" is not outputted, search of a conveyance route of which the "board demand signal" is on is executed. More specifically, it is determined whether or not the "board demand signal" has come from any one of the first mounting lane JA and the second mounting lane Ja of mounting apparatus group A and the first bypass lane BPA. When there is no conveyance route of which the "board demand signal" is on, the program flow returns to step S1.

When there is a conveyance route of which the "board demand signal" is on in step S4, the conveyance route that conforms to conditions of step 4 is registered in step S5 as conveyance route information in the memory MEM.

Next, a board is conveyed to the conveyance route of the highest order of priority in step S6, and the conveyance route information of the route to which the board has been conveyed is deleted from inside the memory MEM.

Next, it is determined in step S7 whether or not the conveyance route information registered in step 5 is remaining in the memory MEM. When the conveyance route information registered in step 5 is not remaining in the memory MEM, the program flow returns to step S1.

When it is determined in step S7 that the conveyance route information registered in step 5 is remaining in the memory MEM, it is determined in step S8 whether or not there is a conveyance route of which the "Y-table and loader with no board signal" is on.

When there is a conveyance route of which the "Y-table and loader with no board signal" is on in step S8, boards are conveyed in step S9 to all the conveyance routes of which the "Y-table and loader with no board signal" is on, and conveyance route information of the board conveyance routes to which the boards have been conveyed is deleted from inside the memory MEM. Subsequently, the program flow returns to step S7.

When there is no conveyance route of which the "Y-table and loader with no board signal" is on in step S8, the program flow returns to step S6.

Next, the second connective conveyance unit CC2 located on the downstream side of mounting apparatus group A is required to unload mounted boards 2d produced in the first and second mounting lanes JA and Ja of mounting apparatus group A toward the second bypass lane BPB of mounting apparatus group B and distribute unmounted boards 2c that have passed through the first bypass lane BPA of mounting apparatus group A into the first and second mounting lanes JB and Jb of mounting apparatus group B. When unloading of the first mounting lane JA and the second mounting lane Ja of mounting apparatus group A is not performed for a long time, the mounted boards 2d cannot be unloaded, and production of mounting apparatus group A stops. If the unmounted board 2c is not loaded into mounting apparatus group B for a long time, production of mounting apparatus group B stops while awaiting the board. Therefore, the second connective conveyance unit CC2 is required to perform board unloading from mounting apparatus group A and board loading into mounting apparatus group B in consideration of a situation in which mounting apparatus groups A is awaiting the mounted board 2d and a situation in which the unmounted board 2c is loaded into mounting apparatus group B.

A rule of operational practice of the second connective conveyance unit CC2 is as follows.

The second connective conveyance unit CC2 performs selection between conveyance routes (4), (5), (6) and (7) in consideration of a "board demand signal" and a "board unloading awaiting signal" from a conveyance lane and performs board conveyance.

The conveyance route can be changed and added by a program.

When there is no board in the loader LB1 of the first mounting lane JB of the component mounting apparatus BI located on the uppermost-stream side of mounting apparatus group B, or when there is no board in the loader Lb1 of the second mounting lane Jb of the component mounting apparatus BI located on the uppermost-stream side of mounting apparatus group B, the "board demand signal" is outputted from the control unit 1000BI of the component mounting apparatus BI to the second connective conveyance unit CC2 located on the upstream side of the loaders LB1 and Lb1.

Further, when no board exists in both the loader LB1 of the first mounting lane JB of the component mounting apparatus B1 located on the uppermost-stream side of mounting apparatus group B and the Y-table TB1 located on the downstream side of the loader, or when no board exists in both the loader Lb1 of the second mounting lane Jb of the component mounting apparatus B1 located on the uppermost-stream side of mounting apparatus group B and the Y-table Tb1 located on the downstream side of the loader, a "Y-table and loader with no board signal" is outputted from the control unit 1000B1 of the component mounting apparatus BI to the second connective conveyance unit CC2 located on the upstream side of the loaders LB1 and Lb1.

When boards exist in both the unloader UA3 of the first mounting lane JA of the component mounting apparatus AIII located on the downmost-stream side of mounting apparatus group A and the Y-table TA3 located on the upstream side of the unloader, or when boards exist in both the unloader Ua3 of the second mounting lane Ja of the component mounting apparatus AIII located on the downmost-stream side of mounting apparatus group A and the Y-table Ta3 located on the upstream side of the unloader. A "board unloading awaiting production stop signal" is outputted from the control unit 1000AIII of the component mounting apparatus AIII to the second connective conveyance unit CC2 located on the downstream side of the unloaders UA3 and Ua3. This means a state in which production is stopped in the component-mounting apparatus AIII since board unloading is not performed.

When A board exists in the unloader UA3 of the first mounting lane JA of the component mounting apparatus AIII located on the downmost-stream side of mounting apparatus group A, or when A board exists in the unloader Ua3 of the second mounting lane Ja of the component mounting apparatus AIII located on the downmost-stream side of mounting apparatus group A, A "board unloading awaiting signal" is outputted from the control unit 1000AIII of the component mounting apparatus AIII to the second connective conveyance unit CC2 located on the downstream side of the unloaders LA3 and La3.

The second connective conveyance unit CC2 determines to which conveyance route, of routes (4) through (7) of FIG. 16, the board is to be conveyed in consideration of the "board demand signal" and the "Y-table and loader with no board signal" from mounting apparatus group B and the "board unloading awaiting signal" and the "board unloading awaiting production stop signal" from mounting apparatus group A.

It is to be noted that board conveyance is performed with priority given to A conveyance route from which the "Y-table and loader with no board signal" and the "board unloading awaiting production stop signal" are outputted. When these signals are outputted from two or more conveyance routes, board conveyance is performed according to a determined order of priority.

Further, when there are boards 2d less than the number of boards that can be stocked in the second bypass lane BPB inside the second bypass lane BPB, i.e., the fourth through sixth bypass conveyance units BP4 through BP6 of the second bypass lane BPB, a "board demand signal" is outputted from the fourth through sixth bypass conveyance units BP4 through BP6 of the second bypass lane BPB.

Moreover, when there is a board in the board unloading standby position of the third bypass unloading section BP3 of the first bypass lane BPA, a "board unloading awaiting signal" is outputted from the first bypass lane BPA.

FIG. 12 shows a flowchart of a concrete distributing operation of the second connective conveyance unit CC2.

It is determined in step S11 whether or not a conveyance operation command is on. That is, it is first determined whether or not a conveyance operation may be performed. Only when a conveyance operation may be performed, program flow proceeds to step S12 to perform the following board conveyance operation. When the conveyance operation command is not on, meaning an end, a board loading operation by the second connective conveyance unit CC2 is stopped at the end. The conveyance operation command is not on when driving of the component mounting apparatus is stopped for some reasons of, for example, component feed to the component feeding unit and maintenance. In such a case, the above-mentioned determination is made in order to prevent a board from being loaded.

Next, it is determined in step S12 whether or not there is a conveyance route of which a "Y-table and loader with no board signal" or a "board awaiting production stop signal" is on and a "board demand signal" and a "board unloading awaiting signal" are both on. More specifically, it is determined whether or not the "Y-table and loader with no board signal" and the "board demand signal" have come from any one of the first mounting lane JB and the second mounting lane Jb of mounting apparatus group B and the second bypass lane BPB, and whether or not the "board awaiting production stop signal" and the "board unloading awaiting signal"have come from any one of the first mounting lane JA and the second mounting lane Ja of mounting apparatus group A and the first bypass lane BPA.

When there is a conveyance route of which the "Y-table and loader with no board signal" or the "board waiting production stop signal" is on and the "board demand signal" and the "board unloading awaiting signal" are both on in step S12, boards are conveyed in step S13 to all conveyance routes that conform to conditions of step 12 according to a predetermined order of priority. Subsequently, the program flow returns to step S11.

When there is no conveyance route of which the "Y-table and loader with no board signal" or the "board waiting production stop signal" is on and the "board demand signal" and the "board unloading awaiting signal" are both on in step S12, it is determined in step S14 whether or not there is a conveyance route of which the "board demand signal" or the "board unloading awaiting signal" is on. More specifically, it is determined whether or not the "board demand signal" has come from any one of the first mounting lane JB and the second mounting lane Jb of mounting apparatus group B or the second bypass lane BPB, and whether or not the "board unloading awaiting signal" has come from any one of the first mounting lane JA and the second mounting lane Ja of mounting apparatus group A and the first bypass lane BPA. When there is no conveyance route of which the "board demand signal" or the "board unloading awaiting signal" is on, the program flow returns to step S11.

When there is a conveyance route of which the "board demand signal" or the "board unloading awaiting signal" is on in step S14, a conveyance route that conforms to conditions of step 14 is registered in step S15 as conveyance route information in the memory MEM.

Next, a board is conveyed to a conveyance route of the highest order of priority in step S16, and conveyance route information of the route to which the board has been conveyed is deleted from inside the memory MEM.

Next, it is determined in step S1 7 whether or not the conveyance route information registered in step 14 is remaining in the memory MEM. When the conveyance route information registered in step 14 is not remaining in the memory MEM, the program flow returns to step S11 .

When the conveyance route information registered in step 14 is remaining in the memory MEM, it is determined in step S18 whether or not there is a conveyance route of which the "Y-table and loader with no board signal" or the "board unloading awaiting production stop signal" is on.

When there is a conveyance route of which the "Y-table and loader with no board signal" or the "board unloading awaiting production stop signal" is on in step S18, boards are conveyed in step S19 to all the conveyance routes that conform to conditions of step 18, and conveyance route information of the board conveyance routes to which the boards have been conveyed is deleted from inside the memory MEM. Subsequently, the program flow returns to step S17.

When there is no conveyance route of which the "Y-table and loader with no board signal" or the "board unloading awaiting production stop signal" is on in step S18, the program flow returns to step S16.

Next, a rule of operation practice of the third connective conveyance unit CC3 is as follows.

Selection between conveyance routes (8), (9) and (10) is performed according to a "board unloading awaiting signal" from the unloader UB3 of the first mounting lane JB of mounting apparatus group B, the unloader Ub3 of the second mounting lane Jb of the component mounting apparatus BIII and the conveyance lane of the sixth bypass conveyance path BP6 of the second bypass lane BPB, and mounted board 2*d* is conveyed.

When a plurality of "board unloading awaiting signals" are outputted, board conveyance is performed according to a determined order of priority.

A board outputted from the second mounting lane Jb of mounting apparatus group B is turned at an angle of 180° in the third connective conveyance unit CC3 and thereafter loaded into the reflow device 904.

When boards exist in both the unloader LB3 of the first mounting lane JB of the component mounting apparatus BIII located on the downmost-stream side of mounting apparatus group B and the Y-table TB3 located on the upstream side of the loader, or when the boards exist on both the unloader Lb3 of the second mounting lane Jb of the component mounting apparatus Bill located on the downmost-stream side of mounting apparatus group B and the Y-table Tb3 located on the upstream side of the loader, a "board unloading awaiting production stop signal" is outputted from the control unit 1000BIII of the component mounting apparatus BIII to the third connective conveyance unit CC3 located on the downstream side of the unloaders UB3 and Ub3. This means a state in which production is stopped in the component mounting apparatus BIII since board unloading is not performed.

Further, when boards have already been standing by in a number of boards that can be stocked in the second bypass lane BPB and there are boards in the unloader UA3 of the first mounting lane JA of the component mounting apparatus AIII located on the downmost-stream side of mounting apparatus group A and the Y-table TA3 located on the upstream side of the loader or in the unloader Ua3 of the second mounting lane Ja and the Y-table Ta3 located on the upstream side of the loader, a "board unloading awaiting production stop signal" is outputted. This means a state in which production is stopped in the component mounting apparatus AIII since board unloading is not performed.

FIG. 13 shows a flowchart of a concrete distributing operation of the third connective conveyance unit CC3.

It is determined in step S21 whether or not a conveyance operation command is on. That is, it is first determined whether or not a conveyance operation may be performed. Only when a conveyance operation may be performed, program flow proceeds to step S22 to perform the following board conveyance operation. When the conveyance operation command is not on, meaning an end, a board loading operation performed by the third connective conveyance unit CC3 is stopped at the end. The conveyance operation command is not on when driving of the component mounting apparatus is stopped for some reasons of, for example, component feed to a component feeding unit and maintenance. In such a case, the above-mentioned determination is made in order to prevent a board from being loaded.

Next, it is determined in step S22 whether or not there is a conveyance route of which a "board unloading awaiting production stop signal" is on. More specifically, it is determined whether or not the "board unloading awaiting production stop signal" has come from the first mounting lane JB of the component mounting apparatus BIII located on the downmost-stream side of mounting apparatus group B, or the second mounting lane Jb of the component mounting apparatus BIII located on the downmost-stream side of mounting apparatus group B, or the second bypass lane BPB.

When there is a conveyance route of which the "board unloading awaiting production stop signal" is on in step S22, boards are conveyed in step S23 to all the conveyance routes that conform to conditions of step 22 according to a predetermined order of priority.

When there is no conveyance route of which the "board unloading awaiting production stop signal" is on in step S22, it is determined in step S24 whether or not there is a conveyance route of which a "board unloading awaiting signal" is on. That is, when the "board unloading awaiting production stop signal" is not outputted, search of the conveyance route of which the "board unloading awaiting signal" is on is executed. When there is no conveyance route of which the "board unloading awaiting signal" is on in step S24, program flow returns to step S21.

When there is a conveyance route of which the "board unloading awaiting signal" is on in step S24, a conveyance route that conforms to the conditions of step 24 is registered in step S25 as conveyance route information in the memory MEM.

Next, a board is conveyed to the conveyance route of the highest order of priority in step S26, and the conveyance route information of the route to which the board has been conveyed is deleted from inside the memory MEM.

Next, it is determined in step S27 whether or not the conveyance route information registered in step 24 is existing in the memory MEM. When the conveyance route information registered in step 24 is not existing in the memory MEM, the program flow returns to step S21.

When the conveyance route information registered in step 24 is existing in the memory MEM, it is determined in step S28 whether or not there is a conveyance route of which the "board unloading awaiting production stop signal" is on. When there is no route of which the "board unloading awaiting production stop signal" is on in step S28, the program flow returns to step S26.

When there is a conveyance route of which the "board unloading awaiting production stop signal" is on in step S28, boards are conveyed in step S29 to all the conveyance routes of which the "board unloading awaiting production stop signal" is on, and conveyance route information of the board conveyance routes to which the boards have been conveyed is deleted from inside the memory MEM. Subsequently, the program flow returns to step S27.

It is also possible to perform a board conveyance operation such that the electronic component mounting apparatus, where problems have occurred at a time of electronic component mounting apparatus trouble, is bypassed by using the first through third connective conveyance units CC1 through CC3 and the first and second bypass lanes BPA and BPB.

As described above, according to the component mounting system of the second embodiment, by operating each bypass lane BP and each connective conveyance unit CC as described above in response to a board conveyance request from each component mounting apparatus and each bypass lane BP, unmounted board 2c can be conveyed by being distributed into an optimum conveyance lane from a viewpoint of production efficiency, and mounted board 2d can be unloaded from an optimum conveyance lane from the viewpoint of production efficiency, thereby allowing boards to be conveyed integrally into one conveyance lane.

In particular, by performing board distribution in consideration of states of operation of the electronic each component mounting apparatuses in mounting apparatus group A and mounting apparatus group B, stoppage in a board awaiting state can be restrained to a minimum in each electronic component mounting apparatus.

In order to perform board distribution in consideration of a "board demand signal"and a "board unloading awaiting signal" from each electronic component mounting apparatus, and to achieve line balance of the electronic component-mounted board production line, by performing board distribution also in consideration of a "Y-table and loader with no board signal" and a "board unloading awaiting production stop signal", optimum board conveyance can be achieved from the viewpoint of production efficiency.

As shown in FIG. 18, it is acceptable to arrange a defective board unloading section BD on, for example, a front side of the second connective conveyance unit CC2, and, when a defective board is generated during a component mounting operation in the component mounting apparatus of mounting apparatus group A, to unload the defective board into the defective board unloading section BD by turning the second connective conveyance unit CC2 at an angle of 90 degrees instead of conveying the defective board to the downstream side of the second connective conveyance unit CC2 when the board is made to pass through the second connective conveyance unit CC2. It is also acceptable to arrange a similar defective board unloading section BD on, for example, a front side of the third connective conveyance unit CC3 and unload a defective board generated during a component mounting operation in the component mounting apparatus of mounting apparatus group B.

The constitution of the aforementioned production line is one example, and all the component mounting apparatuses are not required to be provided with the front-side mounting unit and the rear-side mounting unit. The present invention can also be applied to a production line in which component mounting apparatuses each being composed of one mounting unit and a bypass lane are joined together, a production line in which a component mounting apparatus provided with a front-side mounting unit, a rear-side mounting unit and a bypass lane, and a component mounting apparatus composed of one mounting unit and a bypass lane are mixed, or the like.

Moreover, a board conveyance direction can be properly changed according to specifications of the production line. The conveyance direction may be extended not only in one way but also diverged partway into a plurality of ways or partially reversed.

Moreover, each bypass lane is not limited to one arranged midway between a front-side mounting unit and a rear-side mounting unit, and is allowed to be arranged above or below the front-side mounting unit or the rear-side mounting unit, or arranged on a front side of the front-side mounting unit or arranged on a rear side of the rear-side mounting unit. Each bypass lane is only required to be roughly parallel to the first mounting conveyance path, i.e., the first mounting lane, and the second mounting conveyance path, i.e., the second mounting lane, and independent of the first mounting conveyance path and the second mounting conveyance path.

By properly combining arbitrary embodiments of the aforementioned various embodiments, effects owned by respective embodiments can be produced.

According to the present invention, in one component mounting apparatus, a component mounting work area of the board is divided into two parts of a first component mounting work area and the second component mounting work area. In each of the first component mounting work area and a second component mounting work area, there are independently performed loading of boards by a first loader and a second loader, positioning and holding of the boards by a first placement-position determining conveyance unit and a second placement-position determining conveyance unit, supply of components by first and second component feeding devices, suction, holding and movement of components by first and second placement heads, recognition of components by first and second recognition devices and unloading operations of the boards by the first and second placement-position determining conveyance units, a first unloader and a second unloader. More concretely, a board is loaded into the first component mounting work area by the first loader in the first component mounting work area. The board is positioned and held by the first placement-position determining conveyance unit for performance of a mounting operation in a first placement position that is a portion located closest to a component feeding unit arranged along a board conveyance direction in the first component mounting work area and closest to a camera to be usually most frequently used as one example of the first component recognition device, i.e., a two-dimensional camera. Subsequently, a component from the component feeding unit is sucked and held by driving the first placement head, recognized by the two-dimensional camera and thereafter placed onto the board. After repeating this and after ending a mounting operation in the first mounting unit, the board is unloaded from the first placement-position determining conveyance unit to the first unloader and further unloaded out of the first component mounting work area by the first unloader. On the other hand, concurrently with the mounting operation in the first mounting unit, a board is loaded into the second component mounting work area by the second loader in the second component mounting work area. This board is positioned and held by the second placement-position determining conveyance unit for a mounting operation in a second placement position that is a portion located closest to a component feeding unit arranged along a board conveyance direction in the second component mounting work area and closest to a camera to be usually most frequently used as one example of the second component recognition device, i.e., a two-dimensional camera. Subsequently, a component from the component feeding unit is sucked and held by driving the second placement head, recognized by the two-dimensional camera and thereafter placed onto the board. After repeating this and after ending a mounting operation in the second mounting unit, the board is unloaded from the second placement-position determining conveyance unit to the second unloader and further unloaded out of the second component mounting work area by the second unloader.

As a result, in the first and second mounting units, board loading, component holding, component recognition, component placement and board unloading can be performed independently of one another in respective optimum states, and productivity can be further improved. That is, when either component mounting terminates in advance while concurrently performing component mounting operations in the component mounting work areas, a board obtained after the component mounting can be unloaded without awaiting termination of the other component mounting operation or board unloading, and areal productivity can be further improved. Moreover, distances between a board positioned and held in each component mounting work area, the component feeding unit and the two-dimensional camera that is usually most frequently used can be remarkably shortened in comparison with a case where a board is held in the board conveyance path in a central portion of the component mounting work area as in the conventional case. This enables reduction in mounting time and improvement of productivity.

Moreover, in regard to a placement position in each placement-position determining conveyance unit, with reference to a component feeding unit and a support rail portion located closest to a camera to be usually most frequently used as one example of a component recognition device, or, for example, two-dimensional cameras of a pair of support rail portions of each placement-position determining conveyance unit, another support rail portion is moved close to or apart from the one support rail portion. In order to cope with board size, component suction, holding and recognition by the two-dimensional camera in each component feeding unit are performed always near a of a shortest distance, not depending on size of the circuit board. Therefore, a distance of movement of each placement head, i.e., positions of the three operations of component suction, recognition and placement are linked in the shortest distance, by which a mounting process time can be reduced and production efficiency can be increased. In particular, conventionally in a case where component mounting is performed on a board in the vicinity of a board conveyance position, distances between positions of three operations of component suction, recognition and placement have been elongated and a mounting process time has been increased in a case of small boards. According to the present invention, even in a case of small boards or large boards, boards are positioned and mounted in positions where distances between positions of the three operations of component suction, recognition and placement become short. Therefore, the mounting process time can be remarkably reduced. In particular, in each component mounting work area, the component feeding unit is arranged along an end edge in a board conveyance direction of the component mounting work area. Therefore, when the recognition device is arranged on a central side in the conveyance direction of each component mounting work area and a board placement position in each placement-position determining conveyance unit is also arranged on the central side in the conveyance direction of each component mounting work area, distances between the positions of the three operations of the component suction, recognition and placement become shorter, and therefore, the mounting process time can be further improved. Moreover, by dividing one component mounting work area into two parts, a distance of movement of the placement head is reduced to allow a mounting process time to be improved. For example, in the mounting apparatus of the present invention, the time for mounting one component can be reduced to one-half that of the conventional case, and the mounting process time can be remarkably improved.

Moreover, since two boards are arranged oppositely as a pair in the component mounting work area in one component mounting apparatus, mounting efficiency per unit area can be improved in comparison with a case where only one board is arranged.

Moreover, by concurrently performing component mounting in the first mounting unit and component mounting in the second mounting unit, a mounting operation can be performed more efficiently, and mounting process time can be improved.

Moreover, the first placement head drive device of the first mounting unit and the second placement head drive device of the second mounting unit have their driving areas that do not overlap each other. Therefore, a mounting operation in each mounting unit can be freely set without consideration for mutual interference of both the drive devices.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A component mounting apparatus comprising:
    a first mounting unit arranged in a first component mounting work area, said first mounting unit being able to
        (i) hold a first board, onto which a component is to be mounted, in
            (a) a first pre-placement standby position,
            (b) a first placement position, and
            (c) a first post-placement standby position,
        with the first pre-placement standby position, first placement position and first post-placement standby position being located along a first conveyance path within said first component mounting work area, and
        (ii) by use of a first placement head, place onto the first board, while in the first placement position, a component fed from a first component feeding device, held by said first placement head and recognized by a first recognition device, on basis of a recognition result of the first recognition device; and
    a second mounting unit arranged in a second component mounting work area, said second mounting unit being able to
        (i) hold a second board, onto which a component is to be mounted, in
            (a) a second pre-placement standby position,
            (b) a second placement position, and
            (c) a second post-placement standby position,
        with the second pre-placement standby position, second placement position and second post-placement standby position being located along a second conveyance path, different from and parallel to the first conveyance path, within said second component mounting work area, and
        (ii) by use of a second placement head, place onto the second board, while in the second placement position, a component fed from a second component feeding device, held by said second placement head and recognized by a second recognition device, on basis of a recognition result of the second recognition device,
    wherein said first component mounting work area and said second component mounting work area are obtained by dividing a main component mounting work area, and
    wherein said first mounting unit is to be operatively controlled independently of said second mounting unit.

2. The component mounting apparatus according to claim 1, wherein said first component mounting work area and said second component mounting work area do not overlap each other.

3. The component mounting apparatus according to claim 1, further comprising:
    a bypass conveyance unit, arranged between the first conveyance path and the second conveyance path, for passing a board therethrough that is not to be subjected to a mounting operation in said first mounting unit nor to a mounting operation in said second mounting unit.

4. The component mounting apparatus according to claim 3, wherein
    said bypass conveyance unit includes an upper bypass conveyor and a lower bypass conveyor arranged below said upper bypass conveyor.

5. The component mounting apparatus according to claim 3, wherein
    said bypass conveyor is comprised of two bypass conveyors arranged parallel to each other.

6. The component mounting apparatus according to claim 1, wherein
    the component mounting apparatus is constructed and arranged such that the second board is to be loaded into said second mounting unit while turned at a phase angle of 180 degrees with respect to the first board when loaded into said first mounting unit, and such that the second board is to be unloaded from said second mounting unit while turned an additional phase angle of 180 degrees.

7. The component mounting apparatus according to claim 6, wherein
    said first component mounting work area and said second component mounting work area do not overlap each other.

8. The component mounting apparatus according to claim 1, wherein
    the component mounting apparatus is constructed and arranged such that the second board can be selectively loaded into said second mounting unit while turned at a phase angle of 180 degrees with respect to the first board when loaded into said first mounting unit, and such that the second board can be selectively loaded into said second mounting unit while in phase with respect to the first board when loaded into said first mounting unit.

9. The component mounting apparatus according to claim 8, wherein
    said first component mounting work area and said second component mounting work area do not overlap each other.

10. The component mounting apparatus according to claim 1, wherein the first placement head and the second placement head each include component holding members, and said first component feeding device and the second component feeding device each include component feeding units that are to feed components to be held by the component holding members, with a direction in which the component holding members of the first placement head are arranged, and a direction in which the component feeding units of the first component feeding device are arranged, being identical, and with a direction in which the component holding members of the second placement head are arranged, and a direction in which the component feeding units of the second component feeding device are arranged, being identical.

11. The component mounting apparatus according to claim 10, wherein said first component mounting work area and said second component mounting work area do not overlap each other.

12. The component mounting apparatus according to claim 1, wherein the first placement head and the second placement head each include component holding members, and the first component feeding device and the second component feeding device each include component feeding units that are to feed components to be held by the component holding members, with an interval between the component holding members of the first placement head, and an interval between the component feeding units of the first component feeding device, being identical, and with an interval between the component holding members of the second placement head, and an interval between the component feeding units of the second component feeding device, being identical, such that components can be collectively held, after fed by the component feeding units of the first and second component feeding devices, by the component holding members of the first and second placement heads, respectively.

13. The component mounting apparatus according to claim 12, wherein said first component mounting work area and said second component mounting work area do not overlap each other.

14. A component mounting method comprising:

performing a first mounting operation including
  (i) holding a first board in a first placement position after receiving said first board from a first pre-placement standby position, said first pre-placement standby position and said first placement position being located along a first conveyance path in a first component mounting work area,
  (ii) using a first placement head to hold a first component fed from a first component feeding device,
  (iii) using a first recognition device to recognize said first component while held by said first placement head,
  (iv) using said first placement head to place said first component onto said first board based on a recognition result corresponding to said first component being recognized by said first recognition device, and
  (v) unloading said first board from said first placement position toward a first post-placement standby position, and holding said first board after using said first placement head to place said first component onto said first board; and independently of performing said first mounting operation, performing a second mounting operation including
  (i) holding a second board in a second placement position after receiving said second board from a second pre-placement standby position, said second pre-placement standby position and said second placement position being located along a second conveyance path, different from and parallel to said first conveyance path, in a second component mounting work area,
  (ii) using a second placement head to hold a second component fed from a second component feeding device,
  (iii) using a second recognition device to recognize said second component while held by said second placement head,
  (iv) using said second placement head to place said second component onto said second board based on a recognition result corresponding to said second component being recognized by said second recognition device, and
  (v) unloading said second board from said second placement position toward a second post-placement standby position, and holding said second board after using said second placement head to place said second component onto said second board, wherein the holding of said first board in said first placement position can be performed independently of the holding of said second board in said second placement position, and the unloading of said first board from said first placement position can be performed independently of the unloading of said second board from said second placement position, and wherein said first component mounting work area and said second component mounting work area are obtained by dividing a main component mounting work area.

15. The component mounting method according to claim 14, wherein said first component mounting work area and said second component mounting work area are two equal parts that do not overlap each other.

16. The component mounting method according to claim 14, further comprising:

using a bypass conveyance unit, arranged between said first conveyance path and said second conveyance path, to pass a board therethrough that is not subjected to the first mounting operation nor the second mounting operation.

17. The component mounting method according to claim 14, wherein (i), (ii), (iii) and (iv) of said second mounting operation are performed with said second board turned at a phase angle of 180 degrees with respect to said first board during performance of (i), (ii), (iii) and (iv) of said first mounting operation, and (v) of said second mounting operation is performed with said second board turned an additional phase angle of 180 degrees.

18. The component mounting apparatus according to claim 17, wherein said first component mounting work area and said second component mounting work area do not overlap each other.

19. The component mounting method according to claim 14, wherein
- (i), (ii), (iii) and (iv) of said second mounting operation are performed with said second board turned at a phase angle of 180 degrees with respect to said first board during performance of (i), (ii), (iii) and (iv) of said first mounting operation, or
- (i), (ii), (iii) and (iv) of said second mounting operation are performed with said second board in phase with respect to said first board during performance of (i), (ii), (iii) and (iv) of said first mounting operation.

20. The component mounting method according to claim 14, wherein
- using a first placement head to hold a first component fed from a first component feeding device comprises using a first placement head having component holding members which concurrently collectively hold components fed from component feeding units of said first placement head, and
- using a second placement head to hold a second component fed from a second component feeding device comprises using a second placement head having component holding members which concurrently collectively hold components fed from component feeding units of said second placement head.

21. The component mounting apparatus according to claim 20, wherein
- said first component mounting work area and said second component mounting work area do not overlap each other.

22. A component mounting apparatus comprising:
- a first mounting unit arranged in a first component mounting work area, said first mounting unit being able to
  - (i) hold a first board, onto which a component is to be mounted, in
    - (a) a first pre-placement standby position,
    - (b) a first placement position, and
    - (c) a first post-placement standby position,
  - with the first pre-placement standby position, first placement position and first post-placement standby position being located along a first conveyance path within said first component mounting work area, and
  - (ii) by use of a first placement head, place onto the first board, while in the first placement position, a component fed from a first component feeding device, held by said first placement head and recognized by a first recognition device, on basis of a recognition result of the first recognition device;
- a second mounting unit arranged in a second component mounting work area, said second mounting unit being able to
  - (i) hold a second board, onto which a component is to be mounted, in
    - (a) a second pre-placement standby position,
    - (b) a second placement position, and
    - (c) a second post-placement standby position,
  - with the second pre-placement standby position, second placement position and second post-placement standby position being located along a second conveyance path, different from and parallel to the first conveyance path, within said second component mounting work area, and
  - (ii) by use of a second placement head, place onto the second board, while in the second placement position, a component fed from a second component feeding device, held by said second placement head and recognized by a second recognition device, on basis of a recognition result of the second recognition device; and
- a bypass conveyance unit, arranged between the first conveyance path and the second conveyance path, for passing a board therethrough that is not to be subjected to a mounting operation in said first mounting unit nor to a mounting operation in said second mounting unit,
- wherein said first component mounting work area and said second component mounting work area are obtained by dividing a main component mounting work area.

23. The component mounting apparatus according to claim 22, wherein said bypass conveyance unit includes an upper bypass conveyor and a lower bypass conveyor arranged below said upper bypass conveyor.

24. The component mounting apparatus according to claim 23, wherein
- said first component mounting work area and said second component mounting work area do not overlap each other.

25. The component mounting apparatus according to claim 22, wherein said bypass conveyance unit is comprised of two bypass conveyors arranged parallel to each other.

26. The component mounting apparatus according to claim 25, wherein said first component mounting work area and said second component mounting work area do not overlap each other.

27. The component mounting apparatus according to claim 22, wherein said first component mounting work area and said second component mounting work area do not overlap each other.

28. A component mounting method comprising:
- performing a first mounting operation including
  - (i) holding a first board in a first placement position after receiving said first board from a first pre-placement standby position, said first pre-placement standby position and said first placement position being located along a first linear conveyance path in a first component mounting work area,
  - (ii) holding a first component fed from a first component feeding device arranged in a vicinity of said first placement position,
  - (iii) using a first recognition device, arranged in a vicinity of said first placement position, to recognize said first component while being held,
  - (iv) placing said first component onto said first board based on a recognition result corresponding to said first component being recognized by said first recognition device, and
  - (v) unloading said first board from said first placement position toward a first post-placement standby position located along said first linear conveyance path, and holding said first board after placing said first component onto said first board; and
- independently of performing said first mounting operation, performing a second mounting operation including
  - (i) holding a second board in a second placement position after receiving said second board from a second pre-placement standby position, said second pre-placement standby position and said second placement position being located along a second linear conveyance path, different from and parallel to said first linear conveyance path, in a second component mounting work area,
(ii) holding a second component fed from a second component feeding device arranged in a vicinity of said second placement position,
(iii) using a second recognition device, arranged in a vicinity of said second placement position, to recognize said second component while being held,
(iv) placing said second component onto said second board based on a recognition result corresponding to said second component being recognized by said second recognition device, and
(v) unloading said second board from said second placement position toward a second post-placement standby position located along said second linear conveyance path, and holding said second board after placing said second component onto said second board,
wherein said first component mounting work area and said second component mounting work area do not overlap one another and are obtained by dividing a main component mounting work area.

29. A component mounting method comprising:

performing a first mounting operation including
(i) holding a first board in a first placement position after receiving said first board from a first pre-placement standby position, said first pre-placement standby position and said first placement position being located along a first conveyance path in a first component mounting work area,
(ii) using a first placement head to hold a first component fed from a first component feeding device,
(iii) using a first recognition device to recognize said first component while held by said first placement head,
(iv) using said first placement head to place said first component onto said first board based on a recognition result corresponding to said first component being recognized by said first recognition device, and
(v) unloading said first board from said first placement position toward a first post-placement standby position, and holding said first board after using said first placement head to place said first component onto said first board;

performing a second mounting operation including
(i) holding a second board in a second placement position after receiving said second board from a second pre-placement standby position, said second pre-placement standby position and said second placement position being located along a second conveyance path, different from and parallel to said first conveyance path, in a second component mounting work area,
(ii) using a second placement head to hold a second component fed from a second component feeding device,
(iii) using a second recognition device to recognize said second component while held by said second placement head,
(iv) using said second placement head to place said second component onto said second board based on a recognition result corresponding to said second component being recognized by said second recognition device, and
(v) unloading said second board from said second placement position toward a second post-placement standby position, and holding said second board after using said second placement head to place said second component onto said second board; and using a bypass conveyance unit, arranged between said first conveyance path and said second conveyance path, to pass a board therethrough that is not subjected to the first mounting operation nor the second mounting operation, wherein the holding of said first board in said first placement position can be performed independently of the holding of said second board in said second placement position, and the unloading of said first board from said first placement position can be performed independently of the unloading of said second board from said second placement position, and wherein said first component mounting work area and said second component mounting work area are obtained by dividing a main component mounting work area.

30. The component mounting method according to claim 29, wherein
said first component mounting work area and said second component mounting work area do not overlap each other.

* * * * *